(12) United States Patent
Rahman et al.

(10) Patent No.: US 11,767,398 B2
(45) Date of Patent: Sep. 26, 2023

(54) SPIN-ON COMPOSITIONS COMPRISING AN INORGANIC OXIDE COMPONENT AND AN ALKYNYLOXY SUBSTITUTED SPIN-ON CARBON COMPONENT USEFUL AS HARD MASKS AND FILLING MATERIALS WITH IMPROVED SHELF LIFE

(71) Applicant: Merck Patent GmbH, Darmstadt (DE)

(72) Inventors: M. Dalil Rahman, Monmouth Junction, NJ (US); Takashi Sekito, Shizuoka (JP)

(73) Assignee: Merck Patent GmbH, Darmstadt (DE)

( * ) Notice: Subject to any disclaimer, the term of this patent is extended or adjusted under 35 U.S.C. 154(b) by 165 days.

(21) Appl. No.: 17/423,528

(22) PCT Filed: Feb. 20, 2020

(86) PCT No.: PCT/EP2020/054421
§ 371 (c)(1),
(2) Date: Jul. 16, 2021

(87) PCT Pub. No.: WO2020/169702
PCT Pub. Date: Aug. 27, 2020

(65) Prior Publication Data
US 2022/0025109 A1 Jan. 27, 2022

Related U.S. Application Data

(60) Provisional application No. 62/809,072, filed on Feb. 22, 2019.

(51) Int. Cl.
*G03F 7/09* (2006.01)
*C08G 8/02* (2006.01)
*C08G 8/30* (2006.01)
*C09D 161/16* (2006.01)
*G03F 7/11* (2006.01)
(Continued)

(52) U.S. Cl.
CPC .......... *C08G 61/02* (2013.01); *B05D 1/005* (2013.01); *B05D 3/0254* (2013.01); *C08G 61/12* (2013.01); *C08K 5/5419* (2013.01); *C09D 165/00* (2013.01); *C09D 171/08* (2013.01); *B05D 2518/00* (2013.01); *C08G 2261/135* (2013.01); *C08G 2261/1414* (2013.01); *C08G 2261/1424* (2013.01); *C08G 2261/312* (2013.01); *C08G 2261/3142* (2013.01); *C08G 2261/3242* (2013.01); *C08G 2261/90* (2013.01); *G03F 1/56* (2013.01); *G03F 7/70283* (2013.01)

(58) Field of Classification Search
CPC .. G03F 7/094; G03F 7/11; C08G 8/02; C08G 8/30; C09D 161/16
See application file for complete search history.

(56) References Cited

U.S. PATENT DOCUMENTS 3,474,054 A 10/1969 White
4,200,729 A 4/1980 Calbo
(Continued)

FOREIGN PATENT DOCUMENTS

WO 2012/131479 A1 10/2012
WO 2014/086982 A2 6/2014
WO 2016/128252 A1 8/2016

OTHER PUBLICATIONS

Kudo et al., Advances in Patterning Materials and Processes XXXI, Proc. of SPIE vol. 9051, 90511X, 2014.*
(Continued)

*Primary Examiner* — Shane Fang
(74) *Attorney, Agent, or Firm* — William T. Slaven, IV

(57) ABSTRACT

The present invention relates to a composition comprising; components a) b) and d); wherein, component a) is a metal compound having the structure (I), component b) is a spin on high carbon polymer, having a polymer backbone comprising mono-cyclic aromatic hydrocarbon, fused-ring ring hydrocarbon moieties, or mixtures of these, having a wt. % of carbon from about 81 wt. % to about 94 wt. %, which is soluble to at least about 5 wt. % in a spin casting solvent, and wherein at least one, of said mono-cyclic aromatic hydrocarbon or said fused-ring ring hydrocarbon moieties, present in said spin on high carbon polymer, is functionalized with at least one alkynyloxy moiety of structure (VIII), and component d) is a spin casting solvent. The present invention further relates to using this composition in methods for manufacturing electronic devices through either the formation of a patterned films of high K material comprised of a metal oxide on a semiconductor substrate, or through the formation of patterned metal oxide comprised layer overlaying a semiconductor substrate which may be used to selectively etch the semiconductor substrate with a fluorine plasma.

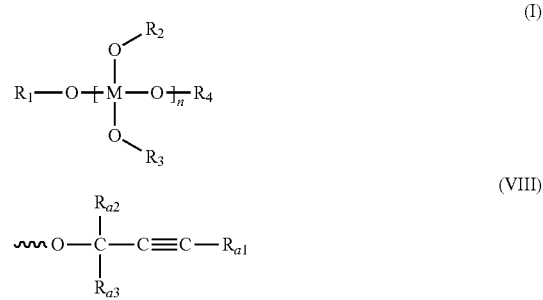

8 Claims, No Drawings

(51) Int. Cl.
*C08G 61/02* (2006.01)
*B05D 1/00* (2006.01)
*B05D 3/02* (2006.01)
*C08G 61/12* (2006.01)
*C08K 5/5419* (2006.01)
*C09D 165/00* (2006.01)
*C09D 171/08* (2006.01)
*G03F 1/56* (2012.01)
*G03F 7/00* (2006.01)

(56) References Cited

U.S. PATENT DOCUMENTS

| | | |
|---|---|---|
| 4,251,665 A | 2/1981 | Calbo |
| 5,187,019 A | 2/1993 | Calbo |
| 2017/0017156 A1 | 1/2017 | Ogihara et al. |

OTHER PUBLICATIONS

International Search Report and Written Opinion received for PCT Patent Application No. PCT/EP2020/054421 dated Jul. 23, 2020, 13 pages.

* cited by examiner

SPIN-ON COMPOSITIONS COMPRISING AN INORGANIC OXIDE COMPONENT AND AN ALKYNYLOXY SUBSTITUTED SPIN-ON CARBON COMPONENT USEFUL AS HARD MASKS AND FILLING MATERIALS WITH IMPROVED SHELF LIFE

This application is a national stage application, filed under 35 U.S.C. § 371, of International Patent Application No. PCT/EP2020/054421 (filed on 20 Feb. 2020) which claims the benefit of U.S. Provisional Patent Application No. 62/809,072 (filed on 22 Feb. 2019) each of which applications is incorporated herein by reference in their entirety.

FIELD OF INVENTION

The present invention relates to compositions comprising a soluble, multi-ligand-substituted metal compound, and an alkynyloxy substituted spin on carbon component which are useful as air stable precursors to high K metal oxides which have good shelf life. These precursors show good void filling capacity for Trench or Via microlithographic features and can yield, after processing of these filled lithographic features, a substrate containing a patterned high K metal oxide without employing chemical vapor deposition (CVD). These materials may also be used as hard mask materials.

BACKGROUND

Metal oxide films are useful in a variety of applications in the semiconductor industry such as, lithographic hard masks, underlayers for anti-reflective coatings and electro-optical devices.

As an example, photoresist compositions are used in microlithography processes for making miniaturized electronic components such as in the fabrication of computer chips and integrated circuits. Generally, a thin coating of a photoresist composition is applied to a substrate, such as a silicon wafer used for making integrated circuits. The coated substrate is then baked to remove a desired amount of solvent from the photoresist. The photoresist film on the substrate is then image-wise exposed to actinic radiation, such as, visible, ultraviolet, extreme ultraviolet, electron beam, particle beam and X-ray radiation and developed to form a pattern. The radiation causes a chemical transformation in the exposed areas of the photoresist. The exposed coating is treated with a developer solution to dissolve and remove either the radiation-exposed or the unexposed areas of the photoresist.

The trend towards the miniaturization of semiconductor devices has led to the use of new photoresists that are sensitive to shorter and shorter wavelengths of radiation and has also led to the use of sophisticated multilevel systems to overcome difficulties associated with such miniaturization.

Absorbing antireflective coatings and underlayers in photolithography are used to diminish problems that result from radiation that reflects from substrates which often are highly reflective. Reflected radiation results in thin film interference effects and reflective notching. Thin film interference, or standing waves, result in changes in critical line width dimensions caused by variations in the total light intensity in the photoresist film as the thickness of the photoresist changes. Interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete loss of desired dimensions. An antireflective coating film coated beneath a photoresist and above a reflective substrate provides significant improvement in lithographic performance of the photoresist. Typically, the bottom antireflective coating is applied on the substrate and cured, followed by application of a layer of photoresist. The photoresist is imagewise exposed and developed. The antireflective coating in the exposed area is then typically dry etched using various etching gases, and the photoresist pattern is thus transferred to the substrate.

Underlayers containing high amounts of refractory elements can be used as hard masks as well as antireflective coatings. Hard masks are useful when the overlying photoresist is not capable of providing high enough resistance to dry etching that is used to transfer the image into the underlying semiconductor substrate. In such circumstances a material called a hard mask is used whose etch resistance is high enough to transfer any patterns created over it into the underlying semiconductor substrate. This is made possible because the organic photoresist is different than the underlying hard mask and it is possible to find an etch gas mixture which will allow the transfer of the image in the photoresist into the underlying hard mask. This patterned hard mask can then be used with appropriate etch conditions and gas mixtures to transfer the image from the hard mask into the semiconductor substrate, a task which the photoresist by itself with a single etch process could not have accomplished.

Multiple antireflective layers and underlayers are being used in new lithographic techniques. In cases where the photoresist does not provide sufficient dry etch resistance, underlayers and/or antireflective coatings for the photoresist that act as a hard mask and are highly etch resistant during substrate etching are preferred. One approach has been to incorporate silicon, titanium or other metallic materials into a layer beneath the organic photoresist layer. Additionally, another high carbon content antireflective or mask layer may be placed beneath the metal containing antireflective layer, such as a trilayer of high carbon film/hard mask film/photoresist is used to improve the lithographic performance of the imaging process. Conventional hard masks can be applied by chemical vapor deposition, such as sputtering. However, the relative simplicity of spin coating versus the aforementioned conventional approaches makes the development of a new spin-on hard mask or antireflective coating with high concentration of metallic materials in the film very desirable.

Underlayer compositions for semiconductor applications containing metal oxides have been shown to provide dry etch resistance as well as antireflective properties. Conventional soluble metal compounds to form metal oxide films, such as metal alkoxides, however, have been found to be very unstable to moisture in air thus creating a variety of issues, including shelf life stability, coating problems and performance shortcomings. Metal oxides have solubility problems in solvents typically used and accepted in the semiconductor industry.

For many decades Silicon dioxide ($SiO_2$) has been used as a gate oxide material. However, to increase device performance, as transistors have decreased in size, the thickness of the silicon dioxide gate dielectric thickness has steadily decreased in order to increase the gate capacitance and thereby drive current. Equation 1 illustrates this relationship between capacitance gate oxide where a MOSFET (metal-oxide-semiconductor field-effect transistor) is modeled as a simple parallel plate capacitor, ignoring quantum mechanical and depletion effects from the Si substrate and gate. In Equation 1, A is the capacitor area; κ is the relative dielectric constant of the material (3.9 for silicon dioxide); co is the permittivity of free space and t is the thickness of the capacitor oxide insulator.

$$C = \frac{\kappa \varepsilon_0 A}{t} \quad \text{Equation 1}$$

However, as the thickness scales much below 2 nm, leakage currents, due to quantum tunneling increases drastically. This leads to high power consumption and reduced device reliability. To increase gate capacitance without this leakage current, the silicon dioxide gate dielectric, needs to be replaced with a high-κ (high K) material (a.k.a. larger κ in Equation 1). Certain metal oxides are useful as high K metal oxides having K values of 10 or higher. However, these high K metal oxides are always deposited using CVD (chemical vapor deposition). CVD is a process that is expensive, and which needs special equipment and does not have good planarization on the pattern substrate with deep Via or Trenches. Thus, there is an outstanding need to prepare spin-on high K material that can be spun from spin casting solvent solution which are stable after exposure to air. There is also a need for such air-stable- and thermally stable high K metal oxide formulations which can additionally act as good Via and Trench filling materials showing very low void formation. Finally, there is also a need to have such formulations comprising a spin casting solvent to have good shelf life, with no particle formation over time. These needs are meet with the present inventive composition, which can fill a patterned substrate with a high K metal oxide precursor and which are both air stable and stable against the formation of particle in the spin casting solvent solution.

Upon processing, these filled lithographic features, yield a substrate which has a patterned high K metal oxide, originating from the inventive composition. Apart from their use as high K materials, these novel compositions are useful as hard masks, and, in this capacity, they may also be used to create a patterned hard mask on a semiconductor substrate (e.g. Silicon, Germanium and the like), allowing patterning of the substrate through a plasma etching process. These hard mask patterns may be created by patterning a coating of the novel composition on an unpatterned substrate through a conventional photoresist patterning approach. Alternatively, this pattern may result from filling of topography already existing in either a semiconductor substrate or in an overlying patterned resist or patterned spin on carbon layer. In either hard mask application, after pattern transfer into the substrate is complete, any remaining hard mask pattern is the strippable in chemical solutions.

SUMMARY OF THE INVENTION

The present invention relates to a composition comprising; components a) b) and d) and optional component c), wherein, component a) is a metal compound having the structure (I).

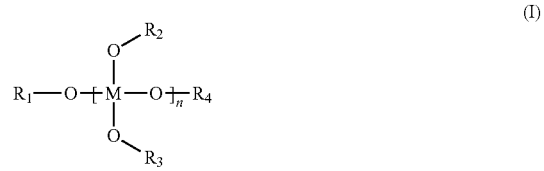

In Structure (I), M is a metal having a valence of four (4); n is an integer from 1 to 20 and each $R_1$, $R_2$, $R_3$, and $R_4$ is a moiety independently selected from the group consisting of 1), 2) and 3).

In Structure (I), moiety 1), is a first organic moiety having the structure (II). Wherein, in structure (II), $R_5$ is selected from the group consisting of $C_2$ to $C_{10}$ alkylenes, $C_3$ to $C_{12}$ branched alkylenes, $C_5$ to $C_{12}$ cycloalkylenes, $C_2$ to $C_{10}$ alkylenes containing a C=C double bond, $C_3$ to $C_{12}$ branched alkylenes containing a C=C double bond, and $C_5$ to $C_{12}$ cycloalkylenes containing a C=C double bond; and $R_6$ is hydrogen or an alkyloxycarbonyl having the structure (III). Wherein, in structure (III), $R_7$ is a $C_1$ to $C_8$ alkyl.

In Structure (I), moiety 2), is a silicon bearing organic moiety having at least 2 carbons and having the structure (IV). Wherein, in structure (IV), $R_8$ and $R_9$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls; $R_{10}$ is selected from the group consisting of $C_1$ to $C_8$ alkyls, $C_6$ to $C_{16}$ aryls, and hydroxyl and siloxanes having the structure (V). Wherein, in structure (V), $R_{11}$ is selected from the group consisting of hydrogen, $C_1$ to $C_8$ alkyls, $C_1$ to $C_8$ alkyls substituted with a hydroxyl, $C_6$ to $C_{16}$ aryls, an a silyl moieties having structure (IVa) and $R_{12}$ and $R_{13}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls; and p represents the number of repeat units in the siloxane moiety (V). Wherein, in structure (IVa), $R_{8a}$ and $R_{9a}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls and $R_{10a}$ is selected from the group consisting of $C_1$ to $C_8$ alkyls, and $C_6$ to $C_{16}$ aryls.

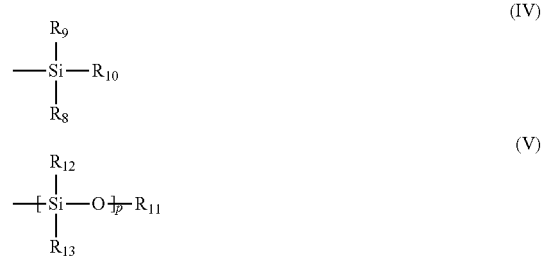

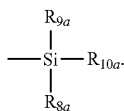

(IVa)

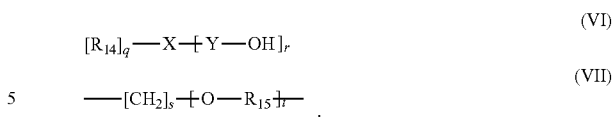

(VI)

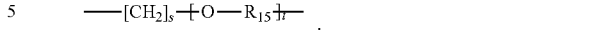

(VII)

In Structure (I), moiety 3) is a second organic moiety selected from the group consisting of $C_2$ to $C_8$ alkyls, $C_2$ to $C_8$ alkyl carboxyls, $C_6$ to $C_{20}$ aryl carboxyls, fluorenyl carboxyls, fluorinated $C_2$ to $C_8$ alkyl carboxyls, $C_2$ to $C_8$ alkyl sulfonyls, fluorinated $C_2$ to $C_8$ alkyl sufonyls, and mixtures thereof.

In Structure (I), the moieties selected may be a mixture of the aforementioned moieties in this structure.

In the aforementioned inventive compositions, Component b) is a spin on high carbon polymer, having a polymer backbone comprising mono-cyclic aromatic hydrocarbon moieties, fused-ring ring hydrocarbon moieties, or mixtures of these, having a wt. % of carbon from about 81 wt. % to about 94 wt. %, which is soluble to at least about 5 wt. % in a spin casting solvent, and wherein at least one, of said mono-cyclic aromatic hydrocarbon or said fused-ring ring hydrocarbon moieties, present in said spin on high carbon polymer, is functionalized with at least one alkynyloxy moiety of structure (VIII),

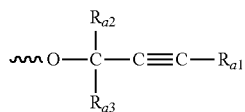

(VIII)

In Structure (VIII) ∿∿ represents the attachment point of said alkynyloxy moiety to said mono-cyclic aromatic hydrocarbon or to said fused-ring ring hydrocarbon moieties and $R_{a1}$ is hydrogen, halogen, cyano, unsubstituted $C_1$ to $C_6$ alkyl, $C_1$ to $C_6$ alkyl substituted with at least one substituent selected from the group consisting of $C_1$ to $C_6$ alkyl, halogen and cyano, unsubstituted $C_3$ to $C_{20}$ aromatic ring, or $C_3$ to $C_{20}$ aromatic ring substituted with at least one substituent selected from the group consisting of $C_1$ to $C_6$ alkyl, halogen and cyano, $R_{a2}$ and $R_{a3}$ are each independently hydrogen, halogen, cyano, unsubstituted $C_1$ to $C_6$ alkyl, $C_1$ to $C_6$ alkyl substituted with at least one substituent selected from the group consisting of $C_1$ to $C_6$ alkyl, halogen and cyano, unsubstituted $C_3$ to $C_{20}$ aromatic ring, or $C_3$ to $C_{20}$ aromatic ring substituted with at least one substituent selected from the group consisting of $C_1$ to $C_6$ alkyl, halogen and cyano.

Optional Component c), in the aforementioned inventive compositions, is a polyol additive having the structure (VI) wherein, X is C or N; r is at least 2; q is from 0 to 2; provided that the sum of q and r is 4 when X is C, and the sum of q and r is 3 when X is N; $R_{14}$ is selected from the group consisting of hydrogen, $C_1$ to $C_8$ alkyls and $C_2$ to $C_8$ hydroxyalkyls. When X is N, Y is a $C_1$ to $C_8$ alkylene. When X is C, Y is selected from the group consisting of a direct valence bond, $C_1$ to $C_8$ alkylenes and moieties having the structure (VII). Wherein, in Structure (VII), $R_{15}$ is a $C_2$ to $C_8$ alkylene; s is 0 to 2; and t is 1 to 2

Component d), in the aforementioned inventive compositions, is a solvent.

The present invention also pertains to the process using the aforementioned inventive compositions, as precursors to high K metal oxides. The present invention further pertains to using the inventive composition to fill lithographic features on a substrate which, after processing, yield a substrate comprising a patterned high K metal oxide.

Specifically, it relates to using these novel air stable compositions to coat a patterned substrate which is a patterned photoresist, patterned spin on carbon, or patterned semiconductor comprising, Vias, Trenches, Holes or other hollow topographical features patterns filling these voids with low void formation and using these filled patterns in a process to form a patterned metal oxide on the substrate.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literatures and similar materials defines a term in a manner that contradicts the definition of that term in this application, this application controls.

As used herein, the conjunction "and" is intended to be inclusive and the conjunction "or" is not intended to be exclusive unless otherwise indicated. For example, the phrase "or, alternatively" is intended to be exclusive.

As used herein, the term "and/or" refers to any combination of the foregoing elements including using a single element.

As used herein the term "M is a metal having a valence of four (4)," M and the term "metal," is inclusive of metalloids having a valence of four (4) such as Silicon, Germanium and the like unless otherwise indicated.

As used herein the term "alkyl" refers to straight, or cyclic chain alkyl substituents as well as any of their branched isomers. More specifically, herein, unless otherwise indicated, alkyl refers to hydrocarbon groups which can be linear, branched (e.g. methyl, ethyl, propyl, isopropyl, tertbutyl and the like) or cyclic (e.g. cyclohexyl, cyclopropyl, cyclopentyl and the like) multicyclic (e.g. norbornyl, adamantly and the like). These alkyl moieties may be substituted or unsubstituted as described below. The term alkyl refers to such moieties with $C_1$ to $C_{20}$ carbons. It is understood that for structural reasons linear alkyls start with $C_1$, while branched alkyls and linear start with $C_3$ and multicyclic alkyls start with $C_5$. Moreover, it is further understood that moieties derived from alkyls described below such as substituted alkyls, have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbon for a given type of alkyl group still apply.

Alkyloxy (a.k.a. Alkoxy) refers to an alkyl group as defined above on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Herein when referring to an alkyl, alkyloxy, moieties with a possible range carbon atoms which starts with $C_1$ such as for instance "$C_1$ to $C_{20}$ alkyl," or "$C$—$C_1$ to $C_{20}$ fluoroalkyl," as a non-limiting examples, this range encompasses linear alkyls, alkyloxy, fluoroalkyl and fluoroalkyloxy starting with $C_1$ but only designated branched alkyls, branched alkyloxy, cycloalkyl, cycloalkyloxy, branched fluoroalkyl, and cyclic fluoroalkyl starting with $C_3$.

Herein, the term "alkylene," refers to hydrocarbon groups which can be a linear, branched or cyclic which has two or more attachment points (e.g. of two attachment points: methylene, ethylene, 1,2-isopropylene, a 1,4 to Cyclohexylene and the like; of three attachment points 1,1,1-substituted methane, 1,1,2-substituted ethane, 1,2,4-substituted cyclohexane and the like). Here again, when designating a possible range of carbons, such as $C_1$ to $C_{20}$, as a non-limiting example, this range encompasses linear alkylenes starting with $C_1$ but only designates branched alkylenes, or cycloalkylene starting with $C_3$. These alkylene moieties may be substituted or unsubstituted as described below. More specifically, as used herein the term "linear alkylene" refers to straight chain di-functionalized alkylene substituents having the general formula —$CH_2$—$(CH_2)_n$— to —$CH_2$—, as used herein the term "branched alkylene" refers an alkylene substituent which either has alkyl substituents present.

As used herein the term "aryl" refers to any functional group or substituent derived from an aromatic ring, such as phenyl, naphthyl, thienyl, indolyl etc. More specifically, herein the term Aryl or aromatic groups refers to such groups which contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove.

As used herein the term the term halide refers to a halo substituent selected from the group consisting of F, Cl, Br, and I.

Unless otherwise indicated in the text, the term "substituted" when referring to an aryl, alkyl, alkyloxy, refers to one of these moieties which also contain with one or more substituents, selected from the group consisting of unsubstituted alkyl, substituted alkyl, unsubstituted aryl, alkyloxyaryl (alkyl-O-aryl-), dialkyloxyaryl ((alkyl-O—)$_2$-aryl), haloaryl, alkyloxy, alkylaryl, haloalkyl, halide, hydroxyl, cyano, nitro, acetyl, alkylcarbonyl, The term "substituted," when designating a moiety, unless otherwise denoted, is when the substituent is selected from any of the above described substituents. Similarly, the term "unsubstituted" refers to these same moieties, wherein, no substituents apart from hydrogen is present.

As used herein the term "diketone" refers to any solvent having two ketone groups non-limiting examples are diacetyl, acetylacetone, and hexane-2,5-dione.

As used herein the terms "composition" and "formulation" are used interchangeable and mean the same thing.

As used herein the terms. "spin on carbon layer," and "organic high carbon coating," are interchangeable and mean the same thing.

Herein, unless otherwise indicated, the term"patterned substrate," refers to the following: 1) A patterned semiconductor substrate; 2) a patterned photoresist overcoating a semiconductor, or a semiconductor coated with an underlayer such as antireflective coating; 3) a patterned organic high carbon coating on a semiconductor substrate, wherein the original high carbon material coating, may derived from a coated high carbon polymer film; a coated, spin on carbon material; or a film of high carbon content deposited on the semiconductor substrate by other means such as by a vapor deposition process and the like.

Herein, as used herein the term high k material, high k metal oxide, and high k comprised of a metal oxide, are interchangeable.

The present invention relates to a composition comprising; components a) b) and d), and optional component c).

Component a) is a metal compound having the structure (I).

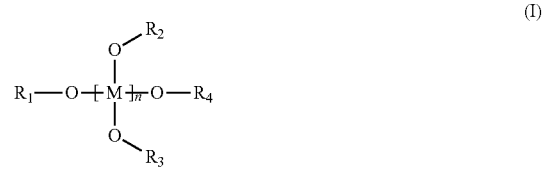

In Structure (I), M is a metal having a valence of four (4); n is an integer from 1 to 20 and each $R_1$, $R_2$, $R_3$, and $R_4$ is a moiety independently selected from the group consisting of 1), 2) and 3.

In Structure (I), moiety 1), is a first organic moiety having the structure (II). Wherein, in structure (II), $R_5$ is selected from the group consisting of $C_2$ to $C_{10}$ alkylenes, $C_3$ to $C_{12}$ branched alkylenes, $C_5$ to $C_{12}$ cycloalkylenes, $C_2$ to $C_{10}$ alkylenes containing a C=C double bond, $C_3$ to $C_{12}$ branched alkylenes containing a C=C double bond, and $C_5$ to $C_{12}$ cycloalkylenes containing a C=C double bond; and $R_6$ is hydrogen or an alkyloxycarbonyl having the structure (III), wherein, in structure (III), $R_7$ is a $C_1$ to $C_8$ alkyl.

In Structure (I), moiety 2), is a silicon bearing organic moiety having at least 2 carbons and having the structure (IV). Wherein, in structure (IV), $R_8$ and $R_9$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls; $R_{10}$ is selected from the group consisting of $C_1$ to $C_8$ alkyls, $C_6$ to $C_{16}$ aryls, and hydroxyl and siloxanes having the structure (V). Wherein, in structure (V), $R_{11}$ is selected from the group consisting of hydrogen, $C_1$ to $C_8$ alkyls, $C_1$ to $C_8$ alkyls substituted with a hydroxyl, $C_6$ to $C_{16}$ aryls, an a silyl moieties having structure (IVa) and $R_{12}$ and $R_{13}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls; and p represents the number of repeat units in the siloxane moiety (V). In structure (IVa), $R_{8a}$ and $R_{9a}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls and $R_{10a}$ is selected from the group consisting of $C_1$ to $C_8$ alkyls, and $C_6$ to $C_{16}$ aryls.

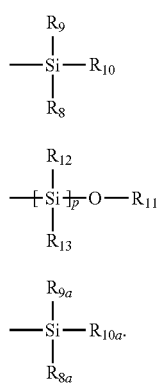

In Structure (I), moiety 3) is a second organic moiety selected from the group consisting of $C_2$ to $C_8$ alkyls, $C_2$ to $C_8$ alkyl carboxyls, $C_6$ to $C_{20}$ aryl carboxyls, fluorenyl carboxyls, fluorinated $C_2$ to $C_8$ alkyl carboxyls, $C_2$ to $C_8$ alkyl sulfonyls, fluorinated $C_2$ to $C_8$ alkyl sufonyls, and mixtures thereof.

In Structure (I), the moieties selected may be a mixture of the aforementioned moieties in this structure.

Component b) is a spin on high carbon polymer, having a polymer backbone comprising mono-cyclic aromatic hydrocarbon moieties, fused-ring ring hydrocarbon moieties, or mixtures of these having a wt. % of carbon from about 81 wt. % to about 94 wt. %, which is soluble to at least about 5 wt. % in a spin casting solvent, and wherein at least one, of said mono-cyclic aromatic hydrocarbon moieties or said fused-ring ring hydrocarbon moieties, present in said spin on high carbon polymer, is functionalized with at least one alkynyloxy moiety of structure (VIII),

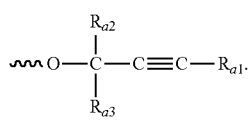

In Structure (VIII) ～ represents the attachment point of said alkynyloxy moiety to said mono-cyclic aromatic hydrocarbon or to said fused-ring ring hydrocarbon moieties and $R_{a1}$ is hydrogen, halogen, cyano, unsubstituted $C_1$ to $C_6$ alkyl, $C_1$ to $C_6$ alkyl substituted with at least one substituent selected from the group consisting of $C_1$ to $C_6$ alkyl, halogen and cyano, unsubstituted $C_3$ to $C_{20}$ aromatic ring, or $C_3$ to $C_{20}$ aromatic ring substituted with at least one substituent selected from the group consisting of $C_1$ to $C_6$ alkyl, halogen and cyano, $R_{a2}$ and $R_{a3}$ are each independently hydrogen, halogen, cyano, unsubstituted $C_1$ to $C_6$ alkyl, $C_1$ to $C_6$ alkyl substituted with at least one substituent selected from the group consisting of $C_1$ to $C_6$ alkyl, halogen and cyano, unsubstituted $C_3$ to $C_{20}$ aromatic ring, or $C_3$ to $C_{20}$ aromatic ring substituted with at least one substituent selected from the group consisting of $C_1$ to $C_6$ alkyl, halogen and cyano.

Optional Component c), in the aforementioned inventive compositions, is a polyol additive having the structure (VI) wherein, X is C or N; r is at least 2; q is from 0 to 2; provided that the sum of q and r is 4 when X is C, and the sum of q and r is 3 when X is N; $R_{14}$ is selected from the group consisting of hydrogen, $C_1$ to $C_8$ alkyls and $C_2$ to $C_8$ hydroxyalkyls. When X is N, Y is a $C_1$ to $C_8$ alkylene. When X is C, Y is selected from the group consisting of a direct valence bond, $C_1$ to $C_8$ alkylenes and moieties having the structure (VII). In Structure (VII), $R_{15}$ is a $C_2$ to $C_8$ alkylene; s is 0 to 2; and t is 1 to 2.

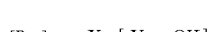

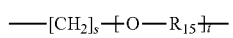

Component d), in the aforementioned inventive compositions, is spin casting solvent.

Compositions

Component a), the Metal Compound

In one embodiment of the aforementioned inventive compositions, in structure (I), M is selected from the group consisting of Zr, Ta, Hf, Ti, Sn, Si, Pb, Nb, Mo, Ge and W. In another embodiment of this aspect of the inventive compositions, M is selected from the group consisting of Zr, Hf, Ti, Ta, Nb and Sn. In yet another embodiment M is selected from Zr, Hf and Ti. In still another embodiment M is Zr. In still another embodiment M is Hf. In yet another embodiment, M is Ti.

In another embodiment, component a), is a mixture of two or more different metal compounds having structure (I).

In another embodiment, component a), is a mixture of two or more different metal compounds having structure (I), having different M's.

In another embodiment, component a), is a mixture of two or more different metal compounds having structure (I), wherein, M is selected from the group consisting of Si, Zr, Ta, Hf, Ti, Sn, Si, Pb, Nb, Mo, Ge and W, and further wherein, at least one metal compound in the mixture does not have M equal to Si.

In another embodiment, component a), is a mixture of two different metal compounds having structure (I), wherein, the first metal compound's M is Si and the second metal compound has M selected from the group consisting of Zr, Ta, Hf, Ti, Sn, Si, Pb, Nb, Mo, Ge and W, preferably from the group consisting of Zr, Ta, Hf, Ti, Sn, Pb, Nb, Mo, Ge and W. In another aspect of this embodiment, the second metal compound has M equal to Zr. In another aspect of this embodiment, the second metal compound has M equal to Hf. In still another aspect of this embodiment, the second metal compound has M equal to Ti.

In another embodiment of the aforementioned inventive compositions, in Structure (I), at least one of the moieties for $R_1$, $R_2$, $R_3$ and $R_4$ is selected from the group consisting of: said first organic moiety having the structure (II), and said silicon bearing organic moiety having at least 2 carbons and having the structure (IV).

In another embodiment of the aforementioned inventive compositions, in Structure (I) at least one of the moieties for $R_1$, $R_2$, $R_3$ and $R_4$ is selected from the group consisting of:

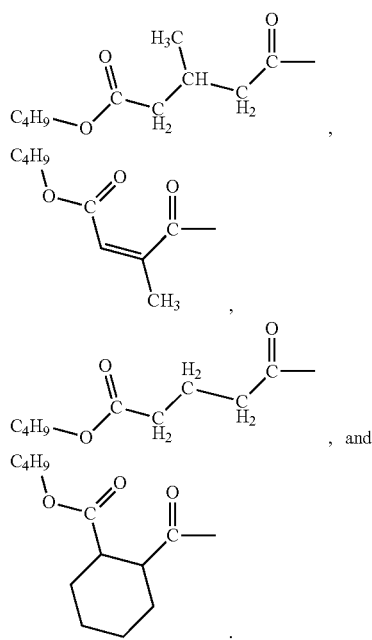

, and

.

In another embodiment of the aforementioned inventive compositions, in Structure (I), each $R_1$, $R_2$, $R_3$ and $R_4$ is independently selected from the group consisting of a first organic moiety having the structure (II) and a silicon bearing organic moiety having at least 2 carbons and having the structure (IV).

In another embodiment of the aforementioned inventive compositions, in Structure (I), the silicon bearing organic moiety having at least 2 carbons and having the structure (IV) is present in a range from 30 mole % to 60 mole % of the total moles of $R_1$, $R_2$, $R_3$ and $R_4$ of the metal compound having the structure (I).

In another embodiment of the aforementioned inventive compositions, in Structure (I) n is 2 to 20.

In another embodiment of the aforementioned inventive compositions, in Structure (I) n is 1.

In another embodiment of the aforementioned inventive compositions, the first organic moiety having the structure (II), is one wherein, $R_5$ is a $C_2$ to $C_{10}$ alkylene, a $C_2$ to $C_{10}$ alkylene containing a C=C double bond, or a $C_5$ to $C_{12}$ cycloalkylene. In another aspect of this embodiment, $R_5$ is a $C_2$ to $C_{10}$ alkylene. In another aspect of this embodiment, $R_5$ is a $C_2$ to $C_{10}$ alkylene containing a C=C double bond. In yet another aspect, $R_5$ is a $C_5$ to $C_{12}$ cycloalkylene.

In another embodiment of the aforementioned inventive compositions, the first organic moiety having the structure (II), is one wherein, $R_6$ is a $C_1$ to $C_8$ alkyloxycarbonyl. In another aspect of this embodiment, $R_6$ is a $C_2$ to $C_6$ alkyloxycarbonyl. In yet another embodiment $R_6$ is a $C_3$ to $C_4$ alkyloxycarbonyl.

In another embodiment of the aforementioned inventive compositions, the first organic moiety having the structure (II), $R_6$ has structure (III) wherein, $R_7$ is a $C_1$ to $C_8$ alkyl. In another aspect of this embodiment, $R_7$ is a $C_2$ to $C_6$ alkyl. In yet another embodiment, $R_7$ is $C_3$ to $C_4$ alkyl.

In another embodiment of the aforementioned inventive compositions, structure (IV) is one wherein, $R_8$ is methyl, ethyl, propyl, butyl or t-butyl.

In another embodiment of the aforementioned inventive compositions, structure (IV) is one wherein, $R_9$ is methyl, ethyl, propyl, butyl or t-butyl.

In another embodiment of the aforementioned inventive compositions, structure (IV) is one wherein, $R_8$ is selected from the group consisting of $C_1$ to $C_8$ alkyloxys, $C_3$ to $C_{12}$ branched alkyloxys, and $C_6$ to $C_{16}$ aryls.

In another embodiment of the aforementioned inventive compositions, structure (IV) is one wherein, $R_9$ is selected from the group consisting of $C_1$ to $C_8$ alkyloxys, $C_3$ to $C_{12}$ branched alkyloxys, and $C_6$ to $C_{16}$ aryls.

In another embodiment of the aforementioned inventive compositions, in structure (IV) $R_{10}$ is a $C_1$ to $C_8$ alkyl, a $C_6$ to $C_{16}$ aryl, or a hydroxyl.

In another embodiment of the aforementioned inventive compositions, in structure (IV) $R_{10}$ is a $C_1$ to $C_8$ alkyl, or a $C_6$ to $C_{16}$ aryl.

In another embodiment of the aforementioned inventive compositions, in structure (IV) $R_{10}$ is a $C_1$ to $C_8$ alkyl.

In another embodiment of the aforementioned inventive compositions, in structure (IV) $R_{10}$ is a siloxane having the structure (V).

In another embodiment of the aforementioned inventive compositions, structure (IV) is one wherein, $R_8$ and $R_9$ are independently selected from the group consisting of $C_1$ to $C_8$ alkyloxys, $C_3$ to $C_{12}$ branched alkyloxys, and $C_6$ to $C_{16}$ aryls; $R_{10}$ is a siloxane having the structure (V), wherein, $R_{11}$ is a silyl moiety having structure (IVa) wherein, $R_{8a}$ and $R_{9a}$ are each independently selected from a $C_1$ to $C_8$ alkyloxys, $C_3$ to $C_{12}$ branched alkyloxys, and $R_{10a}$ is a $C_6$ to $C_{16}$ aryl. Preferably in this embodiment $R_{12}$ and $R_{13}$ are each independently selected from the group consisting of $C_1$ to $C_8$ alkyls.

In another embodiment of the aforementioned inventive compositions, this embodiment is one wherein, in structure (IV), $R_8$ and $R_9$ are independently selected from the group consisting of $C_1$ to $C_8$ alkyloxys, $C_3$ to $C_{12}$ branched alkyloxys, and $C_6$ to $C_{16}$ aryls; and wherein, $R_{10}$ is selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls.

In another embodiment of the aforementioned inventive compositions, in structure (IV), $R_{10}$ is methyl, ethyl, propyl, butyl or t-butyl.

In another embodiment of the aforementioned inventive compositions, in structure (IV), $R_{10}$ is a siloxane having the structure (V).

In another embodiment of the aforementioned inventive compositions, in structure (V), $R_{11}$ is a $C_1$ to $C_8$ alkyl or hydrogen. In another aspect of this embodiment, $R_{11}$ is a $C_1$ to $C_4$ alkyl or hydrogen. In yet another embodiment, $R_{11}$ is a $C_1$ to $C_8$ alkyl. In still another embodiment, $R_{11}$ is a $C_1$ to $C_4$ alkyl. In yet another embodiment, $R_{11}$ is hydrogen.

In another embodiment of the aforementioned inventive compositions, in structure (V) $R_{12}$ is a $C_1$ to $C_8$ alkyl. In another aspect of this embodiment, $R_{12}$ is a $C_1$ to $C_6$ alkyl. In yet another embodiment $R_{12}$ is a $C_1$ to $C_4$ alkyl.

In another embodiment of the aforementioned inventive compositions, in structure (V), $R_{13}$ is a $C_1$ to $C_8$ alkyl. In another aspect of this embodiment, $R_{13}$ is a $C_1$ to $C_6$ alkyl. In yet another embodiment, $R_{13}$ is a $C_1$ to $C_4$ alkyl.

In another embodiment of the aforementioned inventive compositions, in structure (V), p is 1-500. In another aspect of this embodiment p is 1-200. In yet another embodiment, p is 1-50.

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ia1), structure (Ia2), structure (Ia3), or structure (Ia4), wherein, $R_{6a}$, $R_{6b}$ and $R_{6c}$ are independently selected from a $C_1$ to $C_4$ alkyls, and further wherein, n independently is an integer from 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures. In another preferred embodiment of this aspect of the invention n is 6-10.

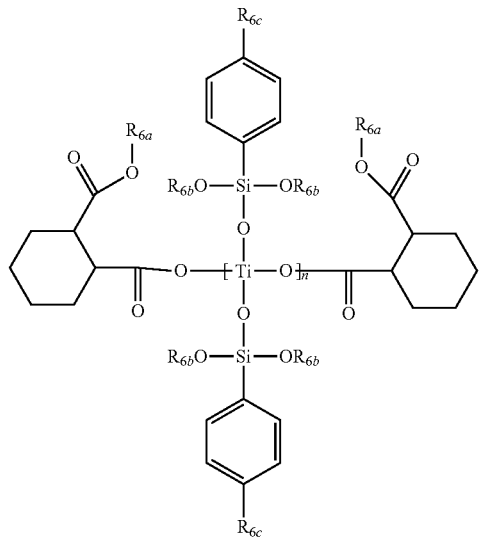

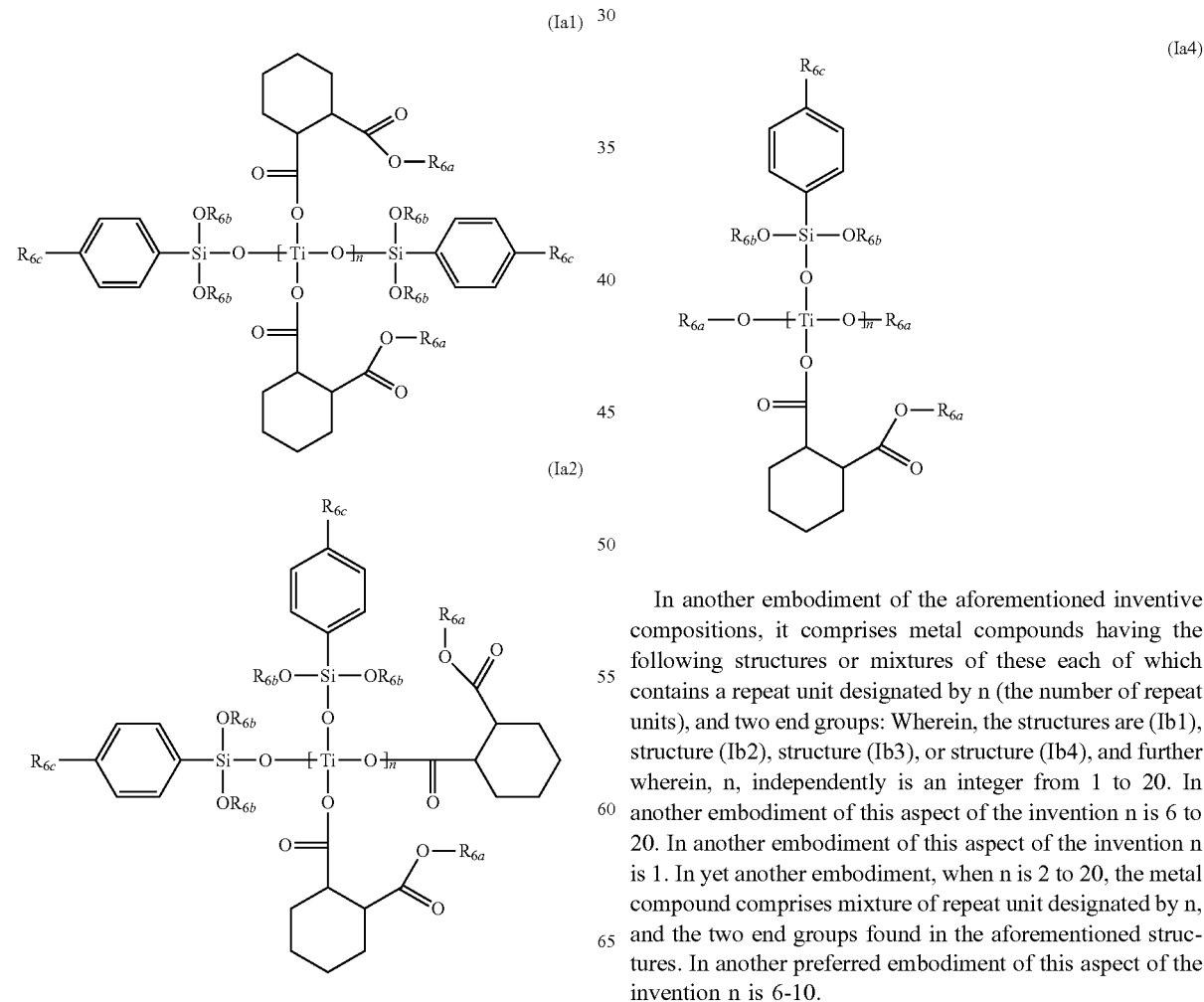

In another embodiment of the aforementioned inventive compositions, it comprises metal compounds having the following structures or mixtures of these each of which contains a repeat unit designated by n (the number of repeat units), and two end groups: Wherein, the structures are (Ib1), structure (Ib2), structure (Ib3), or structure (Ib4), and further wherein, n, independently is an integer from 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures. In another preferred embodiment of this aspect of the invention n is 6-10.

(Ib1)

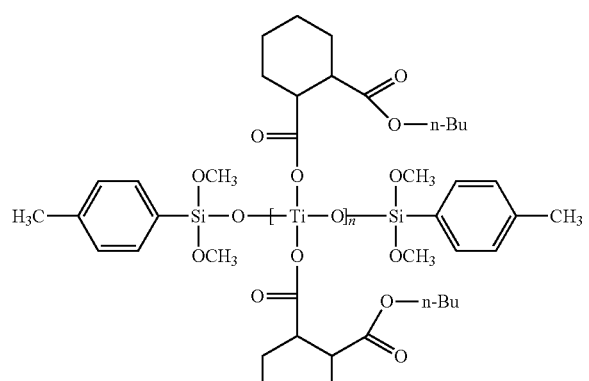

(Ib2)

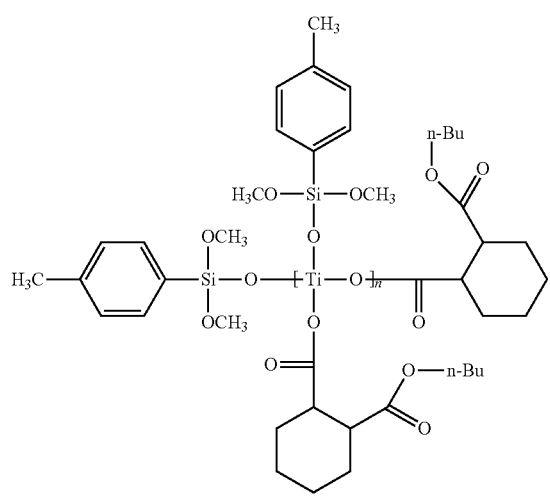

(Ib3)

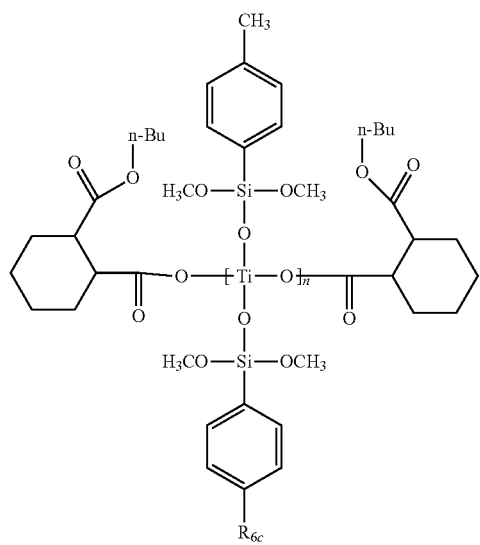

(Ib4)

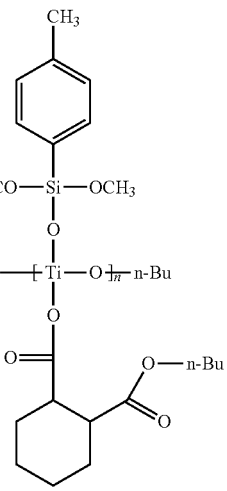

In another embodiment of the aforementioned inventive compositions, it comprises metal compounds having the following structures or mixtures of compounds having these structures each of which contains a repeat unit designated by n, (the number of repeat units), and two end groups: Wherein, the structures are structure (Ic1), structure (Ic2), structure (Ic3), structure (Ic4), structure (Ic5), or structure (Ic6), wherein, $R_{11b}$ is selected from the group consisting of hydrogen, $C_1$ to $C_8$ alkyls, $C_1$ to $C_8$ alkyls substituted with a hydroxyl, a $C_6$ to $C_{16}$ aryl, and a silyl moiety having structure (IVb), and $R_{6a}$, $R_{6b}$ and $R_{6c}$ are independently selected from a $C_1$ to $C_4$ alkyls, wherein, n, independently, is an integer from 1 to 20 and p is independently an integer from 1 to 500. In another embodiment of this aspect of this invention n is from 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures.

(Ic1)

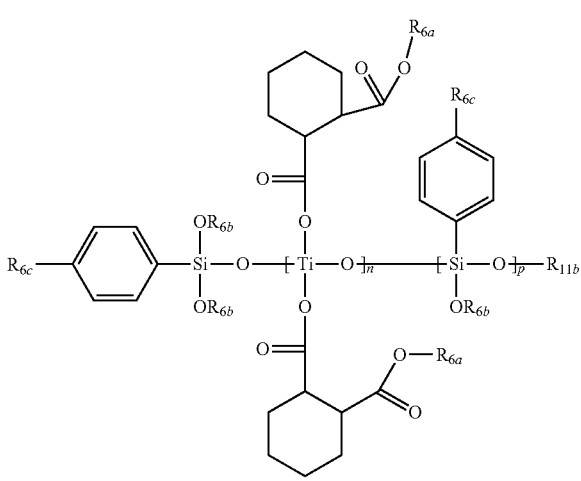

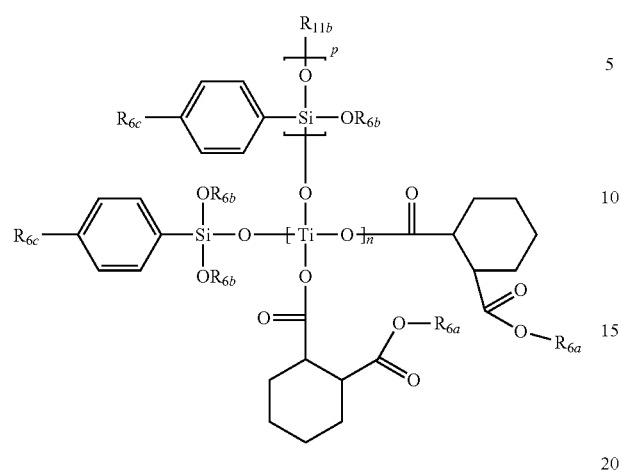

(Ic2)

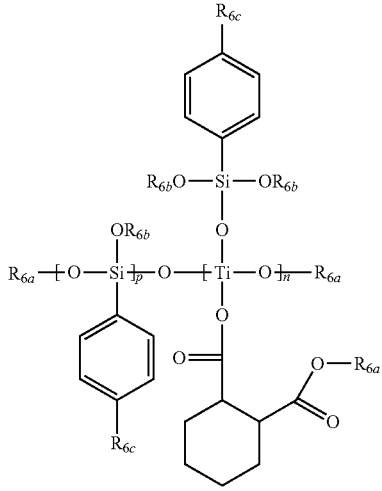

(Ic5)

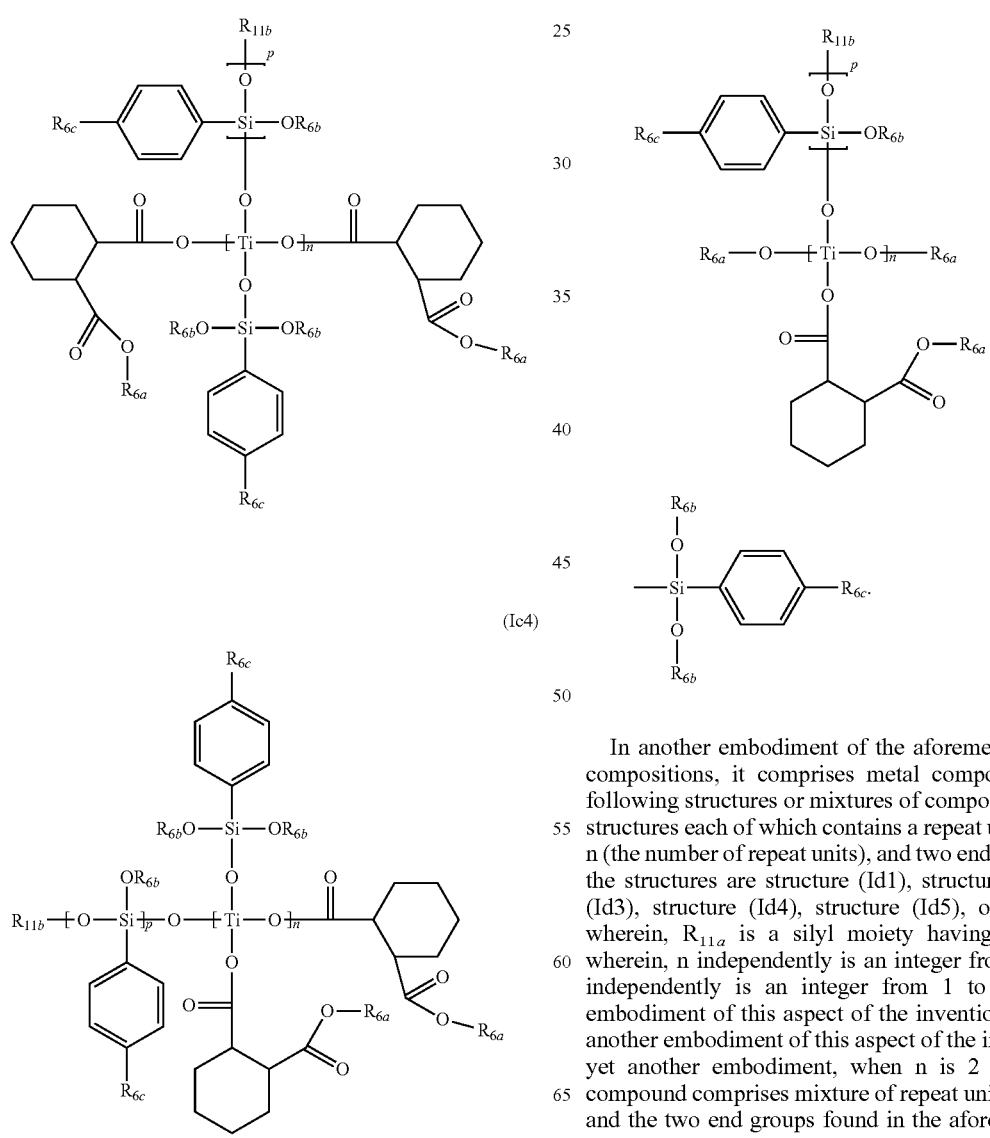

(Ic3)

(Ic6)

(IVb)

(Ic4)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Id1), structure (Id2), structure (Id3), structure (Id4), structure (Id5), or structure (Id6), wherein, $R_{11a}$ is a silyl moiety having structure (IVc), wherein, n independently is an integer from 1 to 20, and p independently is an integer from 1 to 500. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures.

(Id1)
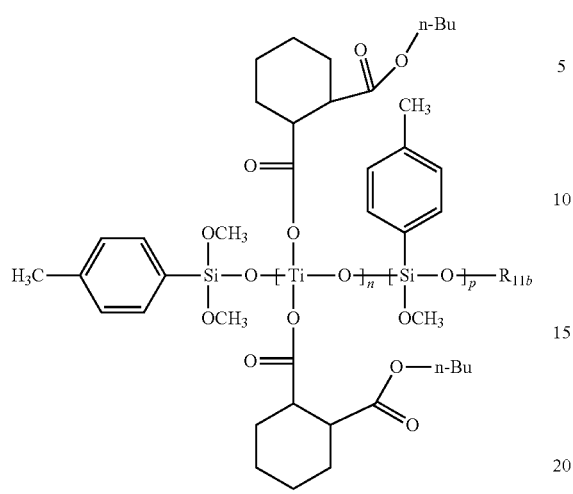
(Id2)
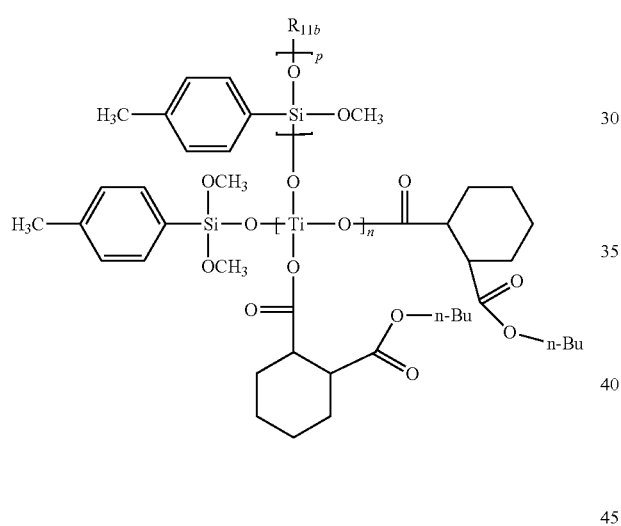
(Id3)
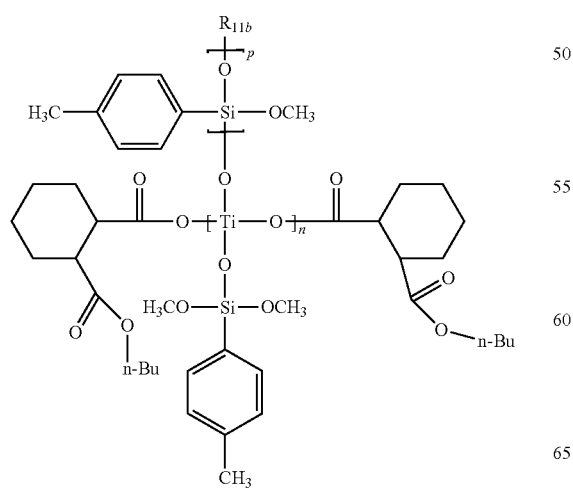
(Id4)
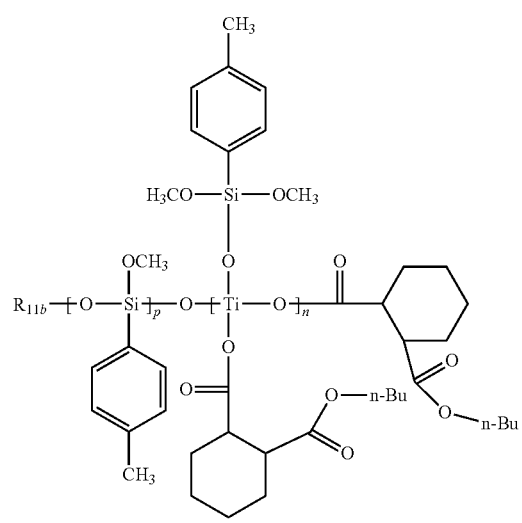
(Id5)
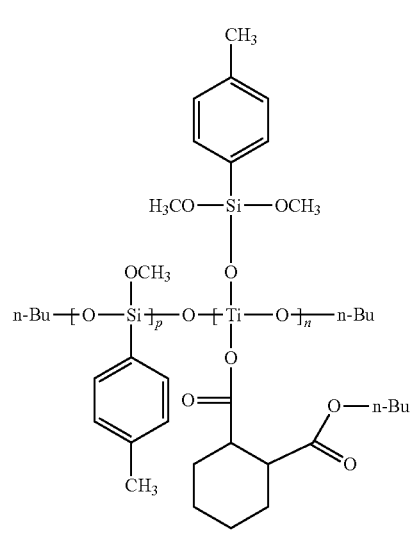
(Id6)
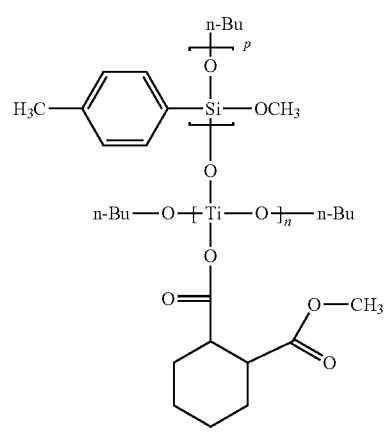

-continued

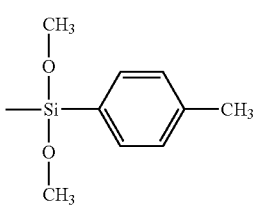

(IVc)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ie1), structure (Ie2), structure (Ie3), or structure (Ie4), wherein, $R_{6a}$ is selected from a $C_1$ to $C_4$ alkyls, and $R_{8a}$ and $R_{9a}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls, and $R_{10a}$ is selected from the group consisting of $C_1$ to $C_8$ alkyls, and $C_6$ to $C_{16}$ aryls, wherein, n, independently is an integer from 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures.

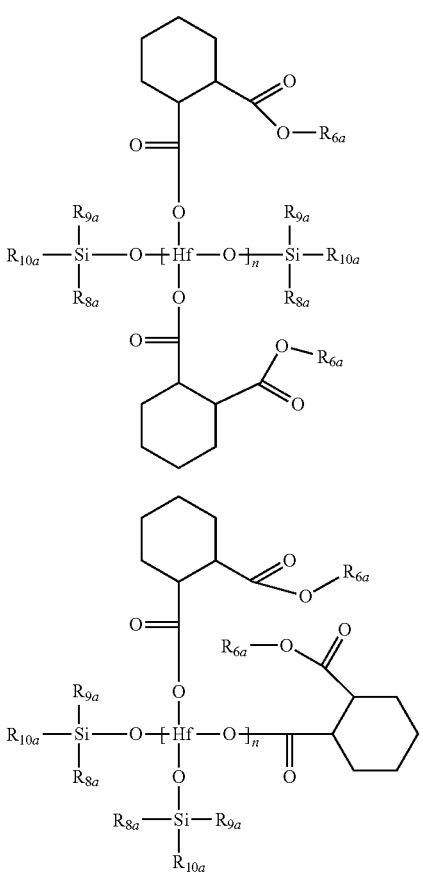

(Ie1)

(Ie2)

-continued

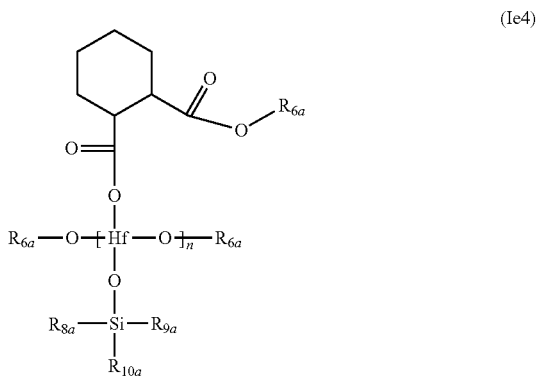

(Ie3)

(Ie4)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (If1), structure (If2), or structure (If3), wherein, $R_{6a}$ is selected from a $C_1$ to $C_4$ alkyls, and $R_{8a}$ and $R_{9a}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls, and $R_{10a}$ is selected from the group consisting of $C_1$ to $C_8$ alkyls, and $C_6$ to $C_{16}$ aryls, wherein, n is 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures.

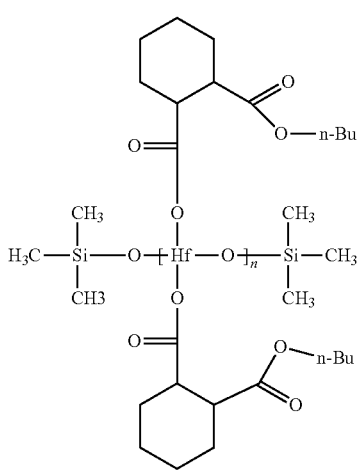

(If1)

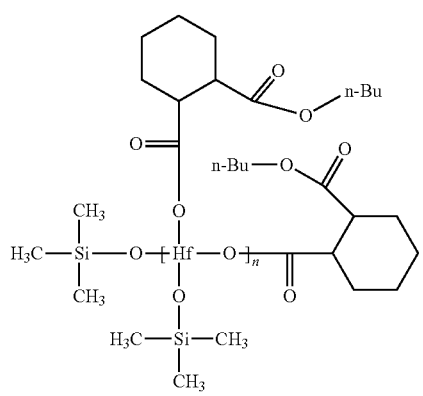
(If2)

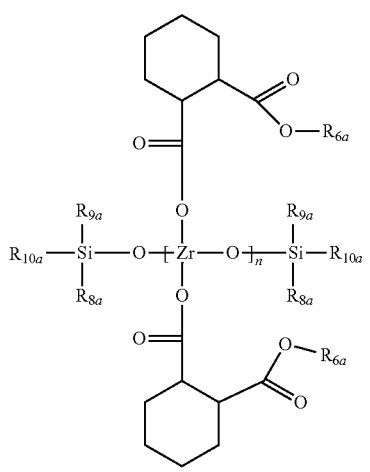
(Ig1)

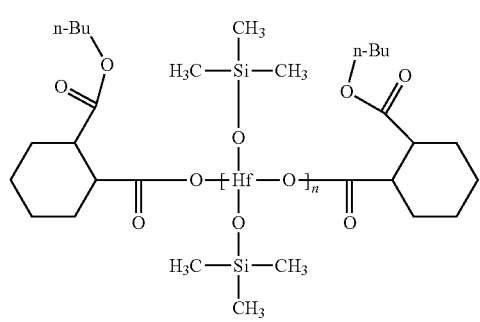
(If3)

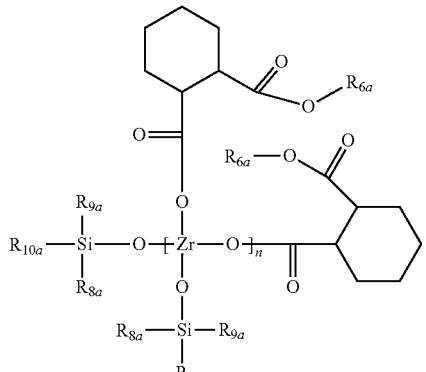
(Ig2)

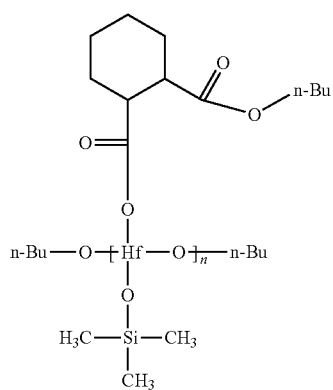
(If4)

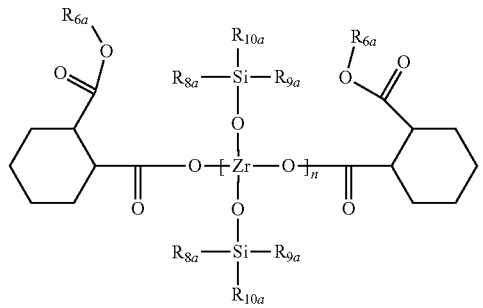
(Ig3)

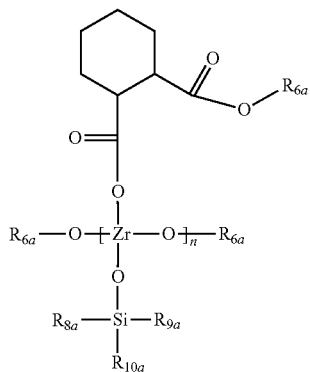
(Ig4)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ig1), structure (Ig2), structure (Ig3), or structure (Ig4), wherein, $R_{6a}$ is selected from a $C_1$ to $C_4$ alkyls, and $R_{8a}$ and $R_{9a}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls, and $R_{10a}$ is selected from the group consisting of $C_1$ to $C_8$ alkyls, and $C_6$ to $C_{16}$ aryls, wherein, n is 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures.

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ih1), structure (Ih2), structure (Ih4), or structure (Ih3), wherein, n is 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures.

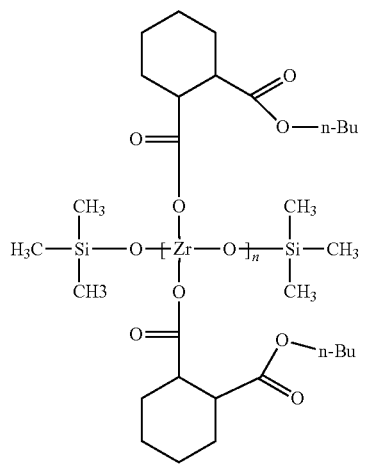

(Ih1)

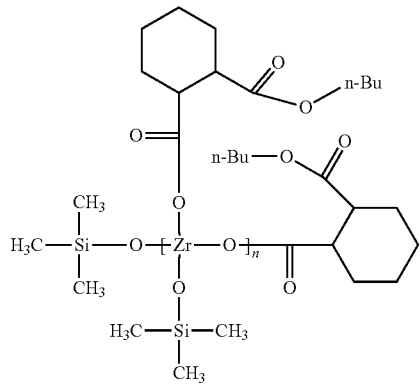

(Ih2)

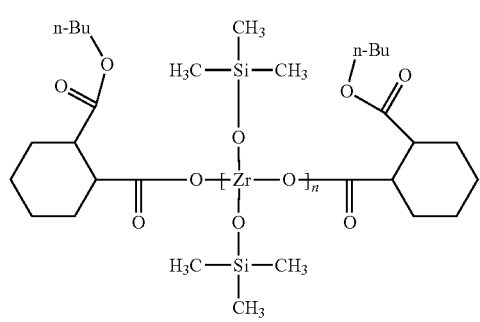

(Ih3)

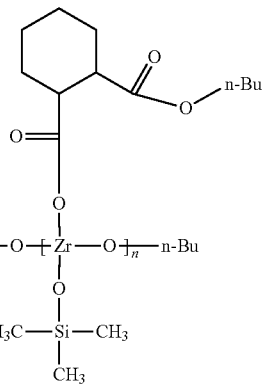

(Ih4)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ii1), structure (Ii2), structure (Ii3), or structure (Ii4), wherein, $R_{6a}$ and $R_{6d}$ are independently selected from a $C_1$ to $C_4$ alkyls, and $R_{8a}$ and $R_{9a}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls, and $R_{10a}$ is selected from the group consisting of $C_1$ to $C_8$ alkyls, and $C_6$ to $C_{16}$ aryls, and further wherein, n is 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures.

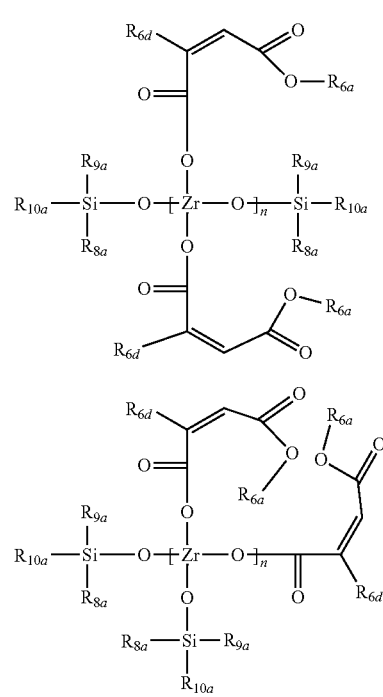

(Ii1)

(Ii2)

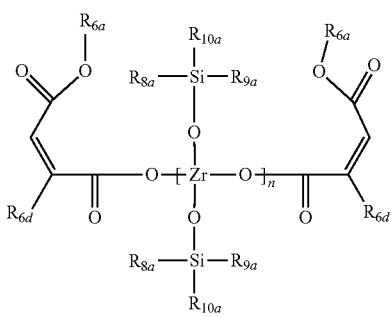

(Ii3)

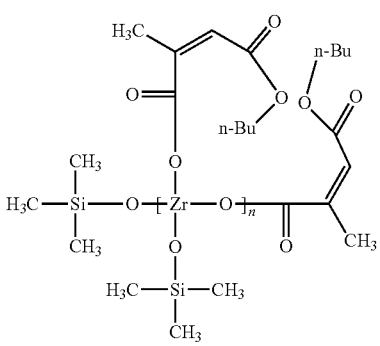

(Ij2)

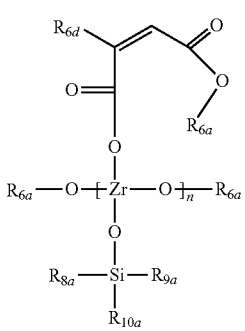

(Ii4)

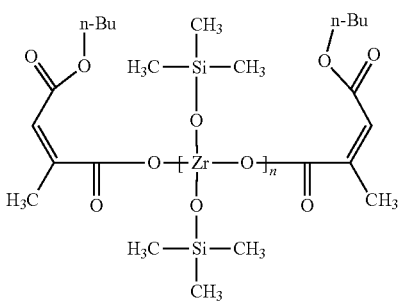

(Ij3)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ij1), structure (Ij2), structure (Ij3), or structure (Ij4), wherein, n is 1 to 20. In another embodiment of this aspect of the invention n is 6 to 20. In another embodiment of this aspect of the invention n is 1. In yet another embodiment, when n is 2 to 20, the metal compound comprises mixture of repeat unit designated by n, and the two end groups found in the aforementioned structures.

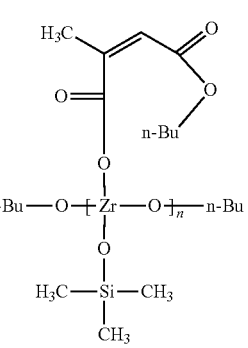

(Ij4)

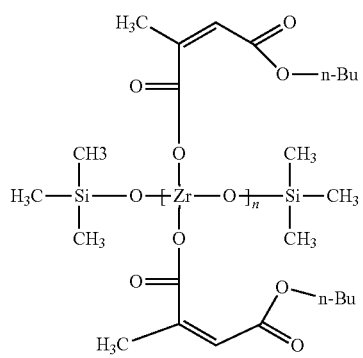

(Ij1)

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Ik1), structure (Ik2), structure (Ik3), or structure (Ik4), wherein, $R_{6a}$ is selected from a $C_1$ to $C_4$ alkyls, and $R_{8a}$ and $R_{9a}$ are each independently selected from the group consisting of $C_1$ to $C_8$ alkyls, $C_3$ to $C_{12}$ branched alkyls, $C_1$ to $C_8$ alkyloxys, $C_3$ to $C_{12}$ branched alkyloxys, and $C_6$ to $C_{16}$ aryls, and $R_{10a}$ is a $C_1$ to $C_8$ alkyls, wherein, n is 6 to 20. In yet another embodiment, when n is 6 to 20, the metal compound comprises mixture of repeat unit designated by n, and the two end groups found in the aforementioned structures.

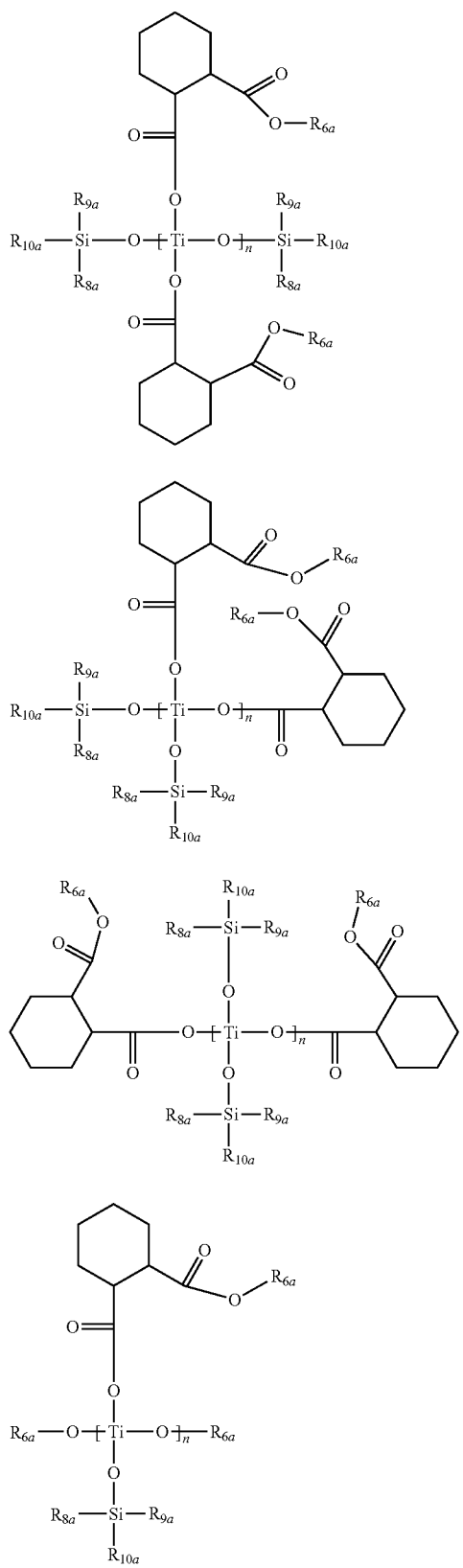

In another embodiment of the aforementioned inventive compositions, it comprises metal compounds having the following structures or mixtures of compounds having these structures each of which contains a repeat unit designated by n (the number of repeat units), and two end groups: Wherein, the structures are structure (Il1), structure (Il2), structure (Il3), or structure (Il3), wherein n is 1 to 20, preferably 6 to 20. In yet another embodiment, when n is 6 to 20, the metal compound comprises mixture of repeat unit designated by n, and the two end groups found in the aforementioned structures.

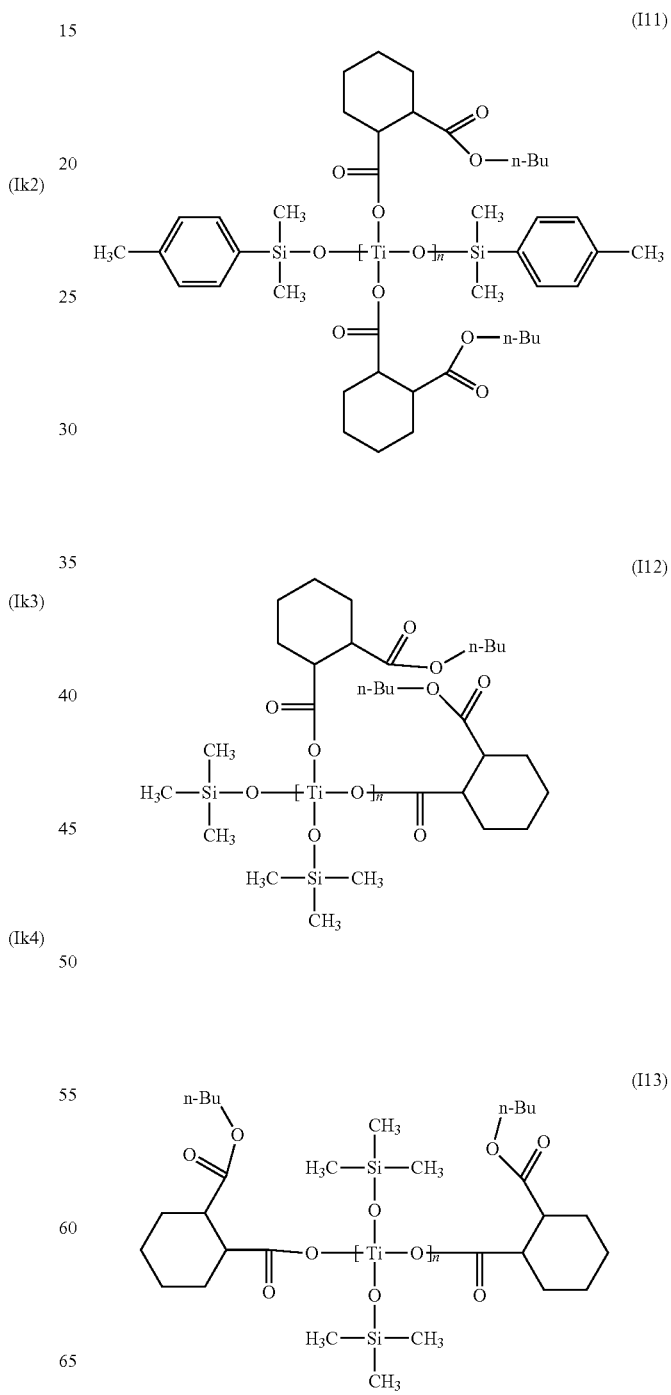

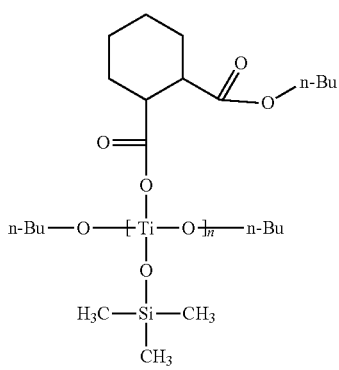

(I14)

In another embodiment of the aforementioned inventive composition, the wt. % of component a), the metal compound, as the total wt. % of all solid components, when component c), the polyol, is present, is from about 20 wt. % to about 98 wt. %. In another aspect of this embodiment the wt. % total solid component is from about 25 wt. % to about 80 wt. %. In another aspect of this embodiment the wt. % total solid component is from about 30 wt. % to about 70 wt. %. In another aspect of this embodiment the wt. % total solid component is from about 35 wt. % to about 65 wt. %. In another aspect of this embodiment the wt. % total solid component is from about 40 wt. % to about 60 wt. %. In another aspect of this embodiment the wt. % total solid component is from about 45 wt. % to about 60 wt. %. In another aspect of this embodiment the wt. % total solid component is from about 50 wt. % to about 60 wt. %. In another aspect of this embodiment the wt. % total solid component is from about 55 wt. % to about 60 wt. %.

In another preferred embodiment of the aforementioned inventive composition, when component c), the polyol, is present, the wt. % of component a), the metal compound, is present from about 20 wt. % to about 85 wt. %. In another aspect of this embodiment the wt. % total solid component a) is from about 30 wt. % to about 80 wt. %. In another aspect of this embodiment the wt. % total solid component a) is from about 50 wt. % to about 75 wt. %.

In all the above described embodiment where component c), the polyol, is present the total combined solid content, adds up to 100 wt. %, if no additional solid components are present. If an additional solid component is present the total wt. % solid of all solids component a), component b), component c) and any additional component(s) adds up to 100 wt. % of total solids, if no additional solid components are present. If an additional solid component is present the total wt. % solid of all solids, component a), component b), component c) and any additional component(s) adds up to 100 wt. % of total solids.

In another embodiment of the aforementioned inventive composition, the wt. % of component a), the metal compound, as the total wt. % of all solid components, when component c), the polyol, is not present, is from about 20 wt. % to about 98 wt. %. In another aspect of this embodiment the wt. % total solid component is from about 25 wt. % to about 80 wt. %. In another aspect of this embodiment the wt. % total solid component is from about 30 wt. % to about 70 wt. %. In another aspect of this embodiment the wt. % total solid component is from about 35 wt. % to about 65 wt. %. In another aspect of this embodiment the wt. % total solid component is from about 40 wt. % to about 60 wt. %. In another aspect of this embodiment the wt. % total solid component is from about 45 wt. % to about 55 wt. %. In another aspect of this embodiment the wt. % total solid component is from about 50 wt. %. In all the above described embodiment where component c) is absent the total combined solid wt. % solids of component and component b), if no other additional solid components are present. If an additional solid component is present the total wt. % solid of all solids, component a), component b) and any additional other component(s) adds up to 100 wt. % of total solids.

Component b), Spin on High Carbon Polymer

In one aspect of the inventive composition, said component b) is a spin on high carbon polymer, having a polymer backbone comprising both mono-cyclic aromatic hydrocarbon moieties, and fused-ring ring hydrocarbon moieties.

In one aspect of the inventive composition, said component b) is a spin on high carbon polymer, having a polymer backbone comprising only mono-cyclic aromatic hydrocarbon moieties.

In one aspect of the inventive composition, said component b) is a spin on high carbon polymer, having a polymer backbone comprising only fused-ring ring hydrocarbon moieties.

In one aspect of the inventive composition, in component b) said mono-cyclic aromatic hydrocarbon moiety is a phenylene or substituted phenylene containing one or more such phenylene moieties which is attached either directly to the polymer backbone to another aromatic hydrocarbon moiety or through one or more alkylene moieties which may comprise this mono-cyclic aromatic hydrocarbon. Non-limiting examples of phenylene moieties comprising an alkylenene moiety are a (alkylene-phenylene-), an (-alkylene-phenylene-alkylene-) moiety, a (-phenylene-alkylene-phenylene-) moiety. Said intermediate alkylene spacer may be selected from linear, branched cyclic moiety attached which may also comprise aromatic moieties either a phenyl comprising moiety or a moiety comprising a fused aromatic. These mono-cyclic aromatic hydrocarbon moieties, apart from any alkynyloxy substitutions present by virtue of capping of phenols with an alkynyl moiety, or optional free uncapped phenols, may be further substituted either on an aromatic ring or an alkylene moiety with a linear or branched alkyl moiety, an aryl moiety, a fused aromatic moiety, or a cyclic alkyl moiety which may contain olefinic or aromatic unsaturations as part of the alkyl moiety or contain no such unsaturations. Non-limiting examples of mono-cyclic aromatic hydrocarbon moieties are as follows:

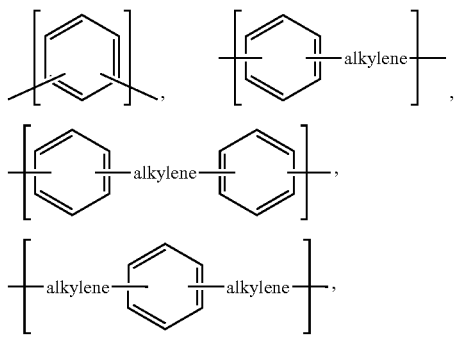

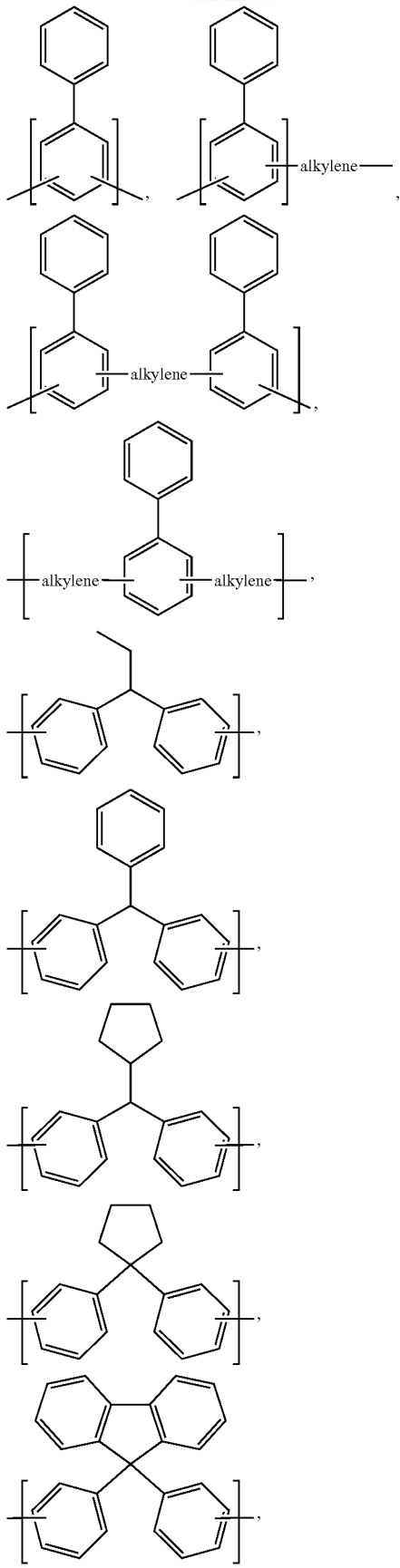

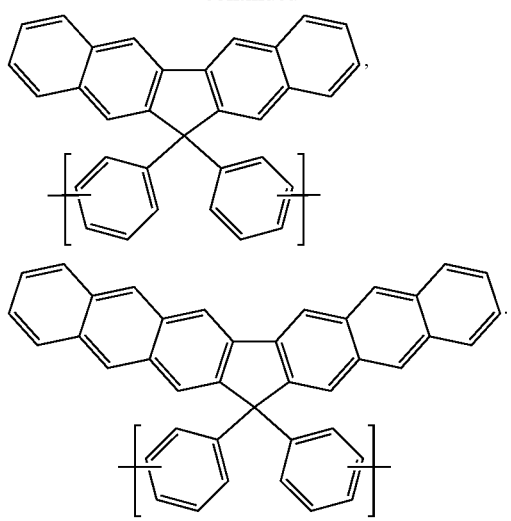

In one aspect of the inventive composition, in component b) in said spin on high carbon polymer, said fused-ring hydrocarbon moieties are comprised of one or more fused ring which are attached either directly to another aromatic moiety in the backbone, or indirectly to another aromatic hydrocarbon moiety through one or more alkylene moieties which may comprise said fused-ring hydrocarbon moiety. Non-limiting examples of such fused-ring hydrocarbon moiety, comprising an alkylene moiety are an (-alkylene-fused ring-) moiety, an (-alkylene-fused ring-) moiety, a -(fused ring-alkylene-fused ring-) moiety and the like. Said intermediate alkylene spacer may be selected from ones which are linear, branched or cyclic which may be substituted with phenyl comprising moieties or fused aromatic comprising moieties. Said fused ring hydrocarbon moieties, apart from any alkynyloxy substitutions present by virtue of capping of phenols with an alkynyl moiety, or optional free uncapped phenols, may be further substituted either on an aromatic ring or an alkylene moiety with a linear or branched alkyl moiety, an aryl moiety, a fused aromatic moiety, or a cyclic alkyl moiety which may contain olefinic or aromatic unsaturations as part of the alkyl moiety or contain no such unsaturations. Specific non-limiting examples of fused-ring hydrocarbon moiety are as follows:

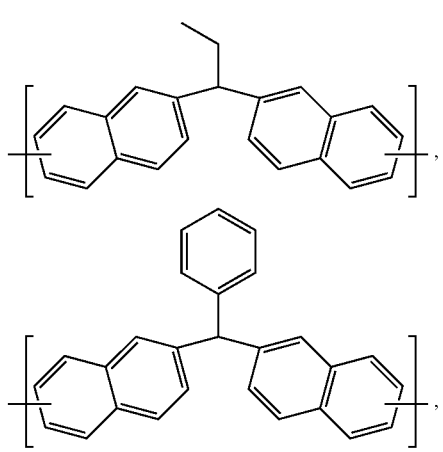

-continued
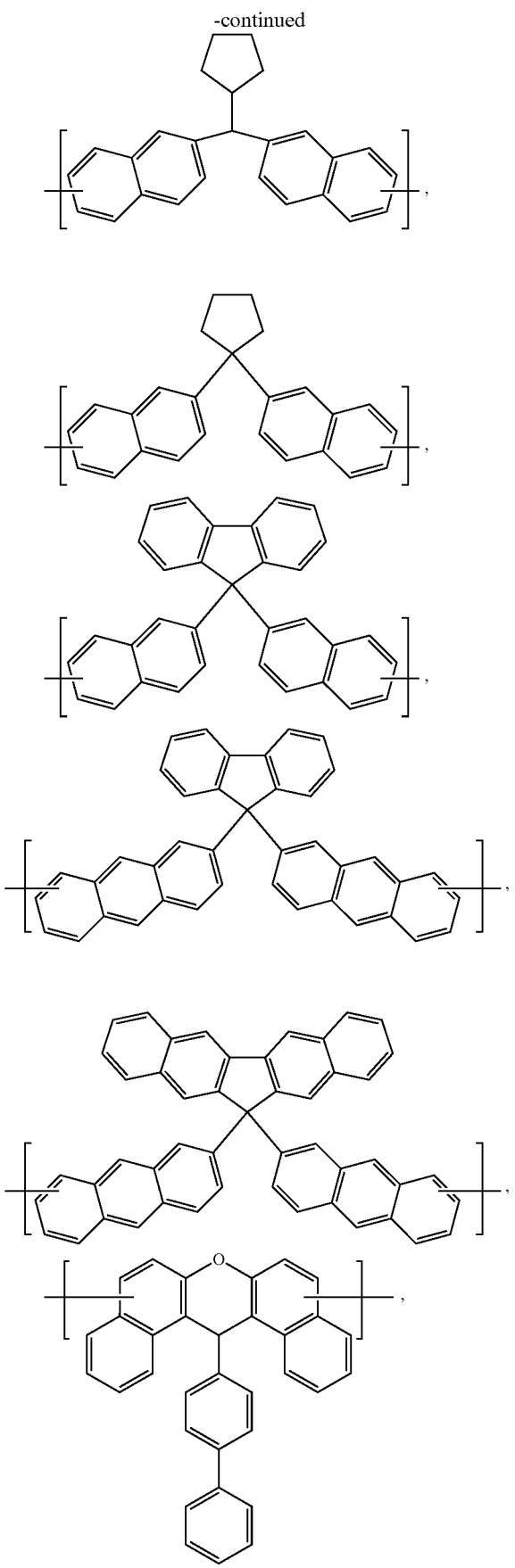
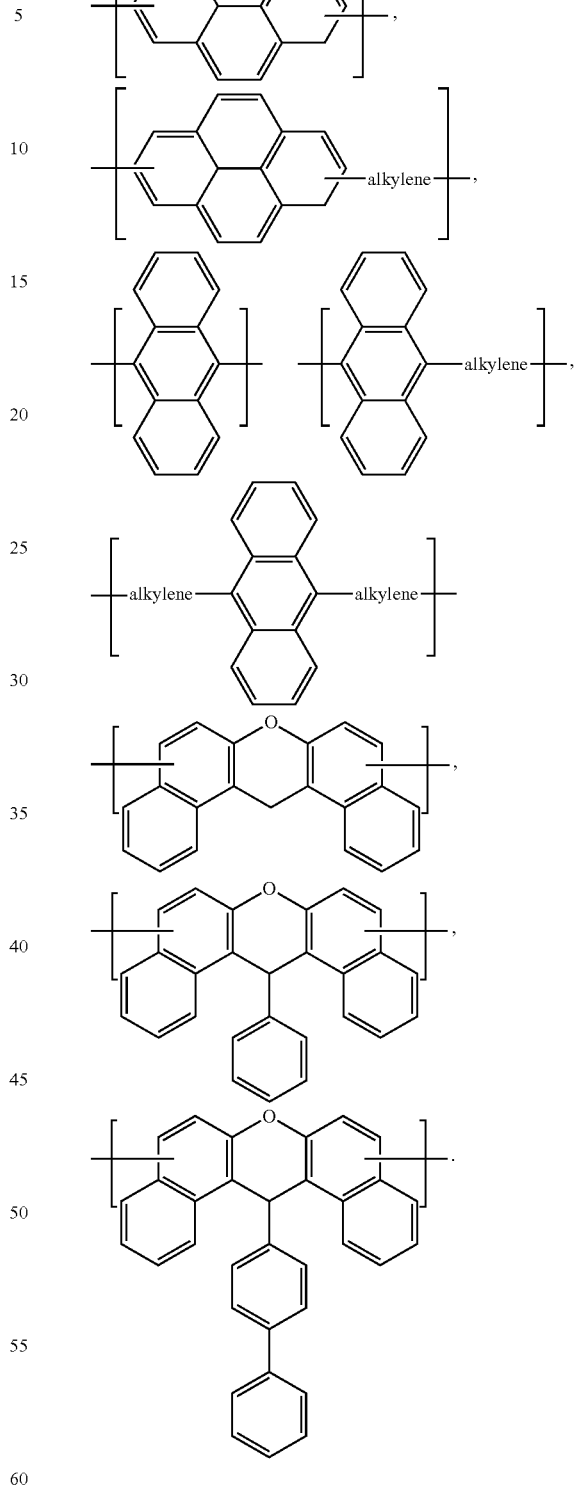
In one aspect of this inventive composition component b) is one wherein said fused ring hydrocarbon moiety are ones which comprise a fused aromatic moiety which has 2 to 8 rings. In another aspect of this embodiment said fused ring hydrocarbon moiety are ones which comprise a fused aromatic moiety which has 2 to 5 rings.

In one aspect of the inventive composition component b) said mono-cyclic aromatic hydrocarbon moieties and said and said fused-ring ring hydrocarbon moieties may be selected the group consisting of
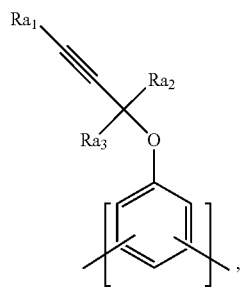
(IX)
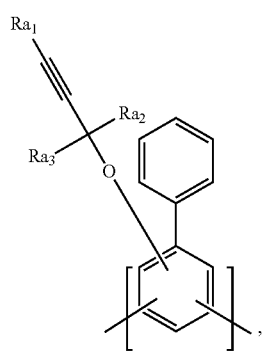
(IXa)
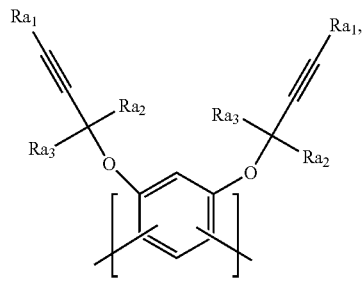
(IXb)
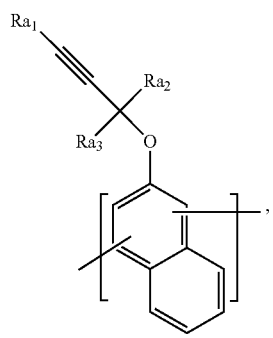
(IXc)
-continued
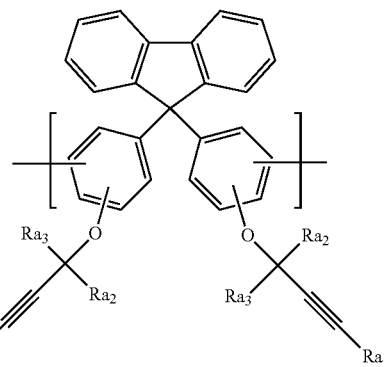
(IXd)
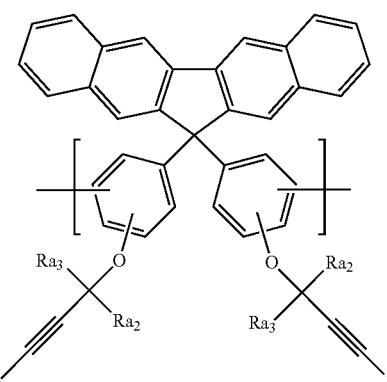
(IXe)
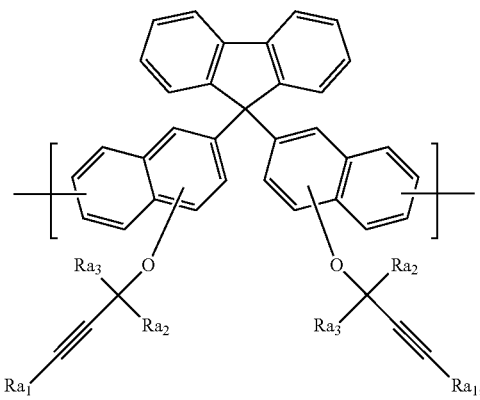
(IXf)
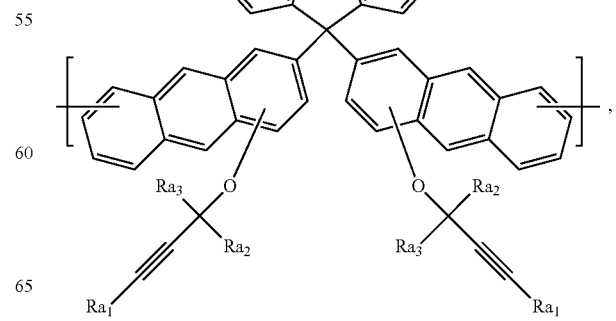
(IXg)

-continued

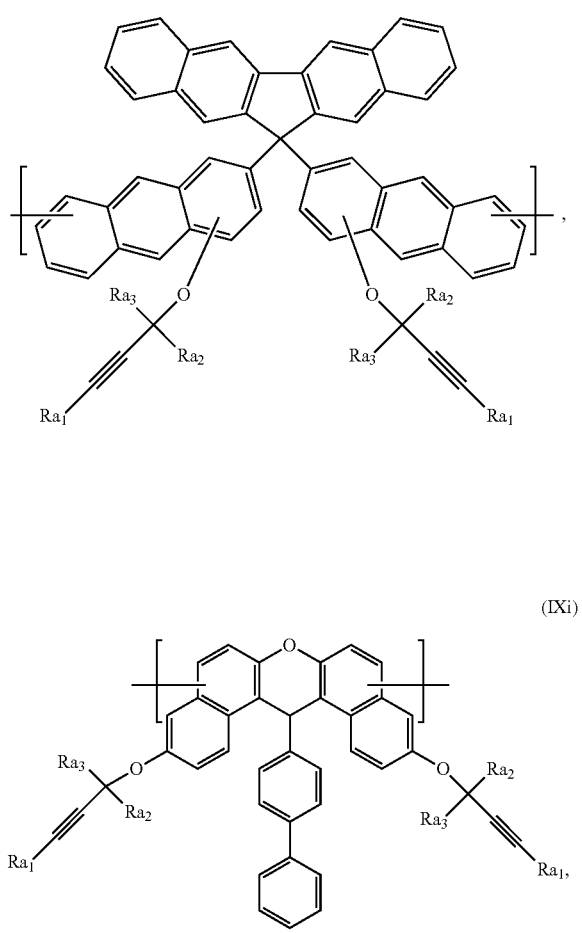

(IXh)

(IXi)

and mixture thereof.

In the embodiments described herein for component b) this material may contain some free phenolic OH group which are not capped by an alkynyl moiety forming an alkynyloxy moiety of structure (VIII). However, it is preferred that the molar ratio of free phenol to phenols capped with an alkynyl moiety forming an alkynyoxy moiety of structure (VIII) may be no higher than about 50:50. In other aspects of this invention this ratio may be lower still, specifically, one embodiment, about 40:60 or lower, in yet another aspect about 30:70 or lower, in still another aspect 20:80 or lower, in yet another aspect 10:90 or lower, in yet another aspect 5:95 or lower, and finally another embodiment is one in which no significant amounts of free phenol are present with all phenolic moieties capped with an alkynyl moiety forming an alkynyloxy moiety of structure (VIII).

In another embodiment of the above described inventive composition, said component b), said spin on high carbon polymer, comprises moieties which may be selected from the group consisting of (IX), (IXa), (IXb), (IXc), (IXd), (IXe), (IXf), (IXg), (IXh), (IXi) and mixtures thereof which have phenol groups which are capped forming an alkynyloxy moiety of structure (VIII). Other types of optional moieties may also be present in this component. For instance, uncapped moieties with free phenol groups corresponding to moieties (IX), (IXa), (IXb), (IXc), (IXd), (IXe), (IXf), (IXg), (IXh), (IXi) may be present in the molar ratios versus alkynyloxy groups, as described above. Other types of optional moieties which may be present such as moieties in which the alkynyloxy group in moieties (IX), (IXa), (IXb), (IXc), (IXd), (IXe), (IXf), (IXg), (IXh), (IXi) is replaced with a hydrogen, an aryl, or a $C_1$ to $C_6$ alkyl group these types of moieties may be present up to about 20 mole % of total moieties in said high carbon component b), in another aspect these are present up to about 10 mole %, in yet another aspect us to 5 mole %, in still another aspect up to 1 mole %.

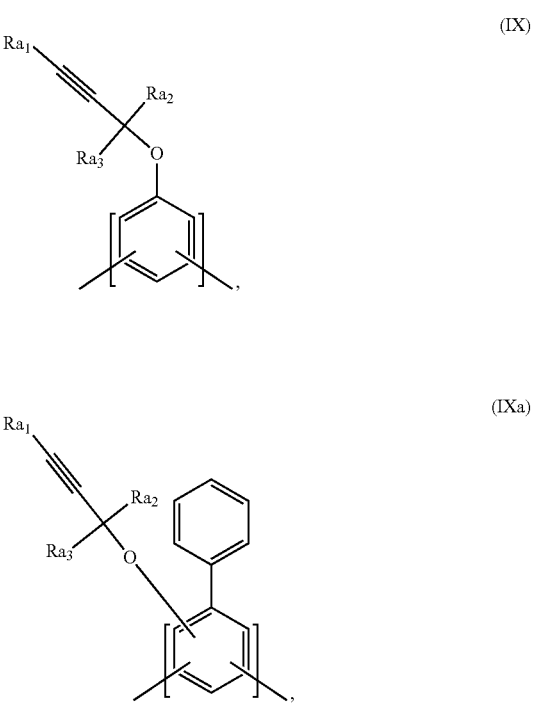

(IX)

(IXa)

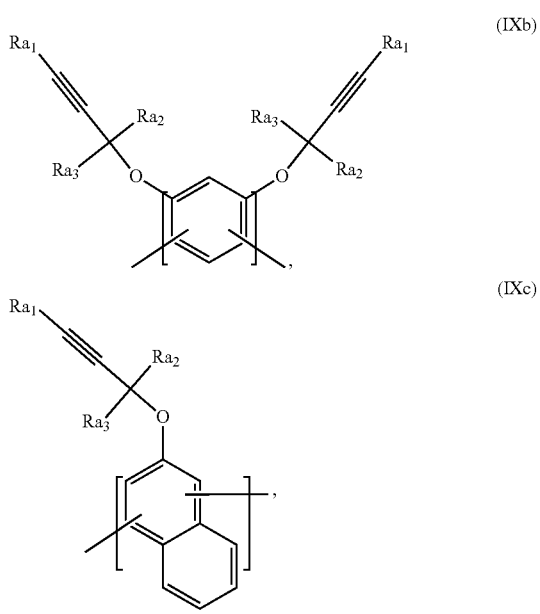

(IXb)

(IXc)

-continued

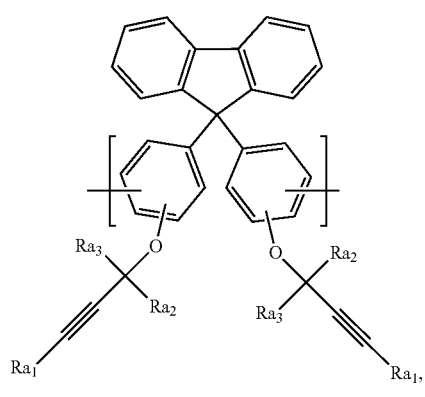
(IXd)

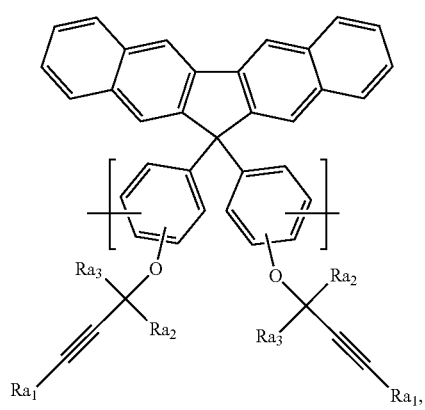
(IXe)

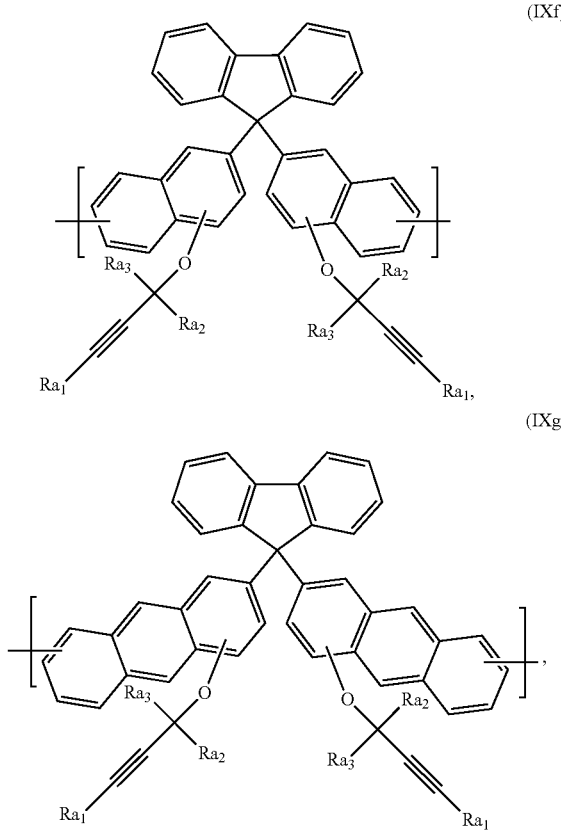
(IXf)

(IXg)

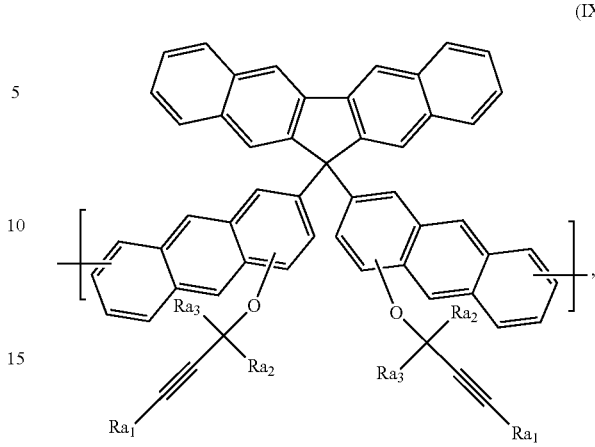
(IXh)

(IXi)

In another embodiment of the above described inventive composition, said component b), comprises a repeat unit having structure (X):

$$\mathrm{+A\text{-}B+} \tag{X}$$

In this embodiment, A is selected from the group consisting of moieties (IX), (IXa), (IXb), (IXc), (IXd), (IXe), (IXf), (IXg), (IXh), (IXi) and mixtures thereof and B is a moiety selected from the group consisting of (Xa), (Xb), (Xc), (Xd) and mixtures thereof, wherein $Rx_1$ and $Rx_2$ are independently hydrogen, a $C_1$ to $C_6$ alkyl, an aryl moiety, or an alkynyloxy moiety of structure (VIII). Similarly, in this embodiment of component b), optional repeat units may be present in which the alkynyloxy groups in the said selected moieties in A, are replaced by a hydroxy group in the molar ratios as described above. Additionally, in other optional repeat units, the alkynyloxy group in the above moieties selected for A may be replaced with a hydrogen, an aryl, or a $C_1$ to $C_6$ alkyl group, such optional moieties may be present up to about 20 mole % of total moieties in component b), in another aspect these are present up to about 10 mole %, in yet another aspect us to 5 mole %, in still another aspect up to 1 mole %.

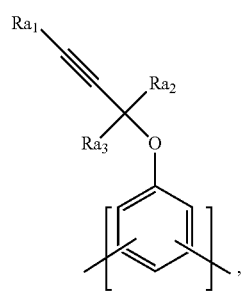
(IX)
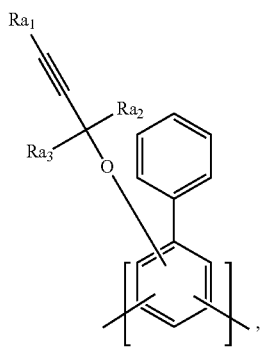
(IXa)
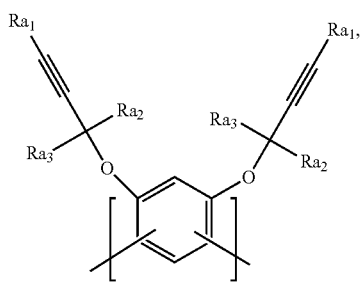
(IXb)
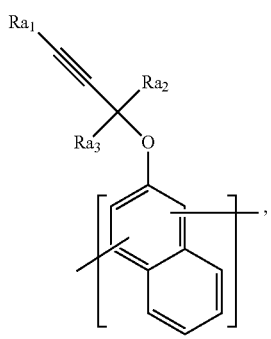
(IXc)
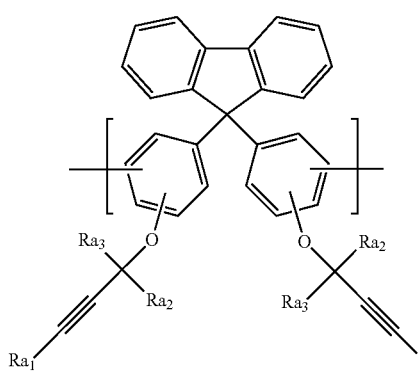
(IXd)
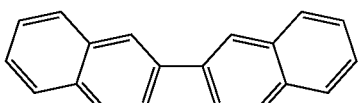
(IXe)
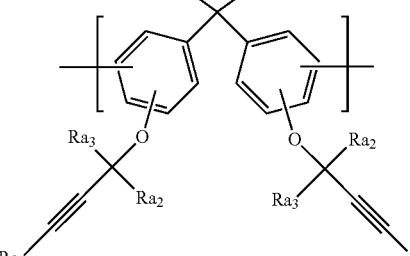
(IXf)
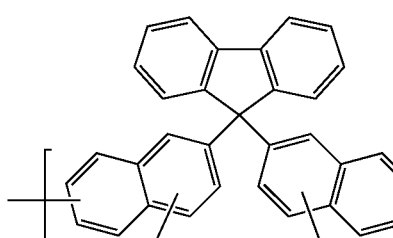
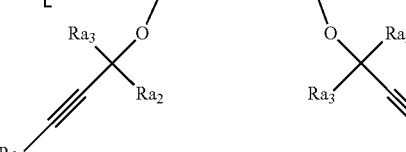
(IXg)
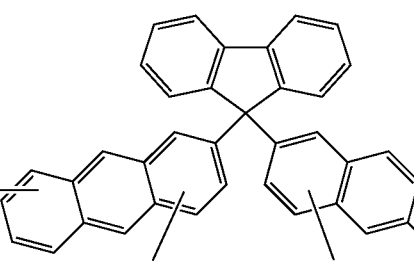

(IXh)
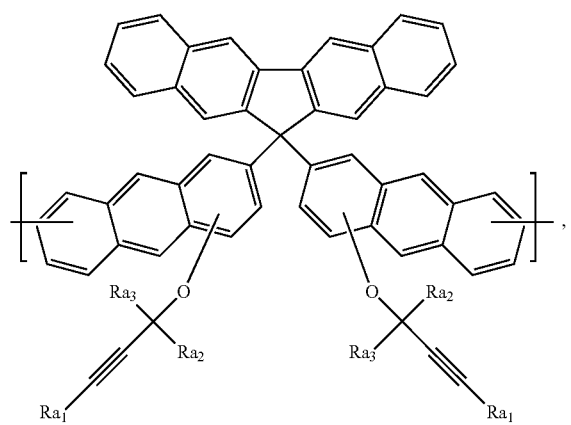

(Xd)
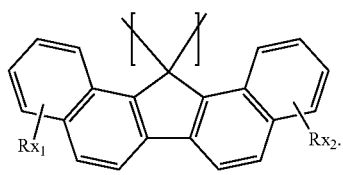

(IXi)
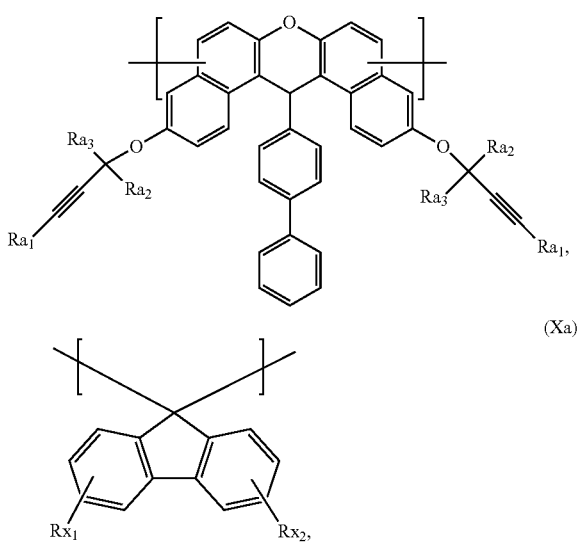

In another embodiment of the above described inventive composition, said component b), said spin on high carbon polymer comprises a repeat unit having structure (XI). In another aspect of this embodiment, said spin on high carbon polymer comprises a repeat unit having structure (XIa). In yet another aspect of this embodiment said spin on high carbon polymer comprises a repeat unit having structure (XIb). Similarly, in these embodiments of component b), optional repeat units may be present in which the alkynyloxy groups in these repeat units, are replaced by a hydroxy group in the molar ratios as described above. Additionally, in other optional repeat units, the alkynyloxy group in these repeat units be replaced with a hydrogen, an aryl, or a $C_1$ to $C_6$ alkyl group, such optional repeat units may be present up to about 20 mole % of total moieties in component b), in another aspect these are present up to about 10 mole %, in yet another aspect us to 5 mole %, in still another aspect up to 1 mole %.

(Xa)
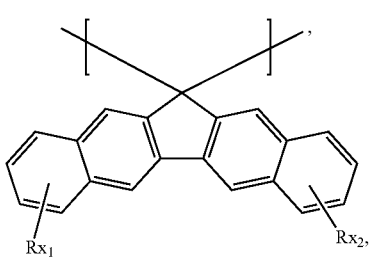

(XI)
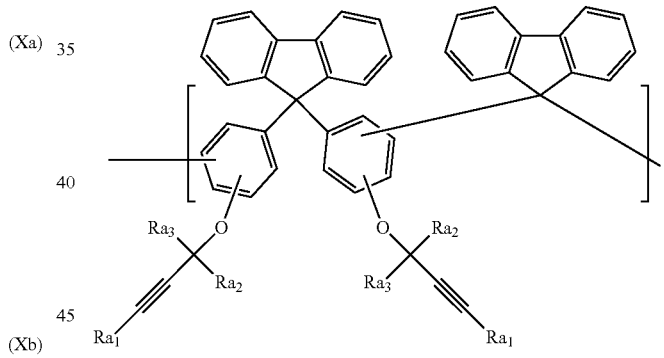

(Xb)
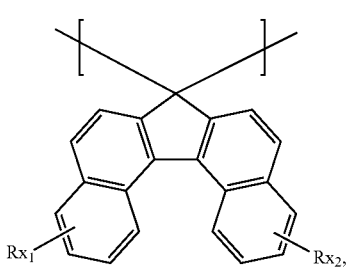

(XIa)
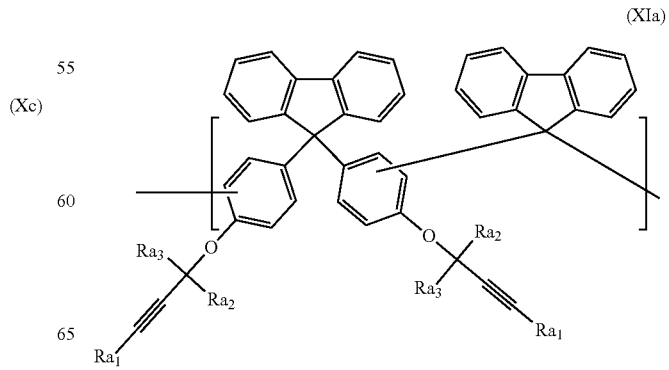

(Xc)

-continued (Xb)

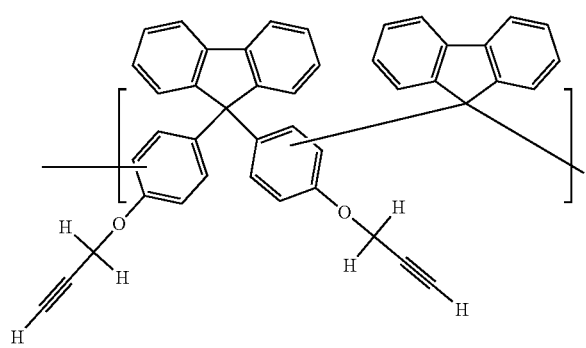

In another embodiment of the above described inventive composition, in said component b), said spin on high carbon polymer comprises a repeat unit having structure (XIc). In another aspect of this embodiment, said spin on high carbon polymer comprises a repeat unit having structure (XId). Similarly, in these embodiments of component b), optional repeat units may be present in which the alkynyloxy groups in these repeat units, are replaced by a hydroxy group in the molar ratios as described above. Additionally, in other optional repeat units, the alkynyloxy group in these repeat units be replaced with a hydrogen, an aryl, or a $C_1$ to $C_6$ alkyl group, such optional repeat units may be present up to about 20 mole % of total moieties in component b), in another aspect these are present up to about 10 mole %, in yet another aspect us to 5 mole %, in still another aspect up to 1 mole %.

In another aspect of the above described inventive composition, said component b), said spin on high carbon polymer it comprises a repeat unit of structure (XII), wherein fAr is a fused aromatic ring, $R_{16}$ and $R_{17}$ are each independently hydrogen or a $C_1$ to $C_4$ alkyl. In another aspect of this embodiment, fAr is a group comprising 2-8 fused aromatic rings. In yet another aspect of this embodiment fAr is anthracene. In yet another aspect of this embodiment, said repeat unit has structure (XIIa). In still another aspect, said repeat unit has structure (XIIb). In still another aspect, said repeat unit has structure (XIIc). Similarly, in these embodiments of component b), optional repeat units may be present in which the alkynyloxy groups in these repeat units, are replaced by a hydroxy group in the molar ratios as described above. Additionally, in other optional repeat units, the alkynyloxy group in these repeat units be replaced with a hydrogen, an aryl, or a $C_1$ to $C_6$ alkyl group, such optional repeat units may be present up to about 20 mole % of total moieties in component b), in another aspect these are present up to about 10 mole %, in yet another aspect us to 5 mole %, in still another aspect up to 1 mole %.

(XIc)

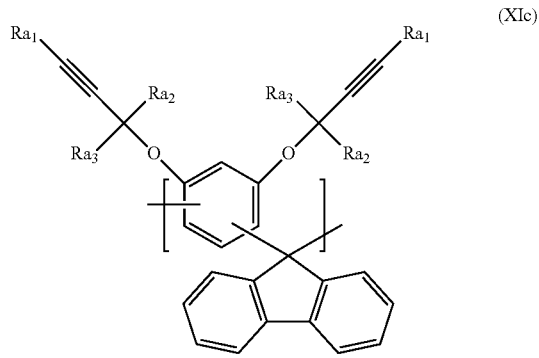

(XId)

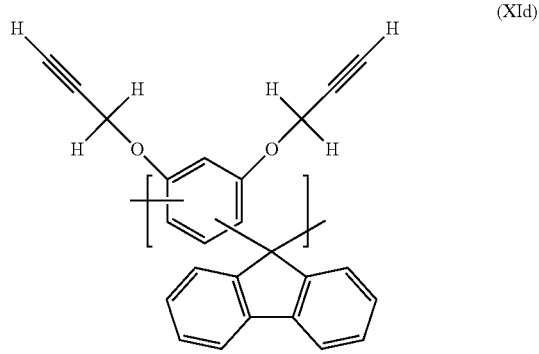

(XII)

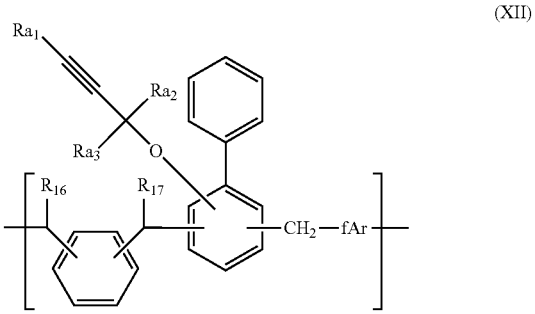

(XIIa)

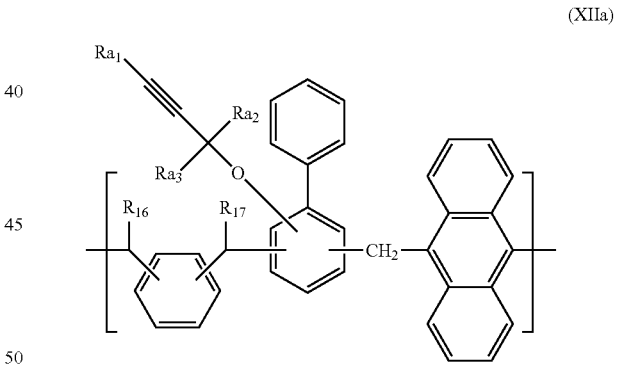

(XIIb)

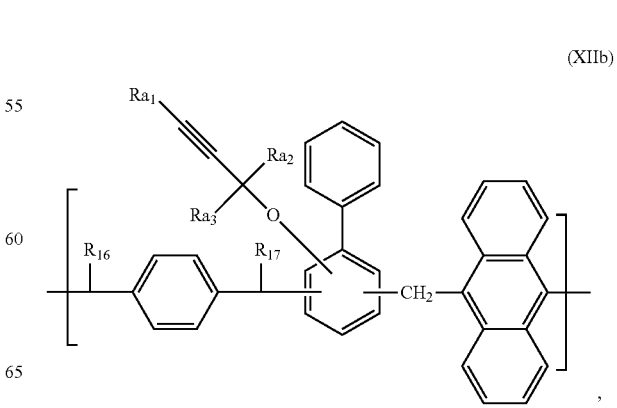

,

-continued

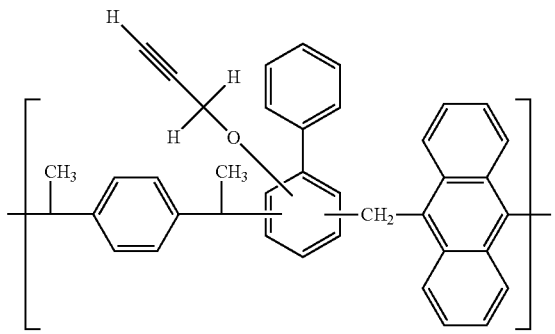

(XIIc)

In another aspect of the above described inventive composition, said component b), said spin on high carbon polymer it comprises repeat units selected from the group consisting of repeat units having structures (XIII), (XIIIa), (XIIIb), (XIIIc), and (XIIId), and mixtures thereof. In another aspect of this embodiment it comprises repeat units selected from the group consisting of repeat units having structures (XIIIe), (XIIIf), (XIIIg), (XIIIh), and (XIIIi), and mixtures thereof. In another aspect of this embodiments $R_{16}$ and $R_{17}$ are a $C_1$ to $C_6$ alkyl. In yet another embodiment, $R_{16}$ and $R_{17}$ are an $C_1$ to $C_4$ alkyl. In still another embodiment $R_{16}$ and $R_{17}$ are a hydrogen. In yet another embodiment $R_{16}$ and $R_{17}$ are methyl. In still another embodiment, $Ra_1$, $Ra_2$ and $Ra_3$ are hydrogen. Similarly, in these embodiments of component b), optional repeat units may be present in which the alkynyloxy groups in these repeat units, are replaced by a hydroxy group in the molar ratios as described above. Additionally, in other optional repeat units, the alkynyloxy group in these repeat units be replaced with a hydrogen, an aryl, or a $C_1$ to $C_6$ alkyl group, such optional repeat units may be present up to about 20 mole % of total moieties in component b), in another aspect these are present up to about 10 mole %, in yet another aspect us to 5 mole %, in still another aspect up to 1 mole %.

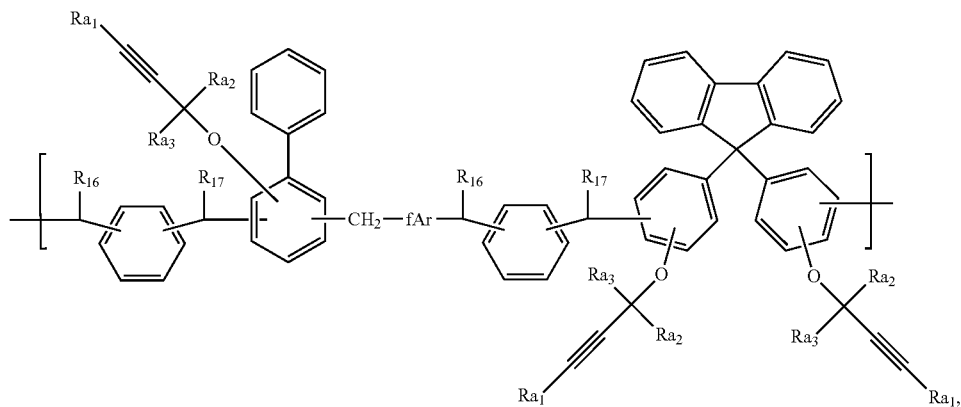

(XIII)

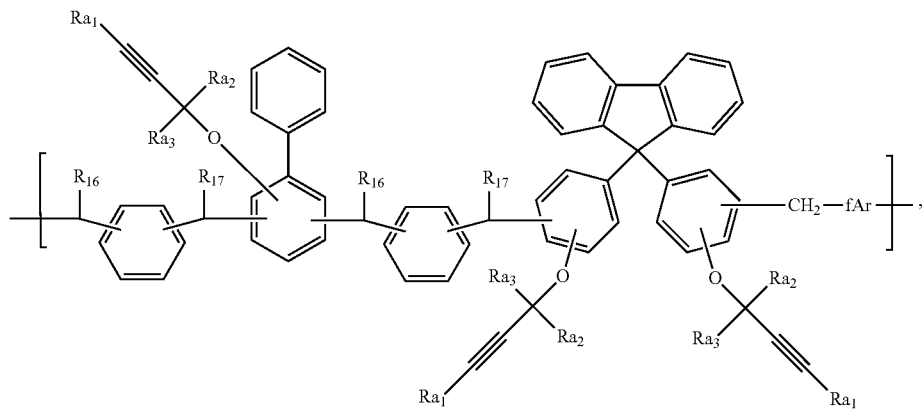

(XIIIa)

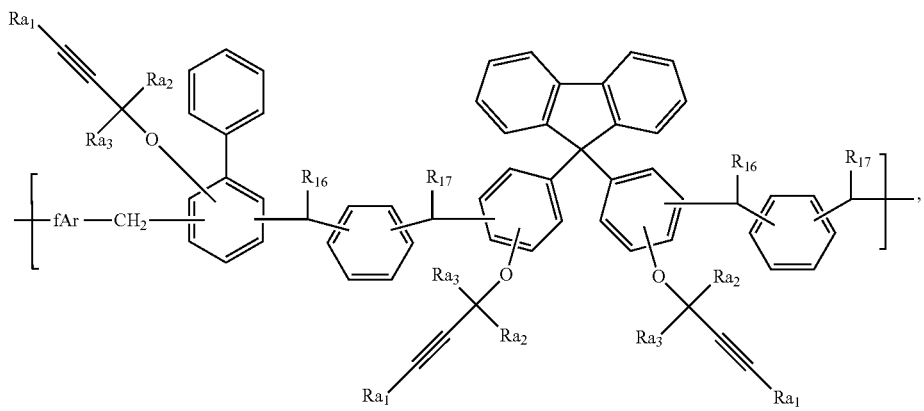
(XIIIb)
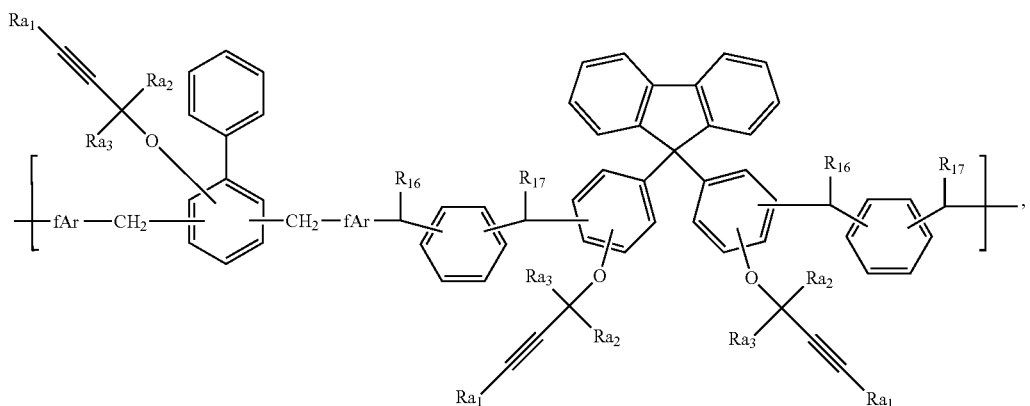
(XIIIc)
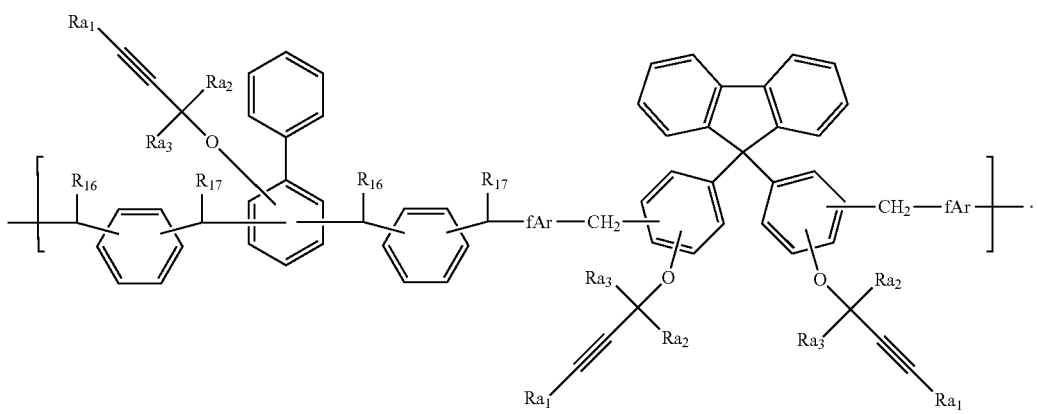
(XIIId)
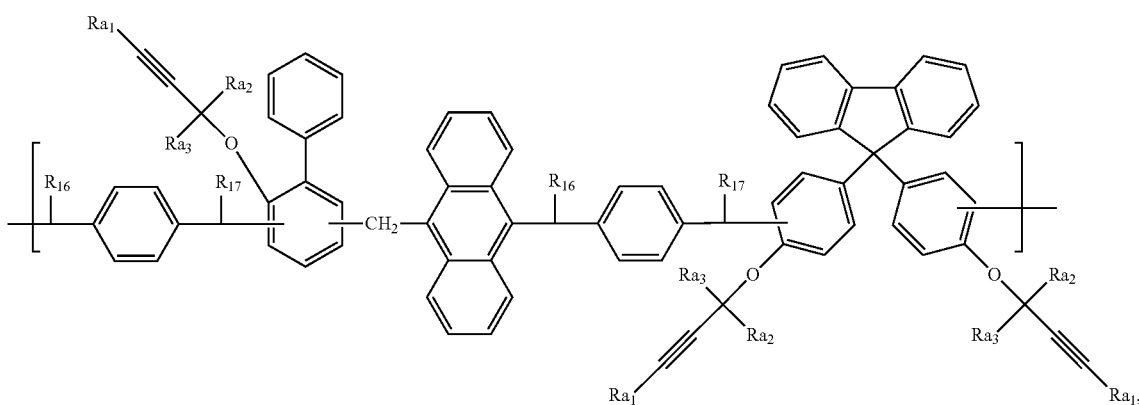
(XIIIe)

-continued
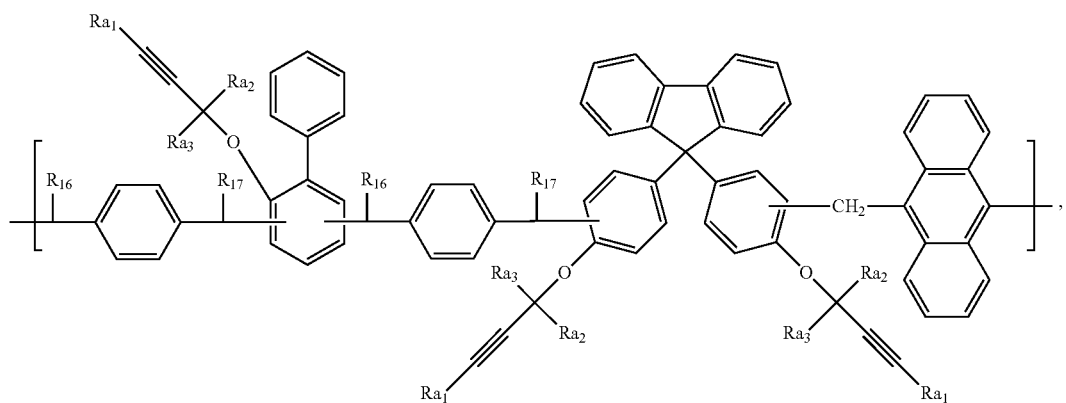
(XIIIf)
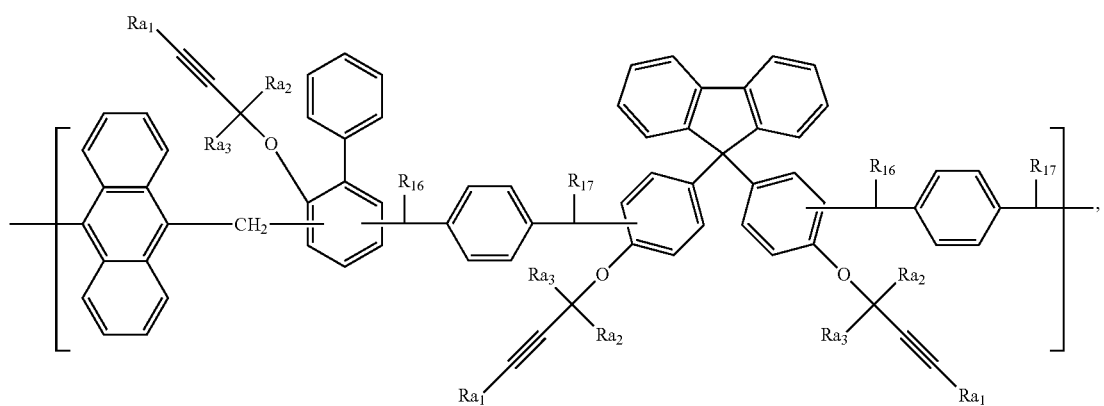
(XIIIg)
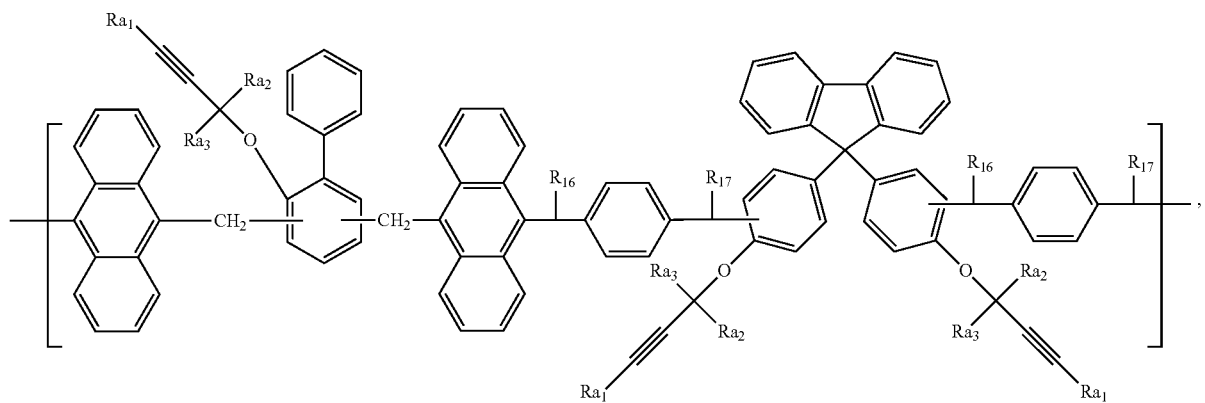
(XIIIh)

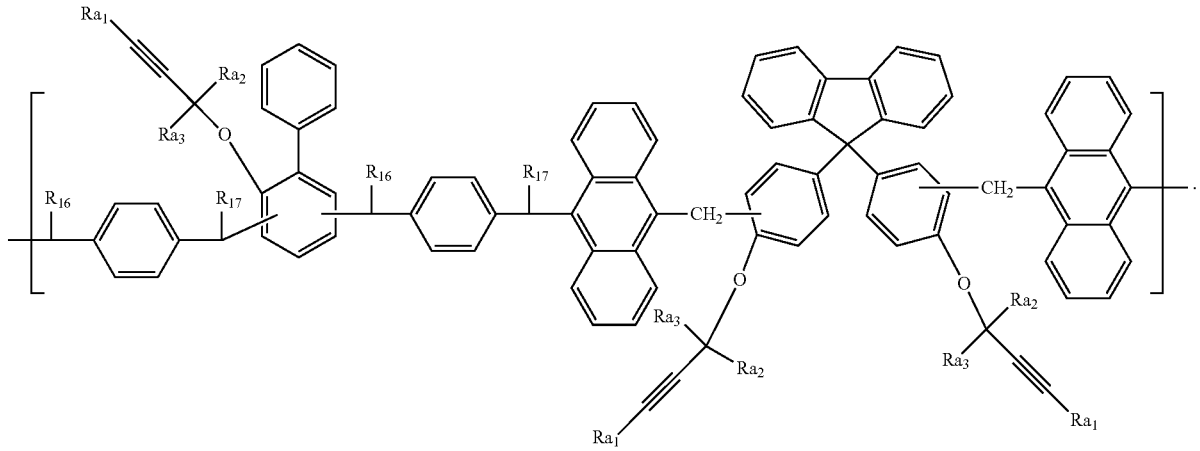
(XIIIi)

In another aspect of the above described inventive composition, said component b), said spin on high carbon polymer comprises repeat units selected having structures (XIV). In another aspect of this embodiment it comprises repeat units selected from the group consisting of repeat units having structures (XIVa). In another embodiment, $Ra_1$, $Ra_2$ and $Ra_3$ are hydrogen. Similarly, in these embodiments of component b), optional repeat units may be present in which the alkynyloxy groups in these repeat units, are replaced by a hydroxy group in the molar ratios as described above. Additionally, in other optional repeat units, the alkynyloxy group in these repeat units be replaced with a hydrogen, an aryl, or a $C_1$ to $C_6$ alkyl group, such optional repeat units may be present up to about 20 mole % of total moieties in component b), in another aspect these are present up to about 10 mole %, in yet another aspect us to 5 mole %, in still another aspect up to 1 mole %.

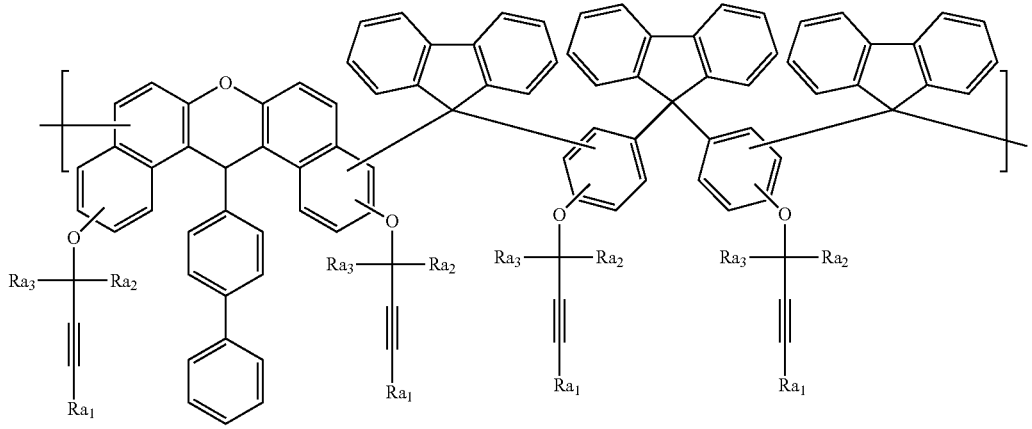
(XIV)

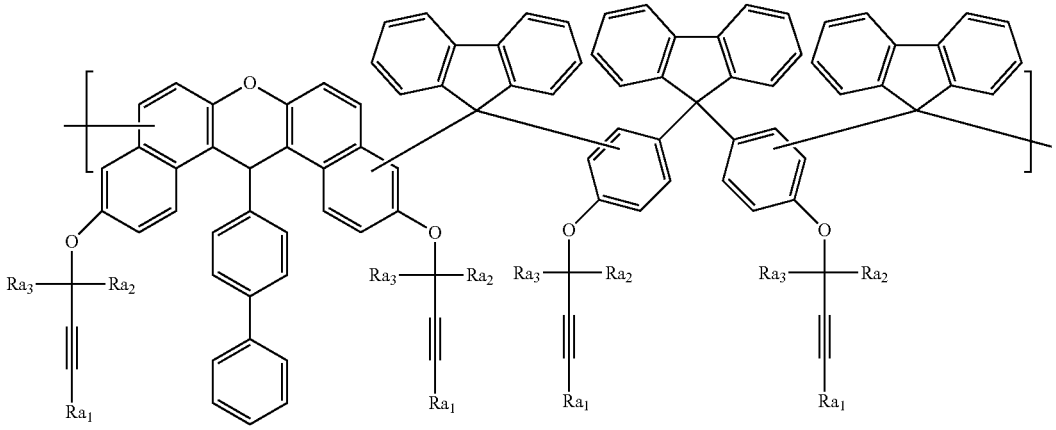
(XIVa)

In any of the inventive compositions described herein, said component b), said a spin on high carbon polymer is one which has an Mw from about 500 to about 5000. In another aspect of this embodiment said high carbon polymer is one which has an Mw from about 600 to about 3000. In yet another aspect of this embodiment it has an Mw from about 600 to about 2500. In yet another aspect of this embodiment it has an Mw from about 600 to about 2300. In still another embodiment it has an Mw from about 600 to about 2200. In still another embodiment it has an Mw from about 600 to about 2000. In still another embodiment it has an Mw from about 600 to about 1500. In still another embodiment it has an Mw from about 600 to about 1300. In yet another embodiment it has an Mw from about 700 to about 1200.

In another aspect of the above described inventive composition, said component b), said spin on high carbon polymer is one wherein the alkynyloxy substituted spin on carbon polymer, is present in an amount that is from about 1 wt. % up to about 50 wt. % of the metal compound.

In another embodiment of the aforementioned inventive compositions, when component c), the polyol, is present, component b), the alkynyloxy substituted spin on carbon polymer, is present as a wt. % of total solid components from about 1 wt. % to about 50 wt. %. In another aspect of this embodiment component c) is present from about 5 wt. % to about 50 wt. %. In another aspect of this embodiment component c) is present from about 10 wt. % to about 50 wt. %. %. In another aspect of this embodiment component c) is present from about 15 wt. % to about 50 wt. %. %. In another aspect of this embodiment component c) is present from about 20 wt. % to about 50 wt. %. %. In another aspect of this embodiment component c) is present from about 20 wt. % to about 45 wt. %. In another aspect of this embodiment component c) is present from about 20 wt. % to about 40 wt. %. In another aspect of this embodiment component c) is present from about 25 wt. % to about 35 wt. %. In all aspects of these embodiments to total wt. % of solids components a) b) and c), adds up, to 100 wt. %, if no additional solid components are present. If an additional solid component is present, the total wt. % solid of all solids component a), component c), component b) and any additional component(s) adds up to 100 wt. % of total solids.

In another embodiment of the aforementioned inventive compositions, when component c) is not present, component b), the alkynyloxy substituted spin on carbon polymer additive, is present in as a wt. % of total solid from about 1 wt. % to about 60 wt. %. In another aspect of this embodiment component b) is present from about 5 wt. % to about 60 wt. %. In another aspect of this embodiment component b) is present from about 10 wt. % to about 60 wt. %. %. In another aspect of this embodiment component b) is present from about 15 wt. % to about 55 wt. %. %. In another aspect of this embodiment component b) is present from about 20 wt. % to about 55 wt. %. %. In another aspect of this embodiment component b) is present from about 25 wt. % to about 55 wt. %. In another aspect of this embodiment component b) is present from about 30 wt. % to about 55 wt. %. In another aspect of this embodiment component b) is present from about 35 wt. % to about 55 wt. %. In another aspect of this embodiment component b) is present from about 40 wt. % to about 55 wt. %. In another aspect of this embodiment component b) is present from about 45 wt. % to about 55 wt. %. In another aspect of this embodiment component b) is present from about 50 wt. %. In all aspects of these embodiments when component c) is absent the total wt. % of solids components a) and c) adds up to 100 wt. %, if no other additional solid components are present. If an additional solid component is present the total wt. % solid of all solids component a), component b) and any other additional component(s) adds up to 100 wt. % of total solids.

Specific non-limiting examples of the inventive formulation are as follows:

Non-limiting compositions which are comprised of a component b) whose polymer comprises a repeat unit of structure (XIb) a component a) which is comprised of metal compounds selected from the group consisting of metal compounds having structures (Il1), (Il2), (Il3), (Il4), and mixtures of these, wherein n is 6 to 20. In one specific embodiment this formulation contains about a 50:50 ratio of component a) and component b). In another embodiment it contains a ratio of about 80:20:40 of component a): optional component c): component b) wherein optional component c) is triethanol amine.

Non-limiting compositions which are comprised of a component b) whose polymer comprises a repeat unit of structure (XId) a component a) which is comprised of metal compounds selected from the group consisting of metal compounds having structures (Il1), (Il2), (Il3), (Il4), and mixtures of these, wherein n is 6 to 20. In one specific embodiment this formulation contains about a 50:50 ratio of component a) and component b). In another embodiment it contains a ratio of about 80:20:40 of component a): optional component c): component b) wherein optional component c) is triethanol amine.

Non-limiting compositions which are comprised of a component b) whose polymer comprises a repeat unit of structure (XIIc) a component a) which is comprised of metal compounds selected from the group consisting of metal compounds having structures (Il1), (Il2), (Il3), (Il4), and mixtures of these, wherein n is 6 to 20. In one specific embodiment this formulation contains about a 50:50 ratio of component a) and component b). In another embodiment it contains a ratio of about 80:20:40 of component a): optional component c): component b) wherein optional component c) is triethanol amine.

Non-limiting compositions which are comprised of a component b) whose polymer comprises a repeat unit of structure (XIIIc) a component a) which is comprised of metal compounds selected from the group consisting of metal compounds having structures (Il1), (Il2), (Il3), (Il4), and mixtures of these, wherein n is 6 to 20. In one specific embodiment this formulation contains about a 50:50 ratio of component a) and component b). In another embodiment it contains a ratio of about 80:20:40 of component a): optional component c): component b) wherein optional component c) is triethanol amine.

Non-limiting compositions which are comprised of a component b) whose polymer comprises a repeat unit of structure units having structures (XIIIe), (XIIIf), (XIIIg), (XIIIh), (XIIIi), and mixtures thereof, wherein $R_{16}$ and $R_{17}$ are methyl, and $Ra_1$, $Ra_2$ and $Ra_3$ are hydrogen; and a component a) which is comprised of metal compounds selected from the group consisting of metal compounds having structures (Il1), (Il2), (Il3), (Il4), and mixtures of these, wherein n is 6 to 20. In one specific embodiment this formulation contains about a 50:50 ratio of component a) and component b). In another embodiment it contains a ratio of about 80:20:40 of component a): optional component c): component b) wherein optional component c) is triethanol amine.

Non-limiting compositions which are comprised of a component b) of a component b) whose polymer comprises a repeat unit of structure units having structures (XIV), (XVa), and mixtures thereof, wherein $Ra_1$, $Ra_2$ and $Ra_3$ are hydrogen; and a component a) which is comprised of metal compounds selected from the group consisting of metal compounds having structures (Il1), (Il2), (Il3), (Il4), and mixtures of these, wherein n is 6 to 20. In one specific embodiment this formulation contains about a 50:50 ratio of component a) and component b). In another embodiment it contains a ratio of about 80:20:40 of component a): optional component c): component b) wherein optional component c) is triethanol amine.

Other similar non-limiting examples of the inventive composition are ones corresponding to the above described non-limiting examples, but in which the cited component a) is replaced individually by another metal complex a) selected from the group consisting of a component a) is which is comprised of a mixture of metal complexes having structure (Id1), structure (Id2), structure (Id3), structure (Id4), structure (Id5), or structure (Id6), wherein, $R_{11a}$ is a silyl moiety having structure (IVc), n independently is an integer from 1 to 20, and p independently is an integer from 1 to 500;

a component a) is which is comprised of a mixture of metal complexes having structure (If1), structure (If2), structure (If3), structure (If4), wherein, n is 1 to 20. In another embodiment of this aspect of the invention n is 6 to 20. In another embodiment of this aspect of the invention n is 1. In yet another embodiment, when n is 2 to 20;

a component a) is which is comprised of a mixture of metal complexes having structure (Ih1), structure (Ih2), structure (Ih3), structure (Ih4), wherein, n is 1 to 20. In another embodiment of this aspect of the invention n is 6 to 20. In another embodiment of this aspect of the invention n is 1. In yet another embodiment, when n is 2 to 20; and a component a) is which is comprised of a mixture of metal complexes having structure (Ij1), structure (Ij2), structure (Ij3), structure (Ij4), wherein, n is 1 to 20. In another embodiment of this aspect of the invention n is 6 to 20. In another embodiment of this aspect of the invention n is 1. In yet another embodiment, when n is 2 to 20.

Optional Component c), the Polyol

In one embodiment of the aforementioned inventive compositions, component c), the polyol, is present.

In another embodiment of the aforementioned inventive compositions, in component c), in the polyol additive having the structure (VI), this embodiment is one wherein, X is C.

In another embodiment of the aforementioned inventive compositions, in component c), in the polyol additive having the structure (VI), this embodiment is one wherein, X is N.

In another embodiment of the aforementioned inventive compositions, in component c), in the polyol additive having the structure (VI), this embodiment is one wherein, Y is a direct bond, methylene, ethylene or a moiety having the structure (VII).

In another embodiment of the aforementioned inventive compositions, in component c), in the polyol additive having the structure (VI), this embodiment this embodiment is one wherein, r is 2, 3 or 4.

In another embodiment of the aforementioned inventive compositions, in component c), in the polyol additive having the structure (VI), this embodiment is one wherein, $R_{14}$ is hydrogen.

In another embodiment of the aforementioned inventive compositions, in component c), in the polyol additive having the structure (VI), this embodiment is one wherein, q is 0, 1 or 2.

In another embodiment of the aforementioned inventive compositions, in component c), in the polyol additive having the structure (VI), this embodiment is one wherein, s is 0 or 2.

In another embodiment of the aforementioned inventive compositions, in component c), in the polyol additive having the structure (VI), this embodiment is one wherein, s is 0.

In another embodiment of the aforementioned inventive compositions, in component c), in the polyol additive having the structure (VI), this embodiment is one wherein, s is 2.

In another embodiment of the aforementioned inventive compositions, in component c), in the polyol additive having the structure (VI), this embodiment is one wherein, s is 1.

In another embodiment of the aforementioned inventive compositions, in component c), in the polyol additive having the structure (VI), when X is N, Y is a $C_1$ to $C_8$ alkylene, or, when X is C, Y is selected from the group consisting of a direct valence bond, $C_1$ to $C_8$ alkylene and moieties having the structure (VII), this embodiment is one wherein, $R_{15}$ is ethylene or propylene.

In another embodiment of the aforementioned inventive compositions, in component c), in the polyol additive having the structure (VI), when X is N, Y is a $C_1$ to $C_8$ alkylene, or, when X is C, Y is selected from the group consisting of a direct valence bond, a $C_1$ to $C_8$ alkylene and moieties having the structure (VII), this embodiment is one wherein, t is 1.

In another embodiment of the aforementioned inventive compositions, in component c), this embodiment is one wherein, in the polyol additive is selected from the group consisting of tetraethylene glycol, triethylene glycol, glycerol, triethanolamine, diethanolamine, neopentyl glycol, glycerol propoxylate, and pentaerythritol ethoxylate.

In another embodiment of the aforementioned inventive compositions, when component c), is present this embodiment is one wherein, in the polyol additive is selected from the group consisting of:

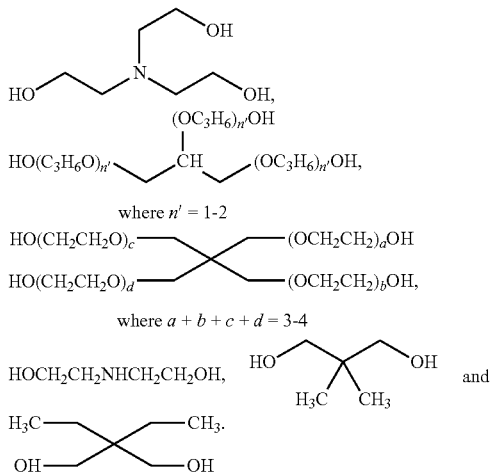

where $n' = 1$-$2$ where $a + b + c + d = 3$-$4$

In another embodiment of the aforementioned inventive composition, when component c) is present it is selected from the group consisting of

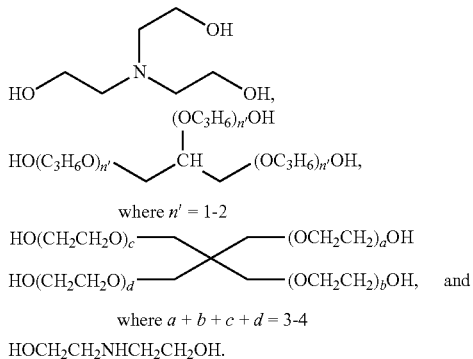

where $n' = 1$-$2$ where $a + b + c + d = 3$-$4$ $HOCH_2CH_2NHCH_2CH_2OH$.

In another embodiment of the aforementioned inventive composition, component c) is selected from

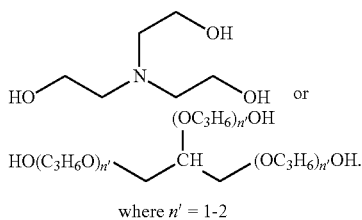

where $n' = 1$-$2$

In another embodiment of the aforementioned inventive composition, component c) is selected from

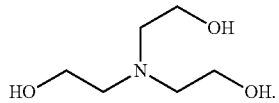

In another embodiment of the aforementioned inventive composition, when component c), the polyol, is present, the wt. % of this component as a wt. % of all solid components is about 1 wt. % to about 30 wt. %. In another aspect of this embodiment the wt. % total solid component is from about 5 wt. % to about 30 wt. %. In another aspect of this embodiment this wt. % of component c) as wt. % of total solid components is from about 10 wt. % to about 25 wt. %. In another aspect of this embodiment this wt. % of component c) as wt. % of total solid components, is from about 10 wt. % to about 20 wt. %. In another aspect of this embodiment this wt. % of component c) as wt. % of total solid components, is from about 12 wt. % to about 15 wt. %. In all the above described embodiment where component c) is present the total combined solid content, adds up to 100 wt. % of total solids, if no additional component is present. If an additional component is present, the total wt. % solid of all solids component a), component b)., component c) and any of these additional component(s) add up to 100 wt. % of total solids.

In another embodiment of the aforementioned inventive compositions, in component c), this embodiment is one wherein, in the polyol additive has a molecular weight of less than 500.

In another embodiment of the aforementioned inventive compositions, in component c), this embodiment is one wherein, the polyol additive has a molecular weight of less than 300.

In another embodiment of the aforementioned inventive compositions, in component c), the polyol additive has a boiling point of at least 200° C.

In another embodiment of the aforementioned inventive compositions, the polyol additive has a boiling point of at least 250° C.

In another embodiment of the aforementioned inventive compositions, the polyol additive has a boiling point of at least 400° C.

In another embodiment of the aforementioned inventive compositions, component b). the alkynyloxy substituted spin on carbon polymer, is selected from the group consisting of polyethers, polyesters, polysulfones and polyethersulfones.

Component d), the Solvent

The solvent usually is a solvent or solvent mixture containing alcohol, ester, ketone, lactone and/or diketones. Additional component (<1%) such as surfactant can be added to improve coating quality. The composition of the baked film contains 20-70% of total oxide at the above condition In the above described novel composition the solid components may be dissolved in a solvent component f) which is an organic solvent. Examples of suitable organic solvents include, without limitation, 1-Methoxy-2-propanyl acetate (PGMEA), 1-Methoxy-2-propanol (PGME) butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3- ethoxy propanoate, methyl-3-methoxy propanoate, methyl acetoacetate, ethyl acetoacetate, diacetone alcohol, methyl pivalate, ethyl pivalate, propylene glycol monomethyl ether, propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, gamma valerolactone, propylene glycol methyl ether acetate, propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether, and anisole. These solvents may be used singly or in a mixture of two or more.

In one embodiment the solid components are dissolved in PGMEA/PGME 70:30.

In another embodiment of the aforementioned inventive compositions, component d, the solvent, is selected from the group consisting of alcohols, esters, ketones, lactones, diketones, aromatic moieties, carboxylic acids, amides and mixtures thereof. In one embodiment the solvent is cyclohexanone.

Other Optional Components

In another embodiment of the aforementioned inventive compositions, in addition to components a) b) c) and d) these compositions may further comprise at least one additional component selected from the group consisting of surfactants, levelling agents, crosslinking additives and thermally activated catalysts.

Optional Surfactants

Optional component such as surfactant can be added to improve coating quality in small amount such as level smaller than 1 wt. %.

More specifically, which have compatibility with and can be added to the novel composition disclosed and claimed herein according to need, include auxiliary resins, plasticizers, surface leveling agents and stabilizers to improve the properties of the coated composition on the surface, and the like. Surface leveling agents may include surfactants. There is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.).

In another embodiment of the aforementioned inventive compositions, is wherein, the surfactant is present in an amount that is less than 1% of the total weight of the composition.

Optional Crosslinking Agent

A crosslinking agent can be added for the purpose of improving the coating formation property of the coating to be formed, preventing intermixing with an upper layer (such as a silicon-containing interlayer and a resist), and preventing diffusion of a low-molecular-weight component into the upper layer.

Exemplified embodiments of crosslinking agents that can be used present invention include: melamine, guanamine, glycoluril, and urea compounds substituted by at least one group selected from a methylol group, an alkoxymethyl group, and an acyloxymethyl group; epoxy compounds; thioepoxy compounds; isocyanate compounds; azide compounds; and compounds having a double bond-containing group such as an alkenyl ether group. These may be used as an additive or may alternatively be introduced as a pendant group into a polymer side chain. Compounds containing a hydroxy group can also be used as a crosslinking agent.

Examples of the epoxy compounds mentioned above include tris(2,3-epoxypropyl) isocyanurate, trimethylolmethane triglycidyl ether, trimethylolpropane triglycidyl ether, and triethylolethane triglycidyl ether. Exemplified embodiments of the melamine compounds include hexamethylolmelamine, hexamethoxymethylmelamine, and any mixture of any of such compounds. Examples of the guanamine compounds include tetramethylolguanamine, tetramethoxymethylguanamine, and any mixture of any of such compounds. Examples of the glycoluril compounds include tetramethylolglycoluril, tetramethoxyglycoluril, tetramethoxymethylglycoluril, and any mixture of any of such compounds. Examples of the urea compounds include tetramethylolurea, and tetramethoxymethylurea.

Examples of the compounds containing an alkenyl ether group include ethylene glycol divinyl ether, and triethylene glycol divinyl ether.

Examples of the crosslinking agent used present invention include those represented by structure (XV).

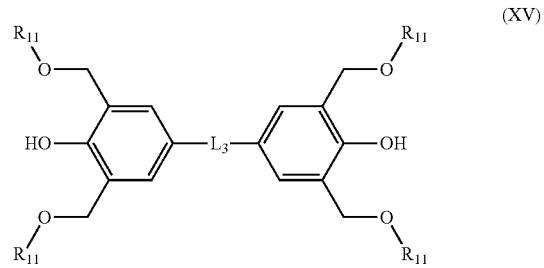

(XV)

In structure (XV), $L_3$ is a direct bond, substituted or unsubstituted $C_{1-3}$ alkyl, or substituted or unsubstituted $C_{7-16}$ aralkyl. $L_3$ is preferably a direct bond, $C_1$ alkyl, or $C_{15}$ aralkyl. The substituent of the alkyl or aralkyl is preferably hydrogen, methyl, $C_{6-11}$ aryl, or a substituent of structure (XVI) or structure (XVII), and more preferably methyl, a substituent of structure (XVI), or a substituent of structure (XVII). In a preferred aspect, $L_3$ is unsubstituted $C_{1-3}$ alkyl or unsubstituted $C_{1-3}$ aralkyl.

(XVI)

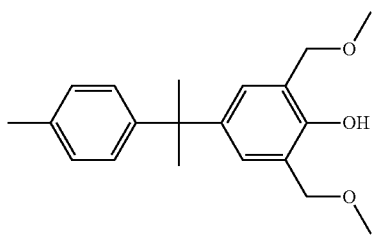

(XVII)

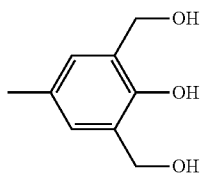

In structure (XV), $R_{11}$ is hydrogen or methyl.

The following are exemplified embodiments of the cross-linking agent represented by structure (XV). The scope of the present invention is not limited to them.

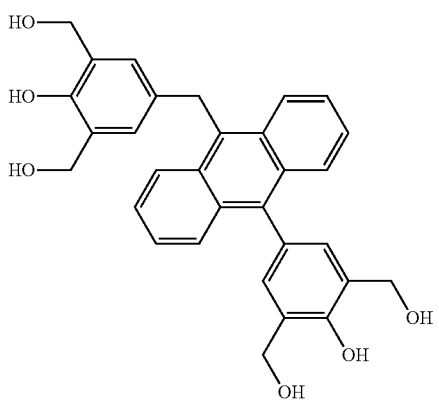

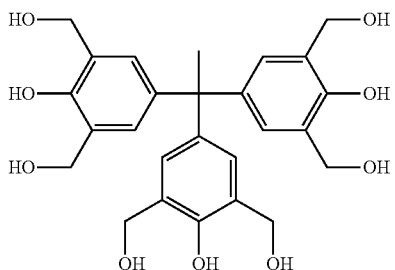

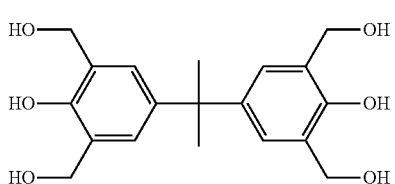

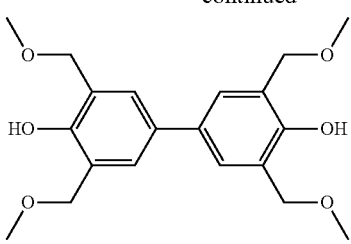

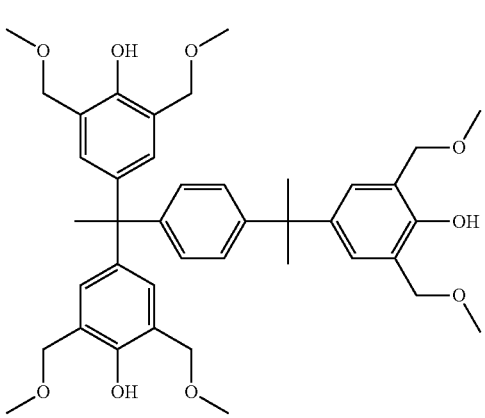

The following are exemplified embodiments of another crosslinking agent that can be contained in the planarizing coating-forming composition. The scope of the present invention is not limited to them.

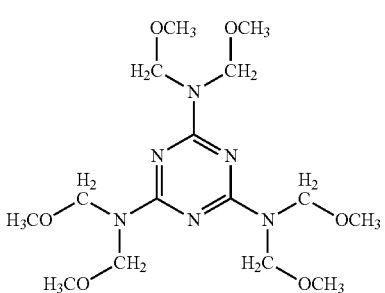

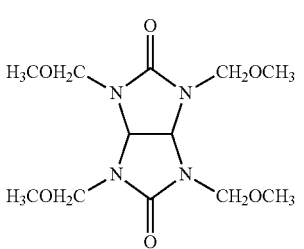

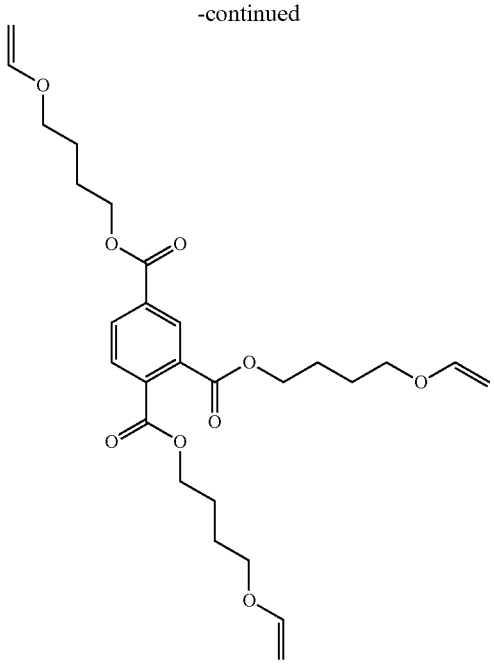

These crosslinking agents are available, for example, from Sanwa Chemical Co., Ltd., Honshu Chemical Industry Co., Ltd., Asahi Yukizai Corporation, and Nippon Carbide Industries Co., Inc.

In one embodiment of the present invention, the amount of the crosslinking agent is preferably 0-300,000 ppm comparing to mass of total composition. If the composition comprises a cross linking agent, the amount is preferably 0.1-100,000 ppm, more preferably 1-50,000 ppm, further preferably 10-10,000 ppm.

Also, without adding an effective dose of a crosslinking agent, this invention composition can exhibit its effect. In this case, the crosslinking agent amount comparing to mass of total composition is preferably 0-20,000 ppm, more preferably 0-5,000 ppm, further preferably 0-1,000 ppm, and further preferably 0-100 ppm.

In an embodiment of the present invention, the amount of the crosslinking agent is preferably 1-200% (more preferably 5-100%, further preferably 10-40%, and furthermore preferably 15-25%) by mass relative to the mass of the invented ethynyl derived composite (or the total mass of the two or more invented ethynyl derived composites) comprised in the composition. The incorporation of the crosslinking agent in the composition is expected to produce the following effect: the crosslinking agent binds to the invented ethynyl derived composite during coating formation to control the intramolecular torsion of the whole composite of the crosslinking agent and the compound and increase the planarity of the composite.

Given the ease of process control, the present invention may be implemented as an embodiment in which the invented ethynyl derived composite is formed into a coating by itself without addition of the crosslinking agent (this means that the amount of the crosslinking agent is 0% by mass relative to the mass of the invented ethynyl derived composite).

Optional Acid Generator

One embodiment of a composition according to the present invention may further comprise an acid generator. The amount of the acid generator contained in the composition is preferably 0.1-10% by mass, more preferably 1-7% by mass, and further preferably 1-5% by mass relative to the mass of the invented ethynyl derived composite (or the total mass of the two or more invented ethynyl derived composites).

The acid generator can be a thermal acid generator capable of generating a strong acid when heated. The thermal acid generator (TAG) used in an embodiment of the present invention can comprise one or more thermal acid generators which, when heated, generate an acid capable of reacting with the invented ethynyl derived composite and capable of promoting crosslinking of the ethynyl derived composite. The acid is more preferably a strong acid such as sulfonic acid. The thermal acid generator is preferably activated at a temperature above 80 degrees. Examples of the thermal acid generator include: metal-free sulfonium salts such as triarylsulfonium, dialkylarylsulfonium, and diarylalkylsulfonium salts of strong non-nucleophilic acids; metal-free iodonium salts such as alkylaryliodonium and diaryliodonium salts of strong non-nucleophilic acids; and ammonium, alkylammonium, dialkylammonium, trialkylammonium, and tetraalkylammonium salts of strong non-nucleophilic acids. Covalent thermal acid generators are also considered useful as additives, and examples include 2-nitrobenzyl esters of alkylsulfonic or arylsulfonic acids and other sulfonic acid esters which are thermally decomposed to give free sulfonic acid. Examples thereof include diaryliodonium perfluoroalkyl, and sulfonates. Examples of labile esters include: nitrobenzyl tosylates such as 2-nitrobenzyl tosylate, 2,4-dinitrobenzyl tosylate, 2,6-dinitrobenzyl tosylate, and 4-nitrobenzyl tosylate; benzenesulfonates such as 2-trifluoromethyl-6-nitrobenzyl 4-chlorobenzenesulfonate and 2-trifluoromethyl-6-nitrobenzyl 4-nitrobenzenesulfonate; phenolic sulfonate esters such as phenyl 4-methoxybenzenesulfonate; quaternary ammonium tris(fluoroalkylsulfonyl)methides; quaternary alkylammonium bis(fluoroalkylsulfonyl)imides; and alkylammonium salts of organic acids such as triethylammonium salt of 10-camphorsulfonic acid. A variety of amine salts of aromatic (anthracene, naphthalene, or benzene derivative) sulfonic acids, including those disclosed in U.S. Pat. Nos. 3,474,054B, 4,200,729B, 4,251,665B, and 5,187,019B, can be used as the TAG.

The following are exemplified embodiments of the thermal acid generator that can be contained in the composition. The scope of the present invention is not limited to them.

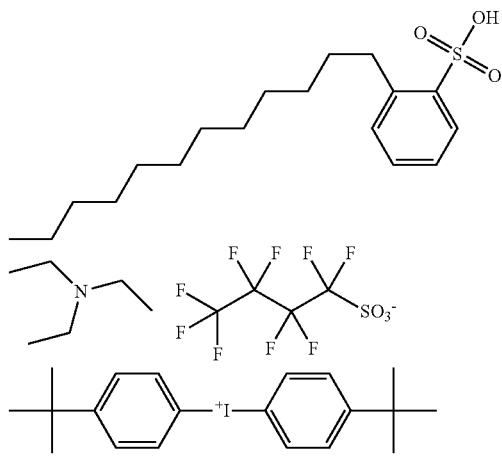

-continued

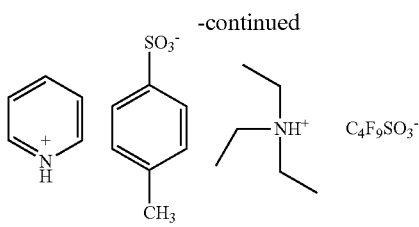

Given the ease of process control, the present invention may be implemented as an embodiment in which the acid generator is not added to the composition (this means that the amount of the acid generator is 0% by mass relative to the mass of the invented ethynyl derived composite).

In one embodiment of the present invention, the amount of the acid generator is preferably 0-50,000 ppm, more preferably 0-5,000 ppm, further preferably 0-1,000 ppm, furthermore preferably 0-100 ppm comparing to mass of total composition.

Optional Radical Generator

A radical generator can be added to the composition to initiate polymerization. The radical generator generates radicals when heated, and examples thereof include azo compounds and peroxides. Exemplified embodiments of the radical generator include: organic peroxides, including hydroperoxides such as diisopropylbenzene hydroperoxide, cumene hydroperoxide, and t-butyl hydroperoxide, dialkyl peroxides such as α,α-bis(t-butylperoxy-m-isopropyl)benzene, dicumyl peroxide, 2,5-dimethyl-2,5-bis(t-butylperoxy)hexane, t-butyl cumyl peroxide, di-t-butyl peroxide, 2,5-dimethyl-2,5-bis(t-butylperoxy)hexyne-3, and t-butyl peroxy-2-ethylhexanoate, ketone peroxides, peroxyketals such as n-butyl 4,4-di(t-butylperoxy)valerate, diacyl peroxides, peroxydicarbonates, and peroxyesters; and azo compounds such as 2,2'-azobisisobutyronitrile, 1,1'-(cyclohexane-1-1-carbonitrile), 2,2'-azobis(2-cyclopropylpropionitrile), and 2,2'-azobis(2,4-dimethylvaleronitrile). These thermal radical generators may be used alone or in combination with one another and are preferably used alone. These known radical generators can be used in the composition, and these radical generators are available, for example, from NOF.

Compositions: Content of Total Solid Components in Solvent

In one embodiment the total wt. % solid content of all solid components in solvent (wt/wt) for these novel composition ranges from about 1 wt. % to about 40 wt. % total solid components in this solvent. In another embodiment from about 2 wt. % to about 40 wt. %. In yet another embodiment of this aspect of the invention, from about 5 wt. % to about 35 wt. %. In yet another embodiment of this aspect of the invention, the wt. % of solid components is from about 10 wt. % to about 35 wt. %. In yet another embodiment of this aspect of the invention, from about 10 wt. % to about 35 wt. %. In still another embodiment of this aspect of the invention, the wt. % of solid components is from about 15 wt. % to about 30 wt. %. In another from about 20 wt. % to about 30 wt. %. In yet another embodiment of this aspect of the invention, the wt. % of solid components is about 25 wt. %.

Method of Using Composition

Process for Filling Voids in Substrate Having Topographical Features.

One aspect of this invention is a process of manufacturing an electronic device by forming a patterned high K material produced by filling voids such a Vias in a patterned substrate, by a coating process with any of the above described novel compositions. The patterned substrate may be a patterned semiconductor (Silicon, germanium and the like), a patterned spin on carbon, or a patterned resist. The resultant patterned material, apart from its utility as a high K material, may alternatively be used in the manufacturing of electronic devices, in the role of a hard mask. This patterned hard mask, by virtue of the refractory nature of the content of metal compounds in the inventive composition which imparts high etch resistance to various plasmas and allows a pattern to be etched and transferred into the substrate.

The novel compositions may be applied to a substrate (unpatterned or patterned substrate) to form a coating film as follows:

a) Applying any one of the above described inventive compositions, onto a substrate to form a coating film; and b) Heating the coating film at a temperature between 150° C. and 400° C. and for a time from 30 to 240 seconds, forming a cured coating film.

In another aspect of this embodiment, the coating film is heated for a time of up to 120 seconds. In another aspect, the inventive hard mask composition is applied onto the substrate by a spin-on coating process. In yet another aspect this composition is applied onto the substrate in step a) by a one-step spin-on coating process to form the coating film.

In one embodiment of this process, pertaining to the inventive composition's utility as a void filling material, the substrate coated with the composition to form the coated film is a patterned substrate comprising topographical features. In this instance, said coating film is coated with a thickness sufficient such that it and the cured coating film formed in step b) overlays said topographical features, and further wherein, after baking the film in step b), the process further comprises an additional step, step c) as follows:

c) Removing the portion of said cured coating film overlaying the top of the topography using a chemical stripper or a fluorinated plasma etch, thereby producing filled topographical features wherein the cured coating film is flush with the top of said topographical features.

In another embodiment of this void filling aspect of the inventive process, said topographical features are in a patterned spin on carbon layer overlying a silicon substrate. In another embodiment of this process, said topographical features are in a patterned semiconductor such as silicon, germanium and the like. In yet another, said topographical features are in a patterned resist overlaying said semiconductor substrate. In yet another embodiment of any of these void filling inventive processes, the said topographical features filled are Vias. In yet another embodiment of any of these void filling processes the said topographical features are Contact Holes, Vias or a mixture of both.

In still another embodiment, of the any of these processes, when the topographical features are a patterned photoresist or a patterned organic high carbon coating, overlaying a semiconductor substrate (e.g. Silicon, Germanium and the like), the processes further comprise, after step c), an additional step, step d), as follows:

d) Removing said patterned organic high carbon coating or said patterned photoresist with an oxygen plasma, thereby forming a negative tone image of said patterned photoresist, or said patterned organic high carbon coating, wherein, the remaining said filled topographic features, after removal of said patterned photoresist or said patterned organic high carbon coating, forms a pattern comprised of metal oxide. In one aspect of this invention, this pattern comprised of metal oxide has utility as either a patterned high K material, useful in producing microelectronic components incorporating such a high K material. Alternatively, in another aspect of this invention, the pattern comprised of a metal oxide, may be used as a patterned hard mask for pattern transfer into the underlying semiconductor substrate using an approximate plasma such as a fluorinated plasma and the like.

In the inventive process in which the remaining patterned novel composition after step d) is not used as a patterned high K material, but as a patterned hard mask, the above inventive process comprises an additional step, after step d), step e) as follows:

e) Using said pattern comprised of metal oxide as patterned hard mask, etch barrier, and etching into the semiconductor substrate with a fluorinated plasma.

In still another embodiment of the any of these above processes (a.k.a. either to produce a patterned high K material or a patterned hard mask, said topographical features have an aspect ratio of 1:1 to 10:1. In still another embodiment of the any of these processes said topographical features have an aspect ratio of 1 to 10 and may be selected from ones that range in critical dimension (CD) from 5 nm to 100 nm, preferably from 10 nm to 100 nm.

In still another embodiment of any above described processes in step b) baking the film at a temperature from 150° C. to 400° C., preferably from 250° C. to 400° C., is done in two baking steps b1) and b2) where baking step b1) is done from 250° C. to 275° C. and baking step b2) is done from 300° C. to 400° C., preferably from 350° C. to 400° C. In another aspect of this embodiment, said baking step b1) is 200° C. to 250° C. and the baking step b2) is 350° C. to 400° C. In another embodiment of this aspect, said baking step b1) is 250° C. and the baking step b2) is 400° C. In yet another aspect, said baking step b1) is done for 30 to 120 seconds and said baking step b2) is done for 60 to 120 seconds. In still another aspect, said baking step b1 is done for 60 seconds to 120 seconds and said baking step b2) is done for 90 second to 120 seconds. In yet another aspect, said baking step b1) is done for 60 seconds to 120 seconds. In still another aspect said baking step b2) is done for 90 seconds to 120 seconds. In yet another aspect, said baking step b1) is done for 60 seconds. In still another aspect said baking step b2) is done for 90 seconds.

In still another aspect, said baking step b1) is done for 1 minute and said baking step b2) is done for 120 seconds. In yet another aspect, said baking step b1) is done for 60 seconds. In still another aspect said baking step b2) is done for 120 seconds.

Process for Using the Inventive Compositions on a Silicon Substrate to Produce a Patterned Hard Mask Another aspect of this invention is a process for producing a patterned hard mask on an unpatterned substrate, preferably on a silicon substrate, using any one of the above described inventive hard mask compositions, and using this pattern to create a patterned substrate, wherein, this process comprises steps a3) to h3) as follows:

a3) Applying a composition as described above onto said substrate to form a coating film,
b3) Baking the coating filmat a temperature from 150° C. to 400° C. to form a hard mask film
c3) Coating a bottom antireflective coating on top of said hard mask film,
d3) Coating a photoresist on top of said antireflective coating,
e3) Patterning the photoresist resist forming a photoresist pattern,
f3) Etching through said bottom antireflective coating not protected by said photoresist pattern down to the hard mask coating with a fluorinated plasma,
g3) Etching through said hard mask film not protected by the bottom antireflective coating and said photoresist pattern down to the silicon substrate with a chlorine plasma producing a patterned hard mask film,
h3) Etching with a fluorinated plasma into the silicon substrate in those area not protected by said patterned hard mask film producing topographical features into the silicon features.

In another aspect of this process in step in b3) the film is baked at a temperature from 150° C. to 400° C. is done in two baking steps b1') and b2') where baking step b1') is done from 150° C. to 250° C. and baking step b2') is done from 300° C. to 400° C. In another aspect of this embodiment, said baking step b1') is 200° C. to 250° C. and the baking step b2') is 350° C. to 400° C. In another aspect of this embodiment, said baking step b1') is 250° C. and the baking step b2') is 400° C. In yet another aspect said baking step b1') is done for 30 seconds to 120 seconds and said baking step b2') is done for 60 seconds to 120 seconds.

In still another aspect, the baking step b1') is done for 60 to 120 seconds, preferably from 90 to 120 seconds. In yet another aspect said baking step b2') is done for 90 seconds to 120 seconds.

In still another, said baking step b1') is done for 60 seconds and said baking step b2') is done for 120 seconds.

In one embodiment the cured films of inventive composition cured as described above contains about 15 wt. % to about 75 wt. % total metal oxide. In another aspect of this embodiment the cured films contain from about 20 wt. % to about-70 wt. % metal oxide.

As discussed above, patterned cured inventive composition films, used as patterned hard masks, are produced in two manners, as follows: 1) Through a filling of topographical features comprised of patterned photoresist or patterned organic high carbon coating on as semiconductor substrate; or, 2) through a photoresist patterning process of a cured film of the inventive composition on an unpatterned semiconductor substrate. In either case, after etch transfer with a fluorine plasma, some of the patterned hard mask, after this transfer. In this instance, any remaining hard mask pattern is the strippable in chemical solutions.

Another aspect of this invention are, novel, spin on high carbon, polymers which comprise a repeat unit of structure (XII), wherein fAr is a fused aromatic ring, $R_{16}$ and $R_{17}$ are each independently hydrogen or a $C_1$ to $C_4$ alkyl. In another aspect of this embodiment, fAr is a group comprising 2-8 fused aromatic rings. In yet another aspect fAr is anthracene. In yet another aspect said repeat unit has structure (XIIa). In still another aspect it has structure (XIIb). In yet another aspect is has structure (XIIc). In still another aspect it has structure (XIIb.

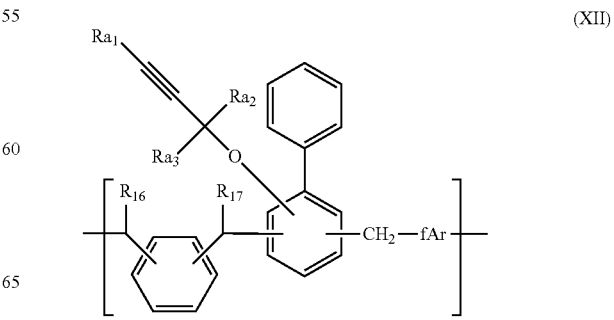

(XII)

(XIIa)

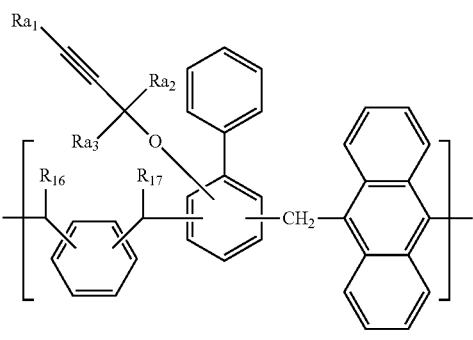

(XIIb)

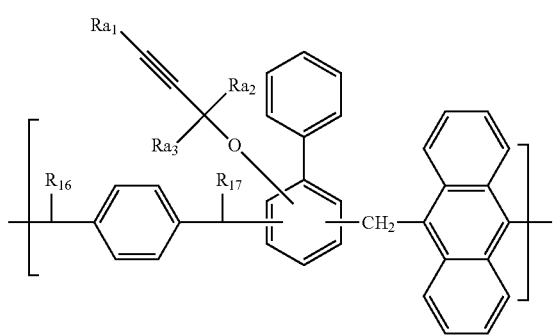

(XIIc)

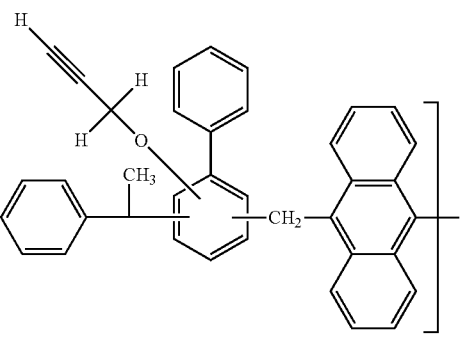

Another aspect of this invention are novel, spin on high carbon polymers comprising repeat units selected from the group consisting of repeat units having structures (XIII), (XIIIa), (XIIIb), (XIIIc), and (XIIId), and mixtures thereof. Another aspect of this embodiment are said novel spin on high carbon polymers comprising repeat units selected from the XIIIe), (XIIIf), (XIIIg), (XIIIh), and (XIIIi), and mixtures thereof. In another aspect of this embodiment, $R_{16}$ and $R_{17}$ are a $C_1$ to $C_6$ alkyl. In still another embodiment $R_{16}$ and $R_{17}$ are an $C_1$ to $C_4$ alkyl. In still another embodiment of this aspect $R_{16}$ and $R_{17}$ are a hydrogen. In yet another embodiment, $R_{16}$ and $R_{17}$ are methyl. In yet another embodiment $Ra_1$, $Ra_2$ and $Ra3$ are hydrogen.

(XIII)

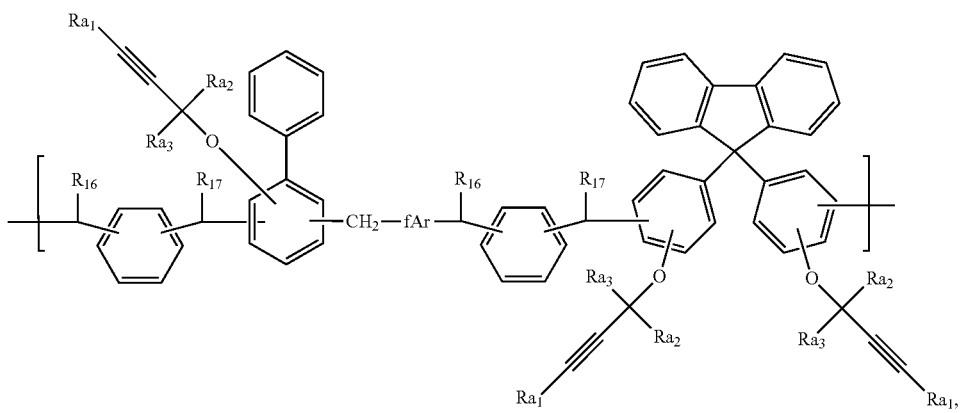

(XIIIa)

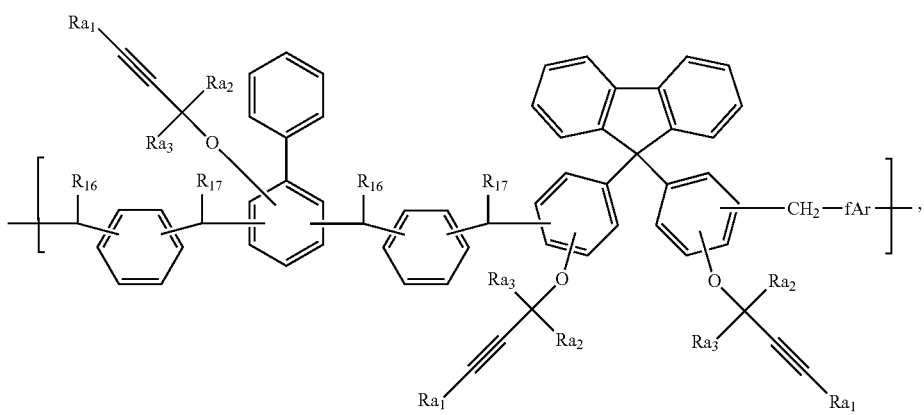

-continued
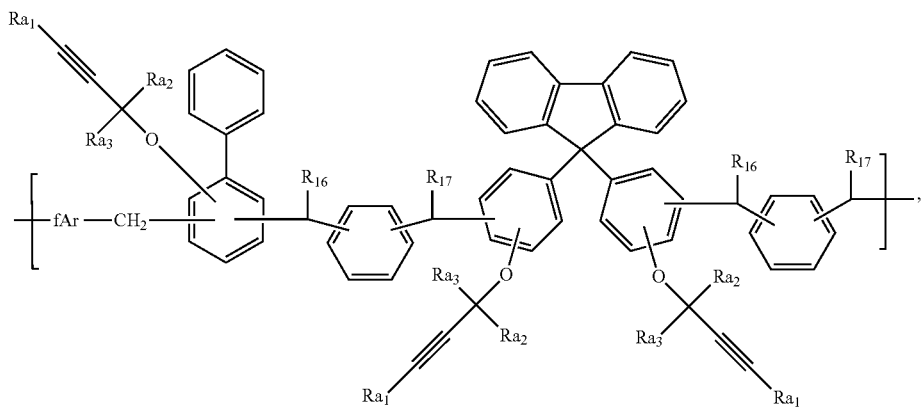
(XIIIb)
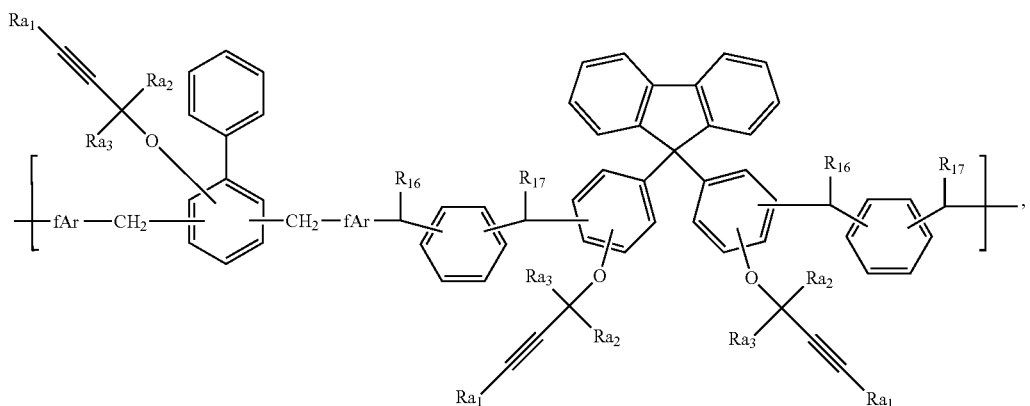
(XIIIc)
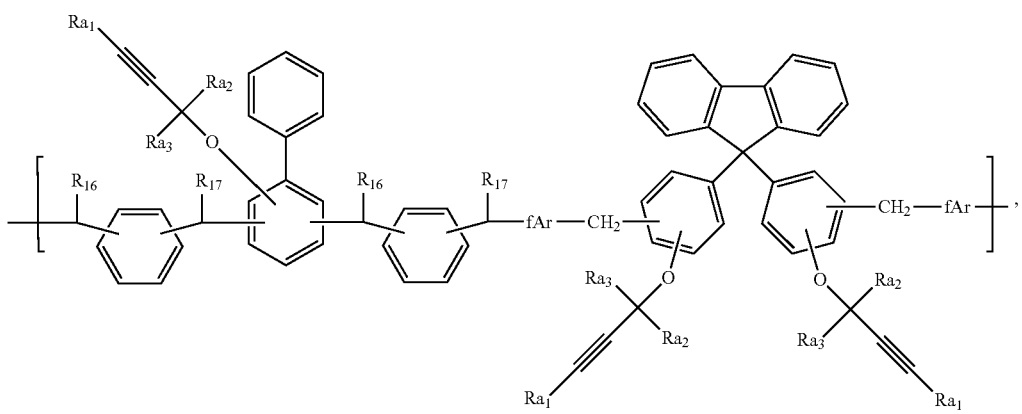
(XIIId)
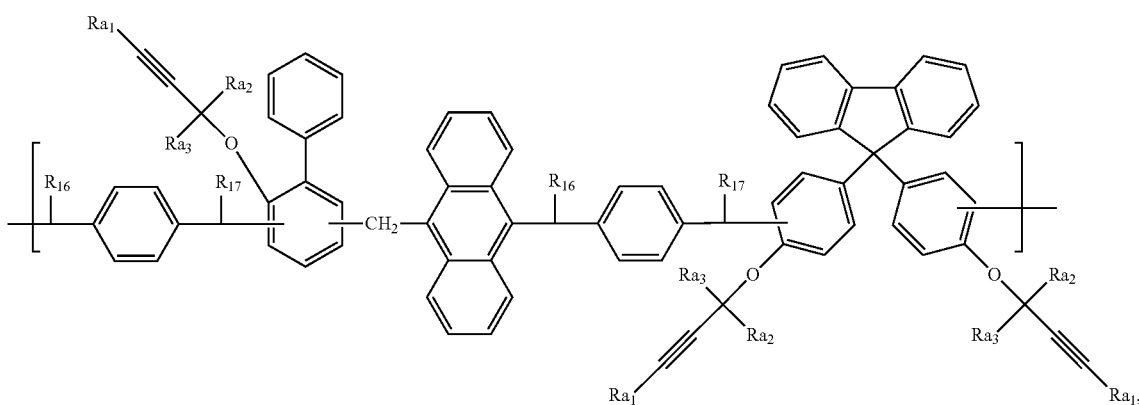
(XIIIe)

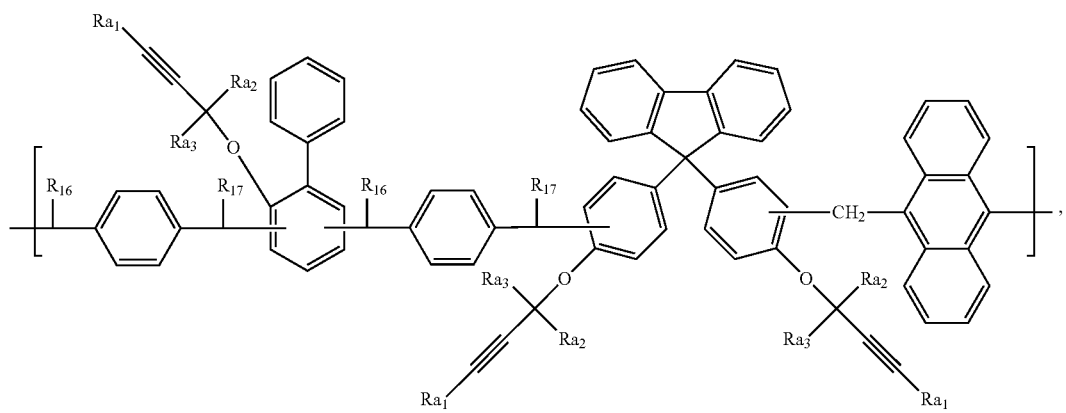
(XIIIf)
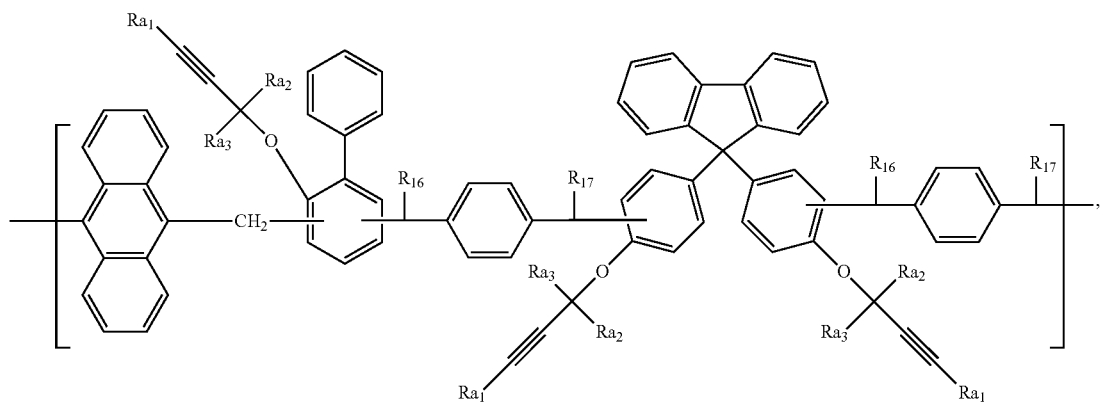
(XIIIg)
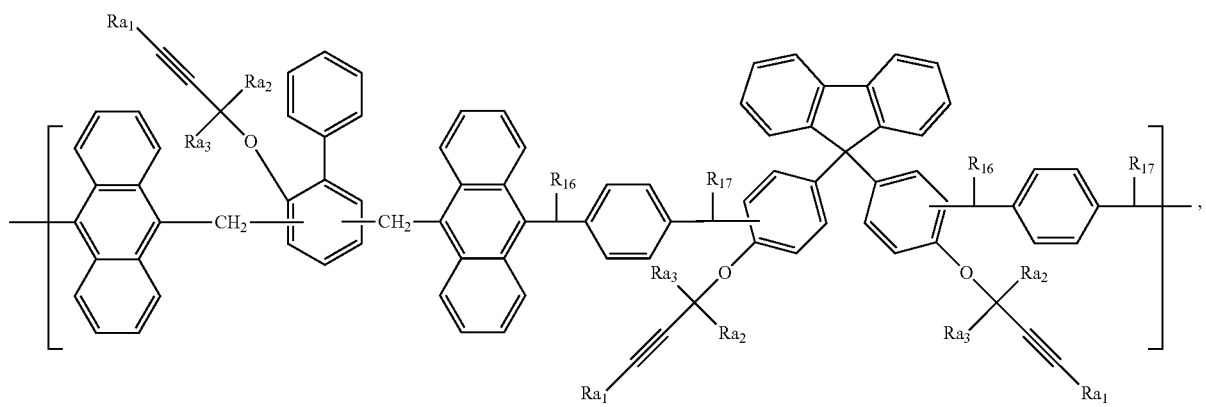
(XIIIh)

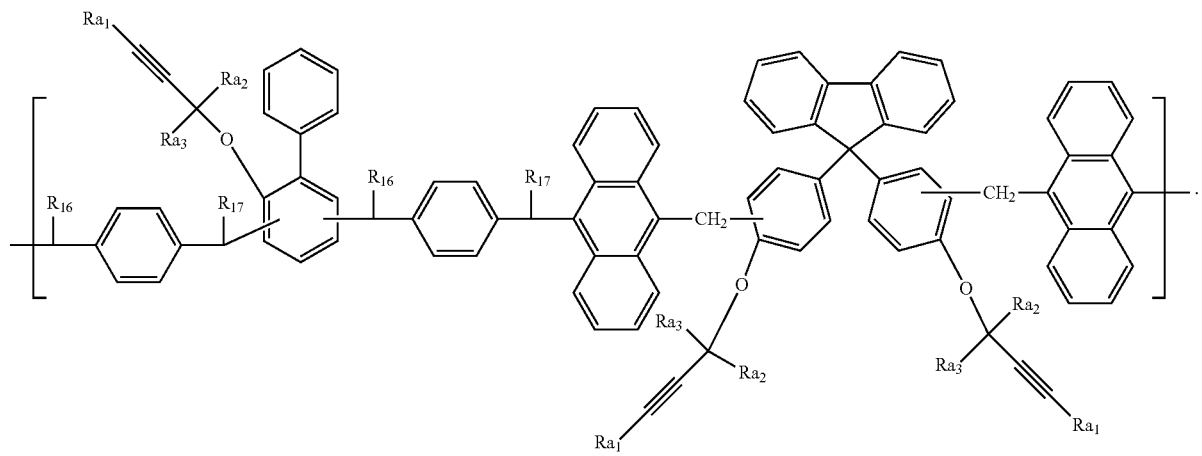
(XIIIi)

Another aspect of this invention is a novel spin on high carbon polymer comprising repeat units having structures (XIV). In another aspect of this embodiment it comprises repeat units selected from the group consisting of repeat units having structures (XIVa). In another embodiment, $Ra_1$, $Ra_2$ and $Ra_3$ are hydrogen. Similarly, in these embodiments. optional repeat units may be present in which the alkynyloxy groups in these repeat units, are replaced by a hydroxy group in the molar ratios as described above. Additionally, in other optional repeat units, the alkynyloxy group in these repeat units be replaced with a hydrogen, an aryl, or a $C_1$ to $C_6$ alkyl group, such optional repeat units may be present up to about 20 mole % of total moieties in component b), in another aspect these are present up to about 10 mole %, in yet another aspect us to 5 mole %, in still another aspect up to 1 mole %.

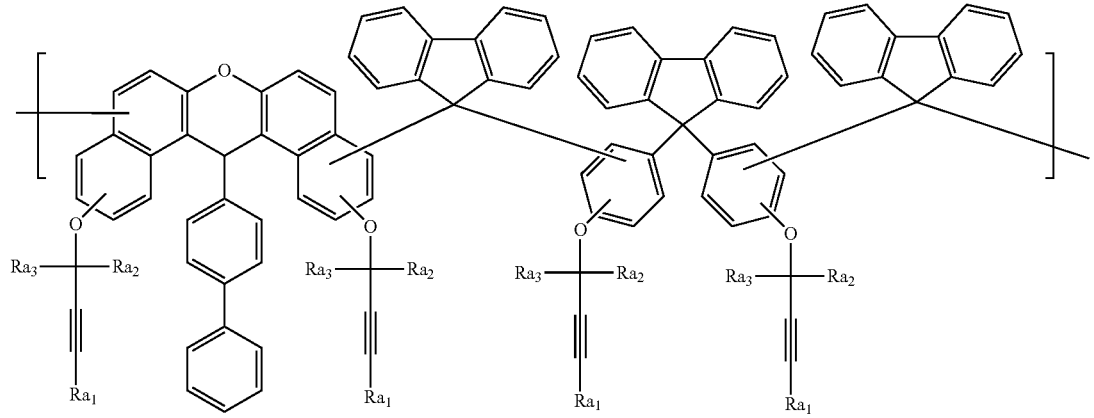
(XIV)

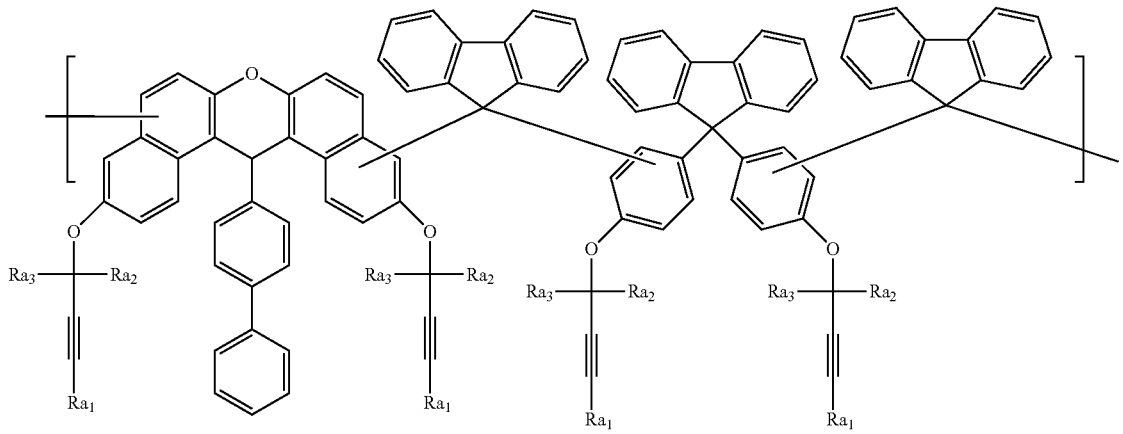

(XIVa)

Another aspect of this invention is a novel spin on high carbon polymer comprising repeat units having structures (XIc). In another aspect of this embodiment, said spin on high carbon polymer comprises a repeat unit having structure (XIb). Similarly, in these embodiments of component b), optional repeat units may be present in which the alkynyloxy groups in these repeat units, are replaced by a hydroxy group in the molar ratios as described above. Additionally, in other optional repeat units, the alkynyloxy group in these repeat units be replaced with a hydrogen, an aryl, or a $C_1$ to $C_6$ alkyl group, such optional repeat units may be present up to about 20 mole % of total moieties in component b), in another aspect these are present up to about 10 mole %, in yet another aspect us to 5 mole %, in still another aspect up to 1 mole %.

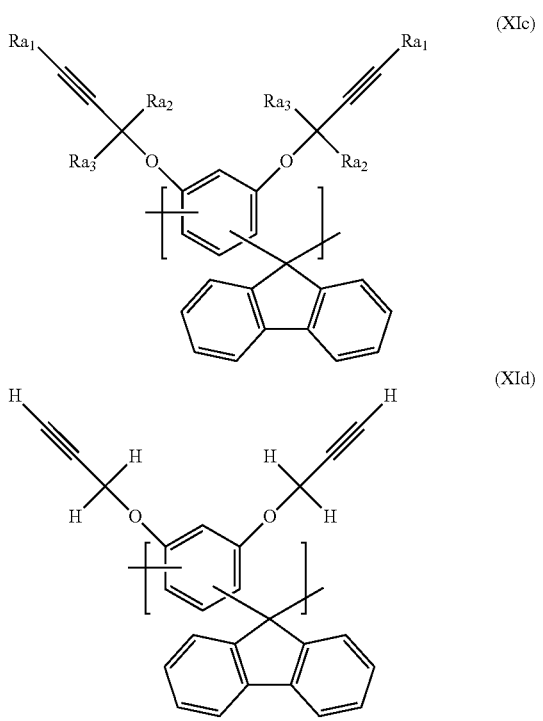

(XIc)

(XId)

Another aspect of this invention is the use of the composition or of the spin on high carbon polymer as described above for forming a coating film on a substrate, preferably in the manufacture of an electronic device.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way. The term "part(s)" as used in the following description refers to part(s) by mass, unless otherwise stated.

The molecular weight of the polymers was measured on a Gel Permeation Chromatograph using a Water 2695 Alliance Separation Module, or equivalent equipped with a Waters Dual Wavelength UV Detector, Model 2487, or equivalent and a Waters Differential Refractometer, Model 2414, Detector equivalent, a Shodex Columns set as follows: one Shodex GPC KF-801 ($1.5 \times 10^3$) column, Two Shodex GPC KF-802 ($5 \times 10^3$) columns and one Shodex GPC KF-804 ($4 \times 10^5$) column. The mobile phase was UV stabilized THF HPLC grade and the molecular weight standard was as set of polystyrene standards supplied by American Standards Corporation and Millipore Corporation or equivalent.

AZ®ArF Thinner (ArF thinner) (a.k.a. 70/30 PGMEA/PGME) was obtained from EMD Performance Materials Corp. (70, Meister Ave., Somerville, NJ). Ti(IV), Butoxide Polymer (BTP), Pentaerythritol ethoxylate (3/4 EO/OH) and other chemicals, unless otherwise indicated, were purchased from the Sigma-Aldrich Corp (St. Louis, MO, USA).

The refractive index (n) and the extinction coefficient (k) values of the examples metal oxide coatings below were measured on a J. A. Woollam VASE32 ellipsometer.

Thermogravimetric measurements use to measure Ti wt. % or content of other metals were done using A Perkin Elmer Thermogravimetric Analyzer TGA7 with heating from 50° C. to 800° C. at a heating rate of 120° C./min in a $O_2$ atmosphere and maintaining this temperature for 60 minutes.

Elemental analysis used to measure Ti or content of other metal content in wt. % and Si content in wt. % were done by Intertek of Whitehouse NJ.

The amount of the component b) said spin on carbon polymer, is usually less than 100% of the metal compound, preferably less than 50% of the metal compound.

The solvent usually is a solvent or solvent mixture containing alcohol, ester, ketone, lactone, diketones. Additional component (<1%) such as surfactant can be added to improve coating quality.

Spin on Carbon Polymer Syntheses

The uncapped high carbon precursors were produced by an acid catalyzed condensation process involving aromatic and fused aromatic materials functionalized with phenolic moieties, the molecular weight of these precursors was tuned by varying either the mole ratio of starting materials involved in the condensation reaction or by changing the mole % of the acid catalyst. For instance, by using lower mole % amounts of the acid catalyst (e.g. triflic acid) higher Molecular weights were obtained (e.g. Polymer Synthesis Examples 2a and 3a). Alternatively, for instance in the copolymerization of materials such as 9-fluorenone like derivatives increasing the molar ratio of these 9-fluorenone like derivatives to the co-monomer closer to a 1:1 molar ratio increases molecular weight, while decreasing this ratio decreases Mw (e.g. Polymer Synthesis Example 1a with molar ratio 0.167 for moles of 9-fluorenone to moles of 9,9-Bis(4-hydroxyphenyl)fluorene).

Polymer Synthesis Example 1a: Polymerization of 9-fluorenone and 9,9-Bis(4-hydroxyphenyl)fluorene A reaction vessel equipped with a stirrer, a condenser (Liebig condenser), a heater, a nitrogen inlet tube, and a temperature controller was prepared. The reaction vessel was charged with 9-fluorenone (50 g, 0.227 mole, Tokyo Chemical Industry Co., Ltd.), 9,9-Bis(4-hydroxyphenyl) fluorene (583 g, 1.667 moles, Osaka Gas Chemicals Co., Ltd.) and dichloromethane (2656 g.), which were stirred in nitrogen atmosphere and were heated to 40° C. and kept that temperature. Then, Trifluoromethanesulfonic Acid (92 g., TCI) and 3-Mercaptopropionate (5 g, TCI) dissolved in dichloromethane (200 g) were slowly added into the reaction vessel and were stirred at 40° C. for 4 hours to allow the reaction. After completion of the reaction, the reaction solution was cooled to room temperature. Sufficient water was added to the reaction solution, and excessive 9,9-Bis (4-hydroxyphenyl)fluorene was removed by filtration. The precipitate was washed by dichloromethane. Sufficient water was added to the dichloromethane solution to remove Trifluoromethanesulfonic Acid. Then, the resulting solution was distillated at 40° C., 10 mmHg to remove dichloromethane, and the P1 precursor (468 g) was obtained. Mn and Mw were measured by GPC (tetrahydrofuran). Mn was 727 Da. Mw was 991 Da. Molecular weight distributions (Mw/Mn) was 1.36. Higher molecular weight of this material could obtained be by increasing the molar ratio of 9-fluorenone to 9,9-Bis(4-hydroxyphenyl)fluorene to be closer to 1:1.

Polymer Synthesis Example 1b: Alkynyl Capped of Polymer of Example 1a

A reaction vessel equipped with a stirrer, a condenser (Liebig condenser), a heater, a nitrogen inlet tube, and a temperature controller was prepared. The reaction vessel was charged with the polymer of Polymer Synthesis Example 1a (200 g), potassium carbonate (323 g) and acetone (616 g) and kept 56° C. with stirring in the nitrogen atmosphere. Then, 3-bromo-1-propyne (278 g) was added into the reaction vessel and kept 56° C. with stirring for 3 hours to allow reaction. After the reaction completed, the reaction solution was cooled to normal room temperature. Excessive potassium carbonate and its salt were removed by filtration. The precipitate was washed with acetone. Then, the acetone solution was distillated at 40° C., 10 mmHg to remove acetone and to obtain a dry solid. The obtained dry solid was dissolved in ethyl acetate (820 g). Sufficient water was added into the ethyl acetate solution to remove metal impurities. The ethyl acetate solution was distillated at 40° C., 10 mmHg to remove ethyl acetate to obtain a dry solid. The dried solid (185 g) was dissolved in acetone (185 g). Then, methanol (1850 g) was added in the acetone solution and filtered to obtain a solid. The solid was dried at 100° C., 10 mmHg. The resultant was P1 (76 g). Mn and Mw were measured by GPC (tetrahydrofuran). Mn was 789 Da. Mw was 1054 Da. Molecular weight distributions (Mw/Mn) was 1.34. Higher Molecular weight versions of this polymer were obtained by using as a starting material a polymer obtained in a variation of Polymer Synthesis Example 1a in which the molar ratio of 9-fluorenone to 9,9-Bis(4-hydroxyphenyl)fluorene is increased to be closer to 1:1.

Polymer Synthesis Example 2a: Polymerization of 9-Anthracenemethanol, 4-divinylbenzene, ortho-phenylphenol, 9,9-Bis(4-hydroxyphenyl)fluorenone 104.1 g (0.5 mole) of 9-Anthracenemethanol (Mw-208.26, from B&C), 42.5 g (0.25 mole) of 2-phenyl phenol (Mw-170.21, from Aldrich), 65.1 g (0.5 mole) of divinylbenzene (Mw-130.19, from Aldrich, and 85.6 g (0.25 mole) of 9,9-bis(4-hydroxyphenyl)fluorene (Mw-350.42, from TCI) were added in a 3 L four neck round bottom flask, equipped with stirring, nitrogen purge, condenser, Dean Stark Trap and Temperature controller. 700 g of diglyme and 200 g of cyclopentyl methyl ether (CPME) were added, mixed for 10 minutes. 4.5 g (1.5%) of trifluoromethane sulphonic acid was added, mixed for 10 minutes. The flask was heated to reflux at 140° C. for 2 hours. The Dean Stark trap collected the water and solvent from the reaction (~80 g). The reaction was stopped and allowed to cool. The reaction mix was transferred to a 5 L separating flask and when the reaction mixture which was cooled to less than 60° C. was added 400 mL of CPME and was mixed for 10 minutes. The reaction mixture was extracted with 400 mL DI water three times. The thick resultant solution was precipitate into 8 L hexane and mixed for 30 minutes. The precipitate was filtered, collected and dried in a vacuum oven to yield 260 g of recovered polymer. This recovered polymer was dissolve polymer in THF (25 wt. % solid) and precipitated into 8 L hexane. The precipitate was filtered, washed with hexane, collected and dried in a vacuum oven over night to give 213 g of polymer (71% yield). GPC Mw-1918, Mn-1078, Pd-1.78. EA: [Calculated C: 88.90%, H: 6.09%, O: 5.00 found C: 88.99%, H: 5.89%, O: 5.12%].

Polymer Synthesis Example 2b: Alkynyl Capped Polymer of Example 2a

A reaction vessel equipped with a stirrer, a condenser (Liebig condenser), a heater, a nitrogen inlet tube, and a temperature controller was prepared. The reaction vessel was charged with Alkynyl capped Polymer of Example 2a (30 g), potassium carbonate (39 g) and DMF (158 g) and kept 100° C. with stirring in the nitrogen atmosphere. Then, 3-bromo-1-propyne (36 g) was added into the reaction vessel and kept at 100° C. with stirring for 4 hours to allow reaction. After the reaction completed, the reaction solution was cooled to normal room temperature. The solution was poured into DIW (1500 g) and filtrated. The precipitate was washed with ethyl acetate (1000 g). Then, the ethyl acetate solution was washed with DIW to remove metal impurities. After that, the ethyl acetate solution was distillated at 60° C., 35 hPa to remove ethyl acetate to obtain a dry solid. The solid was dried at 100° C., 10 mmHg. Mn: 1219, Mw: 2211, No observation of OH peak (3600 cm$^{-1}$) and observation of H peak on ethynyl group (3300 cm$^{-1}$) by FT-IR.

Polymer Synthesis Example 3a: Polymerization of 9-Anthracenemethanol, 4-divinylbenzene, and Ortho-phenylphenol 100.0 g of 9-Anthracenemethanol (Mw-208.26, from B&C), 82.0 g of 2-phenyl phenol (Mw-170.21, from Aldrich), and 63.0 g of divinylbenzene (Mw-130.19, from Aldrich, were added in a 3 L four neck round bottom flask, equipped with stirring, nitrogen purge, condenser, Dean Stark Trap and Temperature controller. 150 g of diglyme and 55 g of cyclopentyl methyl ether (CPME) were added, mixed for 10 minutes. 2.5 g of trifluoromethane sulphonic acid was added, mixed for 10 minutes. The flask was heated to reflux at 140° C. for 1 hour. The Dean Stark trap collected the water and solvent from the reaction (6.9 g). The reaction was stopped and allowed to cool. The reaction mix was transferred to a 5 L separating flask and when the reaction mixture which was cooled to less than 60° C. was added 400 mL of CPME and was mixed for 10 minutes. The reaction mixture was extracted with 400 mL DI water three times. The thick resultant solution was precipitate into 8 L of heptane and mixed for 30 minutes. This precipitate was filtered, collected, redissolved into THF and reprecipitated, and dried and this same procedure was repeated two more times. The resultant solid polymer was dissolved into THF and precipitated into of methanol, collected and dried to give white polymer (70% yield). GPC Mw: 1714, polydispersity (PD): 1.8. EA: [EA Found C: 91.16%, H: 6.18%,].

Polymer Example 3b: Alkynyl Capped Polymer of Example 3a

A reaction vessel equipped with a stirrer, a condenser (Liebig condenser), a heater, a nitrogen inlet tube, and a temperature controller was prepared. The reaction vessel was charged with Polymer Example 3a (2 g), potassium carbonate (2.5 g) and DMF (8.5 g) and kept 60° C. with stirring in the nitrogen atmosphere. Then, 3-bromo-1-propyne (3.2 g) was added into the reaction vessel and kept 60° C. with stirring for 3 hours to allow reaction. After the reaction completed, the reaction solution was cooled to normal room temperature. The solution was poured into DIW (100 g) and filtrated. The precipitate was washed with dichloromethane (50 g). Then, the dichloromethane solution was washed with DIW to remove metal impurities. After that, the dichloromethane solution was distillated at 60° C., 35 hPa to remove dichloromethane to obtain a dry solid. Then, the dried solid (3 g) was dissolved in dichloromethane (3 g) and this solution was poured into heptane (30 g). After that, the solution was filtrated and dried at 80° C. for 12 h. Then, the solid (3 g) dissolved in THF (12 g) and the polymer solution was poured into heptane (15 g). The solution was filtered to obtain a solid. The solid was dried at 100° C., 10 mmHg to give 2 g of white polymer. Mn: 1659, Mw: 1228, No observation of OH peak (3600 cm$^{-1}$) and observation of H peak on ethynyl group (3300 cm$^{-1}$) by FT-IR.

Polymer Synthesis Example 4a: Polymerization of 14-([1,1'-biphenyl]-4-yl)-14H-dibenzo[a,j]xanthene-3,11-diol, and 9,9-Bis(4-hydroxyphenyl)fluorene 288.32 g of 9-fluorene (1.6 moles), 373.2 g (0.8 moles) 14-([1,1'-biphenyl]-4-yl)-14H-dibenzo[a,j]xanthene-3,11-diol, 380.32 g (0.8 moles) of 9,9-Bis(4-hydroxyphenyl)fluorene and 2825 g of Methylene chloride were added in a 5 L four neck round bottom flask, equipped with stirring, nitrogen purge, condenser, and Temperature controller. The mixture was dissolved at room temperature and flushed with N$_2$. After dissolution 11.48 g of 3-mercaptopropionic acid (0.11 mole) and 122 g of trifluoromethanesulfonic acid were added and the mixture was heated under N$_2$ at 38° C. and allowed to react for 8 hours. After this time 900 g of methylene chloride was distilled off. After this 3 L of CPME was added and the mixture was washed with distilled water until a neutral pH was achieved. The washed CPME and dried layer was precipitated into 20 L of Isopar C. The resultant solid polymer was dried to give white polymer (62% yield). GPC Mw: 1934, polydispersity (PD): 1.5.

Polymer Synthesis Example 4b: Alkynyl Capped Polymer of Example 4a

The material of Polymer Synthesis Examples 4a was capped in the same manner as Polymer Synthesis Example 3b using similar molar ratios of moles of phenol bearing moieties in the polymer to moles of 3-bromo-1-propyne. The polymer was also isolated in a similar fashion to give after drying a ~60 mole % yield of white powder.

Polymer Synthesis Example 5a: Polymerization of 9-Fluorenone and Resorcinol

A reaction vessel equipped with a stirrer, a condenser (Liebig condenser), a heater, a nitrogen inlet tube, and a temperature controller was prepared. The reaction vessel was charged with 9-fluorenone (150 g, Tokyo Chemical Industry Co., Ltd. herein later TCI), Resorcinol (100 g, TCI) and dichloromethane (1300 g.), which were stirred in nitrogen atmosphere and were heated to 40° C. and kept that temperature. Then, Trifluoromethanesulfonic Acid (68 g., TCI) and 3-Mercaptopropionate (4 g, TCI) dissolved in dichloromethane (200 g) were slowly added into the reaction vessel and were stirred at 40° C. for 4 hours to allow the reaction. After completion of the reaction, the reaction solution was cooled to room temperature. Enough water was added to the reaction solution, and excessive Resorcinol was removed by filtration. The precipitate was washed by dichloromethane. Enough water was added to the dichloromethane solution to remove Trifluoromethanesulfonic Acid. Then, the resulting solution was distillated at 40° C., 10 mmHg to remove dichloromethane, and a dried solid was observed. Then, the dried solid was dissolved in Acetone (1100 g) and this solution was poured into heptane (550 g). After that, the solution was filtrated, and the resulting solution was distillated at 50° C., 10 mmHg to remove Acetone and Heptane. The resultant was the precursor. (65 g). Mn and Mw were measured by GPC (tetrahydrofuran). Mn was 1364 Da. Mw was 2086 Da. Molecular weight distributions (Mw/Mn) was 1.51.

Polymer Synthesis Example 5b: Alkynyl Capped Polymer of Example 5a

A reaction vessel equipped with a stirrer, a condenser (Liebig condenser), a heater, a nitrogen inlet tube, and a temperature controller was prepared. The reaction vessel was charged with the precursor (66 g), potassium carbonate (202 g) and DMF (303 g) and kept at 100° C. with stirring in the nitrogen atmosphere. Then, 3-bromo-1-propyne (182 g) was added into the reaction vessel and kept at 100° C. with stirring for 3 hours to allow reaction. After the reaction completed, the reaction solution was cooled to normal room temperature. The solution was poured into DIW (1500 g) and filtrated. The precipitate was washed with dichloromethane (150 g). Then, the dichloromethane solution was washed with DIW to remove metal impurities. After that, the dichloromethane solution was distillated at 60° C., 35 hPa to remove dichloromethane to obtain a dry solid. Then, the dried solid (90 g) was dissolved in propylene glycol monomethyl ether acetate (368 g) and this solution was poured into heptane (184 g). After that, the solution was filtrated and dried at 80 C for 12 h. The resultant polymer amounted to 22 g. Mn and Mw were measured by GPC (tetrahydrofuran). Mn was 1104 Da. Mw was 1715 Da. Molecular weight distributions (Mw/Mn) was 1.55.

Metal Complexes

Metal Complex Synthesis Example 1

40 g. of Titanium(IV) butoxide polymer (Ti(IV)BTP polymer) (Sigma-Aldrich Corporation, St Louis Missouri) (0.1174 mole), (was dissolved in 52 g of 70/30 PGMEA/PGME solvent and poured into the reaction vessel under $N_2$. This solution was stirred, and its temperature raised to 50° C. while trimethylsilanol 12 g. (0.1330 mole) was added dropwise under $N_2$. The reaction mixture was kept at 60° C. for 2 hours, after which time 20 g. of 1,2 to Cyclohexanedicarboxylic anhydride (0.1297 mole) and 20 g. of 70/30 PGMEA/PGME were mixed with the above reaction mixture and the reaction was continued at 60° C. for about one hour. After cooling down to room temperature overnight, the product was stored in a brown bottle and sealed carefully. FT-IR spectrum of the product solution was taken in cyclohexane. The resonance at 970 cm$^{-1}$ was assigned to Ti—O—Si stretching frequency. The measured total metal oxide content was 28 wt. % in films after baking at 150° C. for 60 s.

Metal Complex Synthesis Example 2

200 g. of Hf(IV) tetra n-butoxide (0.4247 mole) was dissolved in 276 g of 70/30 PGMEA/PGME and poured into the reaction vessel under $N_2$. The temperature was raised to 50° C., while stirring and trimethylsilanol 76 g. 0.8426 mole) was added dropwise in above solution with stirring under $N_2$. The reaction was kept at 60° C. for 2 h. 127 g of 1, 2-cyclohexanedicarboxylic anhydride (0.8238 mole) and 127 g. of 70/30 PGMEA/PGME were then mixed with the above reaction mixture and the reaction was continued at 60° C. for about one hour. After cooling down to room temperature overnight, the product was stored in a brown bottle and sealed carefully. The measured total Hf content was 45 wt. % in films after baking at 250° C. for 60 s.

Metal Complex Synthesis Example 3

200 g. of Zr tetra n-butoxide (80% in n-butanol) (0.4170 mole) was dissolved in 246.5 g of 70/30 PGMEA/PGME and poured into the reaction vessel under $N_2$. The temperature was raised to 50° C., while stirring and trimethylsilanol 77.5 g. (0.8592 mole) was added dropwise in above solution with stirring under $N_2$. The reaction was kept at 60° C. for 2 h. 103 g. of 1, 2-cyclohexanedicarboxylic anhydride (0.66814 mole) and 103 g of 70/30 PGMEA/PGME were then mixed with the above reaction mixture and the reaction was continued at 60° C. for about one hour. After cooling down to room temperature overnight, the product was stored in a brown bottle and sealed carefully. FT-IR spectrum of the product solution was taken in cyclohexane. The resonance at 1559 cm-1 and 1456 cm-1 was assigned to COO stretching frequency of in Zr complex. The measured total Zr content was 26.8 wt. % in films after baking at 250° C. for 60 s.

Metal Complex Synthesis Example 4

20 g. of Zr n-butoxide (80% in n-butanol) (0.0417 mole) was dissolved in 27.6 g. of 70/30 PGMEA/PGME and poured into the reaction vessel under $N_2$. The temperature was raised to 50° C. with stirring while trimethylsilanol 7.6 g. (0.08426 mole) was added dropwise in above solution with stirring under $N_2$. The reaction was kept at 60° C. for 2 h. 9.3 g of citraconic anhydride and 9.3 g (0.08300 mole) of 70/30 PGMEA/PGME were then mixed with the above reaction mixture and the reaction was continued at 60° C. for about one hour. After cooling down to room temperature overnight, the product was stored in a brown bottle and sealed carefully. FT-IR spectrum of the product solution was taken in cyclohexane. The resonance at 1565 cm-1 and 1454 cm-1 was assigned to COO stretching frequency of in Zr complex. The measured total Zr content was 25.4 wt. % in films after baking at 250° C. for 60 s.

Metal Complex Synthesis Example 5

40 g. of Ti(IV)BTP polymer (0.1175 mole) was dissolved in 58 g. of 70/30 PGMEA/PGME solvent and poured into the reaction vessel under $N_2$. The temperature was raised to 50° C. while stirring and trimethylsilanol 18 g. (0.1996 mole) was added dropwise under $N_2$. The reaction was kept at 60° C. for 2 hours. Then 20 g. of 1, 2-cyclohexanedicarboxylic anhydride (0.1297 mole) and 20 g. of 70/30 PGMEA/PGME solvent was mixed with the reaction mixture and the reaction was continued at 60° C. for about one hour. After cooling down to room temperature overnight, the product was stored in a brown bottle and sealed carefully. The measured total metal oxide content was 32 wt. % in films after baking at 150° C. for 60 s.

Metal Complex Synthesis Example 6

7.99 g. [0.0235 mole] of Ti(IV)BTP polymer was dissolved in 14.36 g. of 70/30 PGMEA/PGME solvent and poured into the reaction vessel under $N_2$. The temperature was raised to 50° C. while stirring and then 7.0 g. [0.0455 mole] of 1, 2-cyclohexanedicarboxylic anhydride and 10.5 g. of 70/30 PGMEA/PGME solvent was added slowly under $N_2$. The reaction was kept at 60° C. for 2 hours. Then 9.8 g. [0.0465 mole] of p-tolyltriemethoxy silane was added and the reaction was continued at 60° C. for about three hours. After cooling down to room temperature overnight, the product was stored in a brown bottle and sealed carefully. FT-IR spectrum of the product solution was taken. The resonance at 1568.06 cm-1 and 970 cm-1 were assigned to Ti—O—C and Ti—O—Si stretching frequency respectively.

Blend Formulations

The components of the following Examples were combined in the proportion as described in these examples and were then filtered through a 0.2-micron PTFE (polytetrafluoroethylene) filter to remove any particles.

Blend Formulation Example 1: Blend of Polymer Example 1b, Ethanol Amine, and Metal Complex Synthesis Example 1 [80:20:40]

An 80:20:40 wt ratio blend formulation of Metal Complex Synthesis Example 1, triethanolamine, and Polymer Example 1b was prepared by combining 2.0571 g. of a 50 wt. % solution in 70/30 PGMEA/PGME to which was added 0.2571 g. of Triethanolamine, 5.1439 g. of a 10 wt. % solution of Polymer Example 1b and 2.5429 g. ArF-Thinner solvent was added to bottle. The total solids of the formulation therefore were 18 wt. % which was needed to achieve the target film thickness needed for the filling test.

Blend Formulation Example 2: Blend of Polymer Example 1b, and Metal Complex Synthesis Example 1[50:50]

A 50:50 wt ratio blend formulation of Metal Complex Synthesis Example 1, and Polymer Example 1b was prepared by combining 1.40 g of a 50 wt. % solution in ArF thinner or Metal Complex Synthesis Example 1 added to 7 g of a 10 wt. % solution of Polymer Example 1b and 1.6 g of ArF thinner. This gave a 14 wt. % solids solution which was needed to achieve the target film thickness needed for the filling test.

Blend Formulation Example 3: Blend of Polymer Example 2b, and Metal Complex Synthesis Example 1[50:50]

A 50:50 wt ratio blend formulation of Metal Complex Synthesis Example 1, and Polymer Example 2b was prepared by combining 1.40 g. of a 50 wt. % solution of Metal Complex Example 1 in ArF Thinner 7 g of 10% solution of Polymer Example 2b in ArF thinner, and 1.6 g ArF-Thinner solution. This gave a 14 wt. % solids solution which was needed to achieve the target film thickness needed for the filling test.

Blend Formulation Example 4: Blend of Polymer Example 2b, Ethanol Amine, and Metal Complex Synthesis Example 1 [80:20:40]

Sample was prepared by adding 1.8286 g. of 50 wt. % solution Metal Complex Synthesis Example 1 added to 0.2286 g Triethanolamine and 4.5714 g of a 10 wt. % solution Polymer Example 2b in ArF thinner was-added to 3.3714 g. ArF-Thinner. This gave a 14 wt. % solids solution which was needed to achieve the target film thickness needed for the filling test.

Blend Formulation Example 5: Blend of Polymer Example 2b, and Metal Complex Synthesis Example 1[50:50]

A 50:50 wt ratio blend formulation of Metal Complex Synthesis Example 1, and Polymer Example 3b was prepared by combining 1.40 g. of a 50 wt. % solution of Metal Complex Example 1 in ArF Thinner, 7 g of 10% solution of Polymer Example 3b in ArF thinner, and 1.6 g ArF-Thinner solution. This gave a 14 wt. % solids solution which was needed to achieve the target film thickness needed for the filling test.

Blend Formulation Example 6: Blend of Polymer Example 2b, Ethanol Amine, and Metal Complex Synthesis Example 1 [80:20:40]

Sample was prepared by adding 1.8286 g. of 50 wt. % solution Metal Complex Synthesis Example 1 added to 0.2286 g Triethanolamine and 4.5714 g of a 10 wt. % solution Polymer Example 3b added to 3.3714 g. ArF-Thinner. This gave a 14 wt. % solids solution which was needed to achieve the target film thickness needed for the filling test.

Blend Formulations Other Metal Complexes

It is contemplated that the inventive compositions may be extendible to those of encompassing the metal complexes described in Metal Complex Examples 2 to 6 blended with Polymer Synthesis Examples 1b, 2b, 3b, 4b and 5b. One example of specific blends contemplated those are blends of these other metal complexes with Polymer Synthesis Example 1b. Also, contemplated are the blends of these metal complexes with Polymer Synthesis Example 2b, 3b, 4b and 5b. Specific blends of the above described blends which are contemplated are those which comprise about a 50:50 ratio of Metal Complex to polymer. It is also anticipated that ratios of about 80:20:40 of "metal complex: ethanol amine:polymer" may also be of interest. Such blends may be prepared using the procedures described in Blend Formulation Examples 1 to 6, individually substituting Metal Complex Examples 2 to 6 for Metal Complex Example 1 in these.

Comparative Blend Formulation Example 1: Blend of Polymer Example 3a, and Metal Complex Synthesis Example 1[50:50]

An 50:50 wt ratio blend formulation of Metal Complex Synthesis Example 1, and Polymer Example 2a was prepared by combining 1.40 g. of a 50 wt. % solution of Metal Complex Example 1 in ArF Thinner 7 g of 10 wt. % solution of Polymer Example 3a in ArF thinner, and 1.6 g ArF-Thinner. This gave a 14 wt. % solids solution which was needed to achieve the target film thickness needed for the filling test.

Stability Results with Blend Examples

The formulation Comparative Blend Formulation Examples 1, when coated at a spin rate of 1500 rpm initially gave coating films with a low level of defects due to particles, (~0.08 def/cm$^2$ or less), as detected by i-line on a KLA 2350-IS High Resolution Imaging Inspection Tool (KLA Tencor Milpitas, California) also gave good Via filling properties as determined in the same manner as described for the other blend samples as follows. However, after two 2 weeks at −10° C. a level of defect of 2.43 def/cm$^2$ was observed, similarly after 2 weeks at 40° C. a level of defects of 1.25 def/cm2. Even under the more moderate temperatures aging regimes of 0° C. or 25° C., after only 2 months, the level of particles rose to ~0.60 def/cm$^2$. In contrast, the Blend formulation examples 1 to 6, maintained initial low levels of particles in films coated in the same fashion, under these same aging conditions, when examined by the KLA-2350-IS, and did not show a significant increase in defect counts.

Test Wafers for Evaluating Via Filling

Test wafers to evaluate Via filling contained 650 nm deep Vias with 130, 140, 160, 200 and 300 nm Via sizes. Via Holes were patterned at various pitches: dense, semi-dense and isolated with Hole to space ratios at 1:1, 1:1.4 and 1:6. Wafers were examined under a scanning electron microscope to evaluate Via filling using x-section images of the Vias.

Filling Results with Blend Examples

Via filling capability was determined as follows. Via filling pieces where the depth of the Vias measures about 650 nm were used for the filling evaluation. The film thickness of each material was determined using 6" or 8" Silicon wafers. Target film thickness based on the substrate depth was determined. For this type of Via wafers, film thickness of 250 nm was selected which will fill the Vias with some overburden film on top of the Vias. Using the determined spin speed, the filling on the Via pieces was done. The wafers then were baked first on the Optitrac for the 250° C., and ACT 12 was used at 400° C. according to the necessary bake temperature/time. The Via fill pieces were then submitted to the SEM for imaging and film thickness measurement by X-SEM.

Filling Results with Blend Example 1.

This blend employing an 80:20:40 wt ratio blend of the metal compound component "Metal Complex Synthesis Example 1," the optional polyol component "triethanolamine," and the high carbon polymer component "Synthesis Example 1b" (Mw of 1041) gave good filling results with no significant void formation. Other ratios of the components were also tested namely 80:20:30; and 80:20:20. Of these ratios, it was found that the 80:20:40 blend was the best, giving optimal Via filling performance.

Filling Results with Blend Example 2

This blend employing a spin on high carbon polymer component "Synthesis Example 1b" (Mw of 1041) in a 50:50 ratio with the metal compound component "Metal Complex Synthesis Example 1" gave good filling results with no significant void formation. However, while maintaining relatively low levels of void formation, increasing the Mw of a spin on high carbon polymer component by increasing the mol. wt from 1041 to 1365 to 2536 did show an increase in the number of voids observed in the Vias as the Mw of increased but still showed significant capacity for void filling. As detailed above Mw of this type of polymer could be increased by decreasing the amount of acid catalyst employed.

Filling Results with Blend Examples 3-6

These blends under testing also showed some capacity towards Via filling, while maintaining stability towards particle formation during aging, either at high or low temperatures as described above.

Filling with Blends Examples Containing Other Metal Complexes and Spin on High Carbon Polymers It is of interest to investigate the filling capacity of the above described blends of the Spin on High Carbon Polymers of Polymer Examples 1b, 2b, 3b, 4b, 5b with the Metal Complexes Examples 2-6. These should also confer some ability to fill capacity for Vias and other hollow topographical features on patterned substrates. Although not bound by theory, the capping of the phenolic hydroxy moieties in these polymer examples may confer the same advantage towards the unexpected deleterious particle formation problem as see in blends of Polymer Examples 1b, 2b, 3b, 4b, 5b with Metal Complex Example 1, which may result in material which have too many free phenolic moieties from the reaction of these excessive free phenol moiety with metal complexes.

We claim:

1. A spin on high carbon polymer comprising a repeat unit of structure (XII), wherein fAr is a fused aromatic ring and $Ra_1$, $Ra_2$, $Ra_3$, $R_{16}$ and $R_{17}$ are each independently hydrogen or a $C_1$ to $C_4$ alkyl;

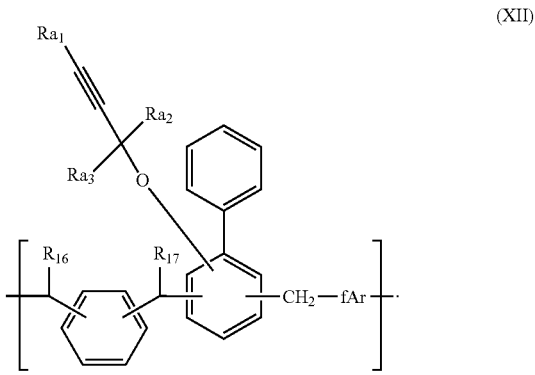

(XII)

2. The spin on high carbon polymer of claim 1, wherein fAr is a group comprising 2-8 fused aromatic rings.

3. The spin on high carbon polymer of claim 1, wherein fAr is anthracene.

4. The spin on high carbon polymer of claim of claim 1, wherein said repeat unit has structure (XIIc):

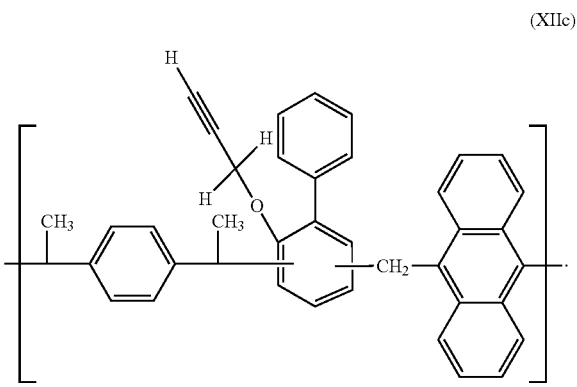

(XIIc)

5. A spin on high carbon polymer comprising repeat units, selected from the group consisting of repeat units having structures (XIII), (XIIIa), (XIIIb), (XIIIc), and (XIIId), and mixtures thereof,

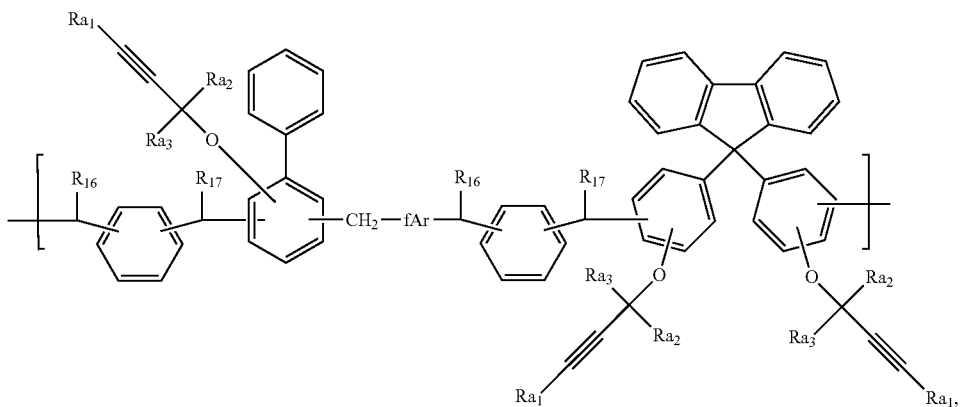
(XIII)
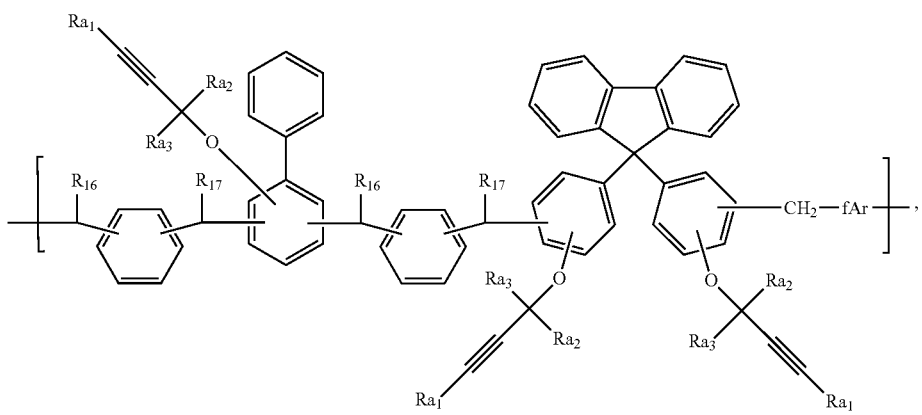
(XIIIa)
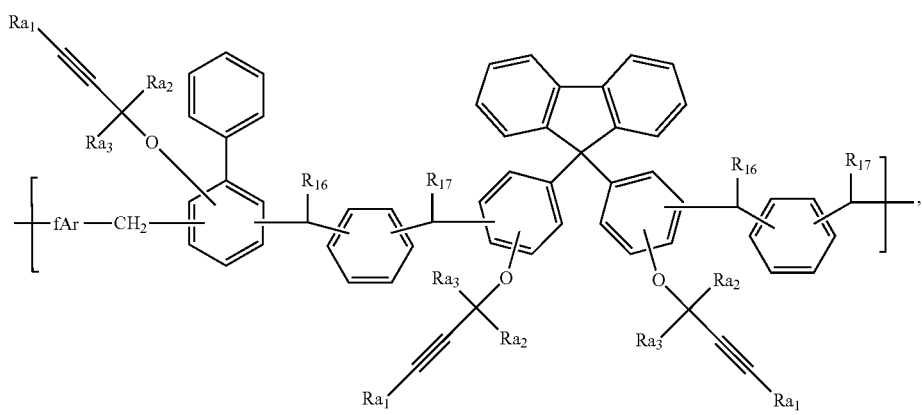
(XIIIb)
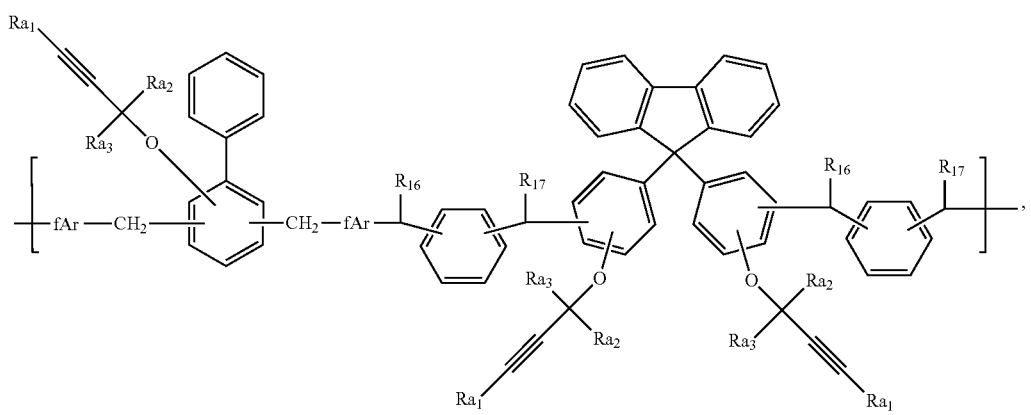
(XIIIc)

-continued

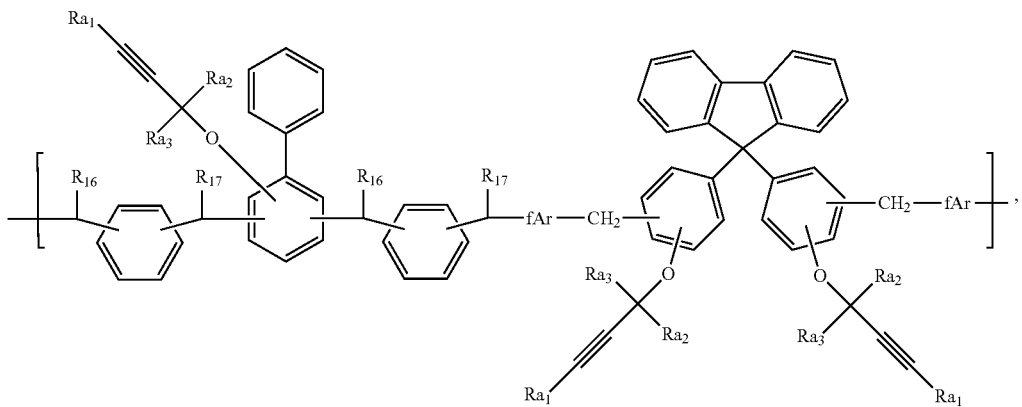
(XIIId)

wherein fAr is a fused aromatic ring and $Ra_1$, $Ra_2$, $Ra_3$, $R_{16}$ and $R_{17}$ are each independently selected from the group of hydrogen and a $C_1$ to $C_4$ alkyl.

6. The spin on high carbon polymer of claim 5, wherein said spin on high carbon polymer comprising repeat units, selected from the group consisting of repeat units having structures (XIIIe), (XIIIf), (XIIIg), (XIIIh), and (XIIIi), and mixtures thereof,

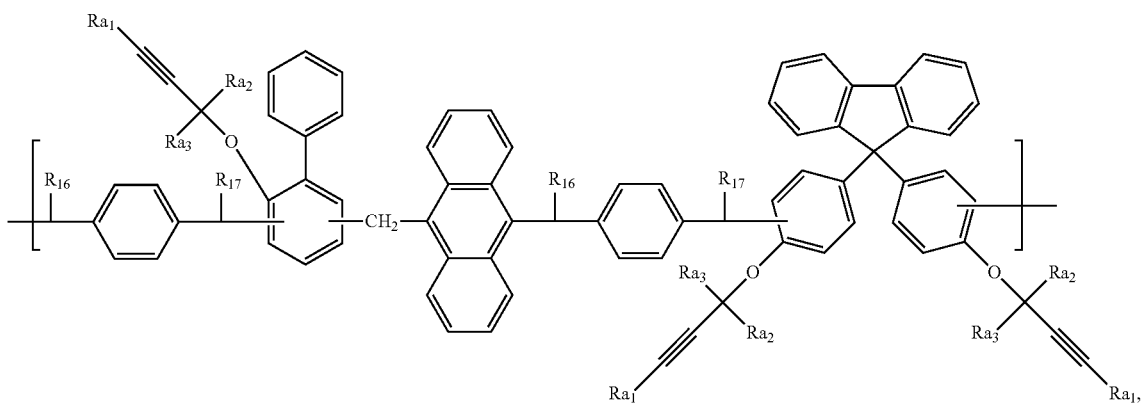
(XIIIe)

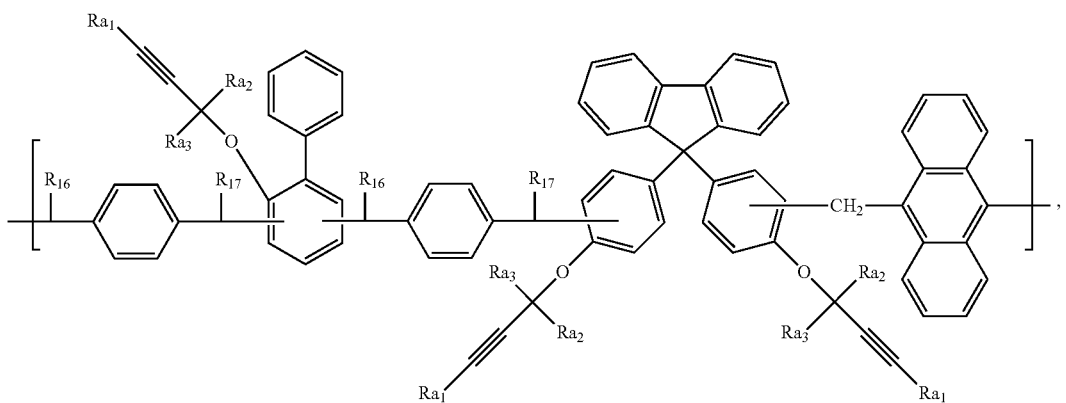
(XIIIf)

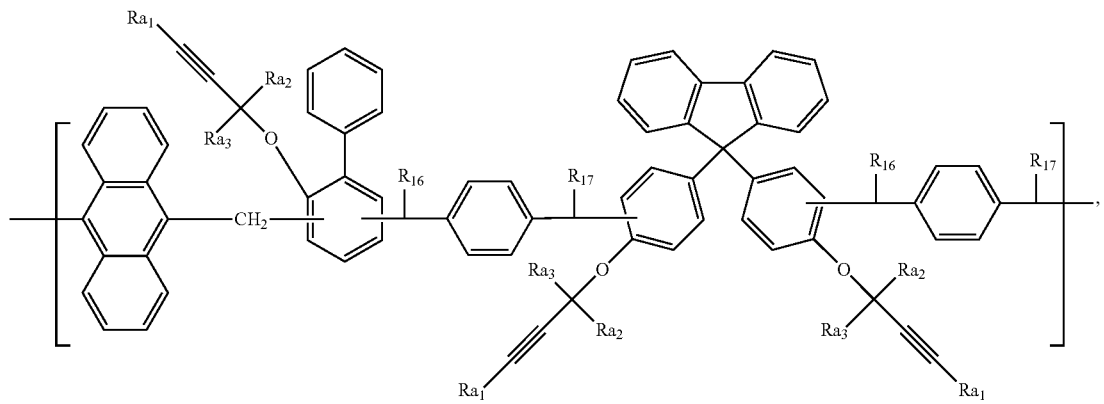
(XIIIg)
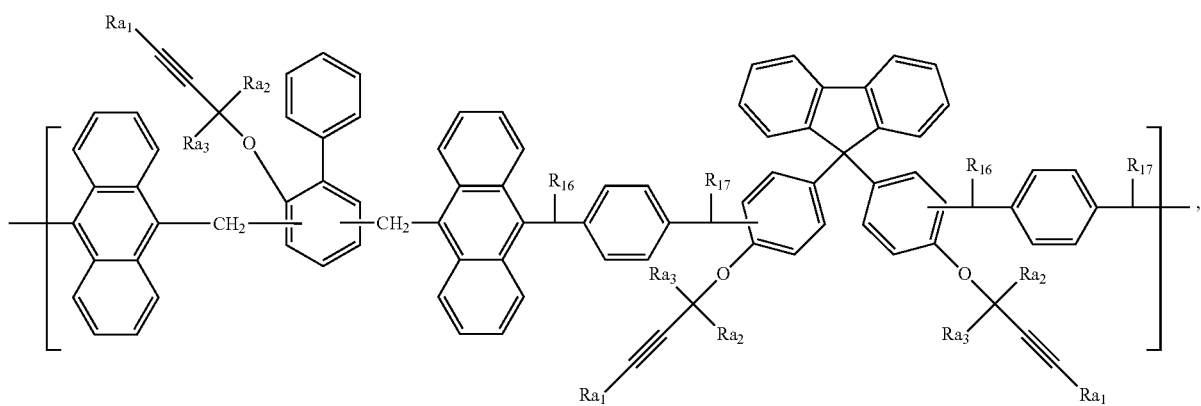
(XIIIh)

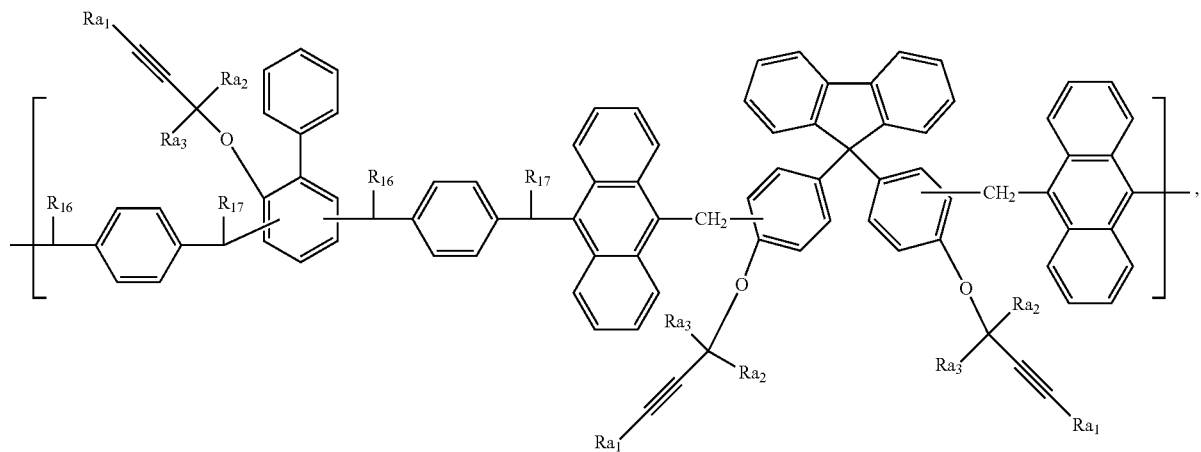
(XIIIi)
wherein fAr is a fused aromatic ring and $Ra_1$, $Ra_2$, $Ra_3$, $R_{16}$ and $R_{17}$ are each independently selected from the group of hydrogen and a $C_1$ to $C_4$ alkyl.
7. A spin on high carbon polymer is a spin on high carbon polymer comprising repeat units having structures (XIV),
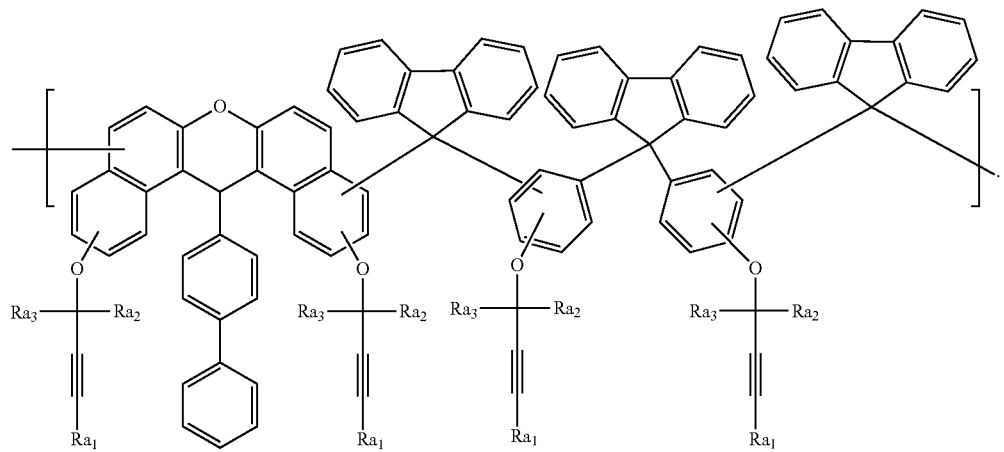
(XIV)

wherein $Ra_1$, $Ra_2$ and $Ra_3$ are each independently selected from the group of hydrogen and a $C_1$ to $C_4$ alkyl.

8. The spin on high carbon polymer of claim 7, wherein $Ra_1$, $Ra_2$ and $Ra_3$ are hydrogen.

\* \* \* \* \*